United States Patent
Morad et al.

(10) Patent No.: US 9,780,253 B2
(45) Date of Patent: Oct. 3, 2017

(54) SHINGLED SOLAR CELL MODULE

(71) Applicant: SunPower Corporation, San Jose, CA (US)

(72) Inventors: Ratson Morad, Palo Alto, CA (US); Gilad Almogy, Palo Alto, CA (US); Itai Suez, Santa Cruz, CA (US); Jean Hummel, San Carlos, CA (US); Nathan Beckett, Oakland, CA (US); Yafu Lin, Santa Clara, CA (US); Dan Maydan, Los Altos Hills, CA (US); John Gannon, Oakland, CA (US)

(73) Assignee: SunPower Corporation, San Jose, CA (US)

(*) Notice: Subject to any disclaimer, the term of this patent is extended or adjusted under 35 U.S.C. 154(b) by 0 days.

(21) Appl. No.: 14/530,405

(22) Filed: Oct. 31, 2014

(65) Prior Publication Data

US 2015/0349167 A1    Dec. 3, 2015

Related U.S. Application Data

(63) Continuation-in-part of application No. 29/506,415, filed on Oct. 15, 2014.
(Continued)

(51) Int. Cl.
*H01L 31/042* (2014.01)
*H02S 40/34* (2014.01)
(Continued)

(52) U.S. Cl.
CPC ...... *H01L 31/1876* (2013.01); *H01L 27/1421* (2013.01); *H01L 31/0201* (2013.01);
(Continued)

(58) Field of Classification Search
CPC ..... H02N 6/00; H01L 25/00; H01L 31/02021; H01L 31/1876; H01L 31/044;
(Continued)

(56) References Cited

U.S. PATENT DOCUMENTS 2,938,938 A    5/1960   Dickson, Jr.
3,116,171 A    12/1963  Nielsen et al.
(Continued)

FOREIGN PATENT DOCUMENTS

DE    4017933 A1    12/1991
DE    4030713 A1    4/1992
(Continued)

OTHER PUBLICATIONS

3M™ Thermally Conductive Heat Spreading Tape 9876B-05 9876B-08 9876-10 9876-15, p. 1-4.*
(Continued)

*Primary Examiner* — Allison Bourke
*Assistant Examiner* — Michael Y Sun
(74) *Attorney, Agent, or Firm* — Innovation Counsel LLP

(57) ABSTRACT

A high efficiency configuration for a solar cell module comprises solar cells arranged in a shingled manner to form super cells, which may be arranged to efficiently use the area of the solar module, reduce series resistance, and increase module efficiency. The solar cell module may comprise for example a series connected string of N greater than or equal to 25 rectangular or substantially rectangular solar cells having on average a breakdown voltage greater than about 10 volts, with the solar cells grouped into one or more super cells each of which comprises two or more of the solar cells arranged in line with long sides of adjacent solar cells overlapping and conductively bonded to each other, and
(Continued)

with no single solar cell or group of <N solar cells in the string of solar cells individually electrically connected in parallel with a bypass diode.

35 Claims, 58 Drawing Sheets

Related U.S. Application Data

(60) Provisional application No. 62/003,223, filed on May 27, 2014, provisional application No. 62/036,215, filed on Aug. 12, 2014, provisional application No. 62/042,615, filed on Aug. 27, 2014, provisional application No. 62/048,858, filed on Sep. 11, 2014, provisional application No. 62/064,260, filed on Oct. 15, 2014, provisional application No. 62/064,834, filed on Oct. 16, 2014.

(51) Int. Cl.

| | | |
|---|---|---|
| H01L 31/044 | (2014.01) | |
| H02S 40/36 | (2014.01) | |
| H02S 40/30 | (2014.01) | |
| H01L 31/18 | (2006.01) | |
| H01L 31/0224 | (2006.01) | |
| H02S 20/25 | (2014.01) | |
| H02S 40/32 | (2014.01) | |
| H02S 50/00 | (2014.01) | |
| H02S 50/10 | (2014.01) | |
| H01L 31/043 | (2014.01) | |
| H01L 31/048 | (2014.01) | |
| H01L 31/049 | (2014.01) | |
| H02S 30/10 | (2014.01) | |
| H01L 31/05 | (2014.01) | |
| H02S 30/00 | (2014.01) | |
| H01L 31/068 | (2012.01) | |
| H01L 27/142 | (2014.01) | |
| H01L 31/02 | (2006.01) | |
| H01L 31/028 | (2006.01) | |
| H01L 31/0203 | (2014.01) | |

(52) U.S. Cl.
CPC ........ *H01L 31/0203* (2013.01); *H01L 31/028* (2013.01); *H01L 31/02008* (2013.01); *H01L 31/022425* (2013.01); *H01L 31/022433* (2013.01); *H01L 31/043* (2014.12); *H01L 31/044* (2014.12); *H01L 31/049* (2014.12); *H01L 31/0481* (2013.01); *H01L 31/0488* (2013.01); *H01L 31/0504* (2013.01); *H01L 31/0508* (2013.01); *H01L 31/0516* (2013.01); *H01L 31/068* (2013.01); *H01L 31/18* (2013.01); *H01L 31/1804* (2013.01); *H01L 31/186* (2013.01); *H02S 20/25* (2014.12); *H02S 30/00* (2013.01); *H02S 30/10* (2014.12); *H02S 40/30* (2014.12); *H02S 40/32* (2014.12); *H02S 40/34* (2014.12); *H02S 40/36* (2014.12); *H02S 50/00* (2013.01); *H02S 50/10* (2014.12); *Y02B 10/12* (2013.01); *Y02E 10/50* (2013.01); *Y02P 70/521* (2015.11)

(58) Field of Classification Search
CPC ............. H01L 31/042; H01L 31/02008; H01L 31/0508; H01L 31/0504; H01L 31/0203; H01L 31/186; H01L 31/0201; H01L 31/028; H01L 27/1421; H01L 31/1804; H01L 31/068; H01L 31/0488; H01L 31/022433; H01L 31/0516; H01L 31/18; H01L 31/049; H01L 31/0481; H01L 31/043; H01L 31/022425; H01L 31/0512; F24J 2/46; H03K 17/063; H03K 17/74; H02S 40/34; H02S 40/30; H02S 30/00; H02S 30/10; H02S 50/10; H02S 20/25; H02S 40/32; H02S 50/00; H02S 40/36; Y02B 10/12; Y02P 70/521; Y02E 10/50; H02G 3/385
See application file for complete search history.

(56) References Cited

U.S. PATENT DOCUMENTS

| | | |
|---|---|---|
| 3,340,096 A | 9/1967 | Mann et al. |
| 3,459,597 A | 8/1969 | Baron |
| 3,769,091 A | 10/1973 | Leinkram et al. |
| 3,811,181 A | 5/1974 | Leinkram et al. |
| 3,837,924 A * | 9/1974 | Baron ................ H01L 31/0508 136/244 |
| 4,097,310 A | 6/1978 | Lindmayer |
| 4,257,821 A | 3/1981 | Kelly et al. |
| 4,617,420 A | 10/1986 | Dilts et al. |
| 4,617,421 A | 10/1986 | Nath et al. |
| 4,652,693 A | 3/1987 | Bar-On |
| 4,805,006 A | 2/1989 | Yamaguchi et al. |
| 4,836,861 A | 6/1989 | Peltzer et al. |
| 4,877,460 A | 10/1989 | Flodl |
| 5,171,717 A | 12/1992 | Broom et al. |
| 5,590,495 A | 1/1997 | Bressler et al. |
| 5,616,185 A * | 4/1997 | Kukulka ......... H01L 31/035281 136/244 |
| 6,017,123 A | 1/2000 | Bleha et al. |
| 6,018,123 A | 1/2000 | Takada et al. |
| 6,034,322 A | 3/2000 | Pollard |
| 6,180,868 B1 | 1/2001 | Yoshino et al. |
| 6,218,605 B1 * | 4/2001 | Dally .................... B64G 1/428 136/244 |
| 6,232,545 B1 | 5/2001 | Samaras et al. |
| 6,303,853 B1 | 10/2001 | Fraas et al. |
| 6,315,575 B1 | 11/2001 | Kajimoto |
| 6,353,175 B1 | 3/2002 | Fraas |
| 6,414,235 B1 * | 7/2002 | Luch ............................. 136/244 |
| 6,441,297 B1 | 8/2002 | Keller et al. |
| 6,489,553 B1 | 12/2002 | Fraas et al. |
| 6,525,262 B1 | 2/2003 | Makita et al. |
| 6,538,193 B1 | 3/2003 | Fraas |
| 6,563,289 B1 | 5/2003 | Cross |
| 6,573,445 B1 | 6/2003 | Burgers |
| 6,583,522 B1 | 6/2003 | McNulty et al. |
| 6,610,919 B2 | 8/2003 | Ohkubo |
| 6,653,550 B2 | 11/2003 | Hayashi et al. |
| 6,670,787 B2 | 12/2003 | Tachibana |
| 6,770,544 B2 | 8/2004 | Sawada |
| 6,803,513 B2 | 10/2004 | Beernink et al. |
| 7,238,878 B2 | 7/2007 | Gonsiorawski |
| 7,271,333 B2 | 9/2007 | Fabick et al. |
| 7,388,146 B2 | 6/2008 | Fraas et al. |
| 7,390,961 B2 | 6/2008 | Aschenbrenner et al. |
| 7,507,903 B2 | 3/2009 | Luch |
| 7,534,699 B2 | 5/2009 | Wong et al. |
| 7,635,810 B2 | 12/2009 | Luch |
| 7,772,484 B2 * | 8/2010 | Li et al. ......................... 136/244 |
| 7,777,128 B2 | 8/2010 | Montello et al. |
| 7,781,672 B2 | 8/2010 | Gaudiana et al. |
| 7,825,329 B2 | 11/2010 | Basol |
| 7,829,781 B2 | 11/2010 | Montello et al. |
| 7,829,785 B2 | 11/2010 | Basol |
| 7,851,700 B2 | 12/2010 | Luch |
| 7,868,249 B2 | 1/2011 | Luch |
| 7,872,192 B1 | 1/2011 | Fraas et al. |
| 7,910,822 B1 | 3/2011 | Funcell |
| 7,989,692 B2 | 8/2011 | Luch |
| 7,989,693 B2 | 8/2011 | Luch |
| 8,110,737 B2 | 2/2012 | Luch |
| 8,138,413 B2 | 3/2012 | Luch et al. |
| 8,207,440 B2 | 6/2012 | Basol |
| 8,222,513 B2 * | 7/2012 | Luch ............................. 136/244 |

(56) References Cited

U.S. PATENT DOCUMENTS

| | | | |
|---|---|---|---|
| 8,304,646 B2 | 11/2012 | Luch | |
| 8,319,097 B2 | 11/2012 | Luch | |
| 8,334,451 B2 | 12/2012 | Polce et al. | |
| 8,378,209 B2 | 2/2013 | Masson et al. | |
| 8,574,943 B2 | 11/2013 | Murray et al. | |
| 8,586,857 B2 | 11/2013 | Everson et al. | |
| 8,729,385 B2 | 5/2014 | Luch | |
| 8,766,090 B2 | 7/2014 | Sewell et al. | |
| 2001/0050101 A1 | 12/2001 | Makita et al. | |
| 2003/0029494 A1 | 2/2003 | Ohkubo | |
| 2003/0121228 A1* | 7/2003 | Stoehr | H01L 31/0512 52/518 |
| 2004/0261836 A1 | 12/2004 | Kataoka et al. | |
| 2005/0126619 A1 | 6/2005 | Abe et al. | |
| 2005/0133079 A1 | 6/2005 | Boulanger et al. | |
| 2005/0217717 A1 | 10/2005 | Faris | |
| 2005/0263178 A1 | 12/2005 | Montello et al. | |
| 2006/0042682 A1 | 3/2006 | Wolfe et al. | |
| 2007/0045831 A1 | 3/2007 | Wong et al. | |
| 2007/0107766 A1 | 5/2007 | Langley et al. | |
| 2007/0181175 A1* | 8/2007 | Landis | 136/252 |
| 2007/0283996 A1 | 12/2007 | Hachtmann et al. | |
| 2007/0283997 A1 | 12/2007 | Hachtmann et al. | |
| 2008/0156365 A1 | 7/2008 | Scholz et al. | |
| 2008/0216887 A1 | 9/2008 | Hacke et al. | |
| 2009/0000221 A1* | 1/2009 | Jacobs | H01L 31/0482 52/173.3 |
| 2009/0014058 A1 | 1/2009 | Croft et al. | |
| 2009/0038671 A1 | 2/2009 | Yamaguchi | |
| 2009/0114279 A1* | 5/2009 | Zhao | H02S 40/22 136/256 |
| 2009/0184746 A1* | 7/2009 | Fahrenbruch | H01L 31/02021 327/427 |
| 2009/0229596 A1* | 9/2009 | Shin et al. | 126/569 |
| 2010/0001587 A1 | 1/2010 | Casey et al. | |
| 2010/0012172 A1* | 1/2010 | Meakin | H01L 31/048 136/251 |
| 2010/0043863 A1 | 2/2010 | Wudu et al. | |
| 2010/0071752 A1 | 3/2010 | Vellore et al. | |
| 2010/0075151 A1 | 3/2010 | Weingord et al. | |
| 2010/0078057 A1 | 4/2010 | Karg et al. | |
| 2010/0078064 A1 | 4/2010 | Coakley | |
| 2010/0084004 A1 | 4/2010 | Ortabasi | |
| 2010/0131108 A1 | 5/2010 | Meyer | |
| 2010/0136748 A1 | 6/2010 | Autry | |
| 2010/0139734 A1 | 6/2010 | Hadar et al. | |
| 2010/0175743 A1 | 7/2010 | Gonzalez et al. | |
| 2010/0218799 A1 | 9/2010 | Stefani | |
| 2010/0218824 A1 | 9/2010 | Luch | |
| 2010/0224230 A1 | 9/2010 | Luch et al. | |
| 2010/0243024 A1 | 9/2010 | Hashimoto et al. | |
| 2010/0308662 A1* | 12/2010 | Schatz | H02J 3/385 307/80 |
| 2011/0005572 A1 | 1/2011 | Shimizu | |
| 2011/0036390 A1 | 2/2011 | Nelson et al. | |
| 2011/0048501 A1 | 3/2011 | Jaus et al. | |
| 2011/0079263 A1 | 4/2011 | Avrutsky | |
| 2011/0083726 A1* | 4/2011 | Takayanagi | H01L 31/048 136/251 |
| 2011/0114157 A1 | 5/2011 | Meissner | |
| 2011/0114158 A1* | 5/2011 | Lenox | F24J 2/5239 136/251 |
| 2011/0114165 A1* | 5/2011 | Chang | H01G 9/20 136/256 |
| 2011/0155209 A1 | 6/2011 | Tober et al. | |
| 2011/0168237 A1 | 7/2011 | Takeda et al. | |
| 2011/0168238 A1 | 7/2011 | Metin et al. | |
| 2011/0192448 A1 | 8/2011 | Croft et al. | |
| 2011/0197947 A1 | 8/2011 | Croft | |
| 2011/0214714 A1 | 9/2011 | Aberle et al. | |
| 2011/0240337 A1 | 10/2011 | Montello et al. | |
| 2011/0271999 A1* | 11/2011 | Almogy et al. | 136/246 |
| 2011/0272004 A1 | 11/2011 | Davis et al. | |
| 2011/0315184 A1 | 12/2011 | Kabade | |
| 2012/0031457 A1 | 2/2012 | Taira et al. | |
| 2012/0037206 A1 | 2/2012 | Norman et al. | |
| 2012/0048349 A1* | 3/2012 | Metin et al. | 136/251 |
| 2012/0118355 A1 | 5/2012 | Rudolfs | |
| 2012/0125391 A1* | 5/2012 | Pinarbasi | H01L 31/0504 136/244 |
| 2012/0152327 A1 | 6/2012 | Pinarbasi et al. | |
| 2012/0152349 A1 | 6/2012 | Cao et al. | |
| 2012/0234388 A1 | 9/2012 | Stancel et al. | |
| 2012/0244656 A1 | 9/2012 | Kim et al. | |
| 2012/0268087 A1 | 10/2012 | Kernahan | |
| 2012/0279548 A1 | 11/2012 | Munch et al. | |
| 2012/0318318 A1 | 12/2012 | Metin et al. | |
| 2012/0318319 A1* | 12/2012 | Pinarbasi et al. | 136/244 |
| 2012/0325282 A1* | 12/2012 | Snow l. | H01L 31/022425 136/244 |
| 2013/0048046 A1 | 2/2013 | Domsic et al. | |
| 2013/0068279 A1* | 3/2013 | Buller | B32B 5/142 136/244 |
| 2013/0096710 A1 | 4/2013 | Pinarbasi et al. | |
| 2013/0152996 A1* | 6/2013 | DeGroot | H01L 31/0508 136/244 |
| 2013/0160823 A1 | 6/2013 | Khouri et al. | |
| 2013/0160824 A1 | 6/2013 | Khouri et al. | |
| 2013/0206203 A1 | 8/2013 | Lommasson et al. | |
| 2013/0206206 A1 | 8/2013 | Bjorneklett et al. | |
| 2013/0206210 A1* | 8/2013 | Niinobe | H01L 31/048 136/246 |
| 2013/0206213 A1 | 8/2013 | He et al. | |
| 2013/0213469 A1 | 8/2013 | Kramer et al. | |
| 2014/0060610 A1* | 3/2014 | Moslehi et al. | 136/244 |
| 2014/0060638 A1 | 3/2014 | Oh et al. | |
| 2014/0116495 A1 | 5/2014 | Kim et al. | |
| 2014/0158201 A1 | 6/2014 | Aitken et al. | |
| 2014/0318613 A1 | 10/2014 | Von Campe et al. | |
| 2014/0326295 A1 | 11/2014 | Moslehi | |
| 2015/0027513 A1 | 1/2015 | Ring et al. | |
| 2015/0068592 A1 | 3/2015 | Kommera et al. | |
| 2015/0243534 A1 | 8/2015 | Osenbach | |
| 2016/0163910 A1 | 6/2016 | Gonzalez et al. | |

FOREIGN PATENT DOCUMENTS

| | | |
|---|---|---|
| DE | 102009026027 A1 | 1/2011 |
| EM | 002032581-0005 | 4/2012 |
| EP | 2284908 A1 | 2/2011 |
| EP | 2362430 A1 | 8/2011 |
| ES | 2146182 A1 | 7/2000 |
| FR | 910321-001 | 1/1991 |
| JP | 11-350685 A | 12/1999 |
| JP | 2014017447 A | 1/2014 |
| WO | 2009047815 A1 | 4/2009 |
| WO | 2010095583 A1 | 8/2010 |
| WO | 2012033657 A2 | 3/2012 |
| WO | 2012099705 A2 | 7/2012 |
| WO | 2013020590 A1 | 2/2013 |
| WO | 2014074826 A2 | 5/2014 |
| WO | 2014098771 A1 | 6/2014 |
| WO | 2014192272 A1 | 12/2014 |
| WO | 2015001413 A1 | 1/2015 |

OTHER PUBLICATIONS

STMicroelectronics, How to choose a bypass diode for a silicon panel junction box, p. 1-24.*
S. Silvestre Applied Energy 86 2009 1632-1640.*
EPO-TEK H20 Technical Data Sheet.*
R. A. Matula, "Electrical Resistivity of Copper, Gold, Palladium, and Silver" J. Phys. Chem. Ref. Data, vol. 8, No. 4, 1979.*
Goldberg, Lee H., "Active Bypass Diodes Improve Solar Panel Efficiency and Performance", Digi-Key Corporation, http://www.digikey.com/en/articles/techzone/2012/dec/activebypassdiodesimprovesolarpanelefficiencyandperformance, Dec. 12, 2012, 8 pages.
Herrmann, W. et al., "Operational Behaviour of Commercial Solar Cells Under Reverse Biased Conditins", TÜV Rheinland Sicherheit and Umweltschutz GmbH, 3 pages.

(56) References Cited

OTHER PUBLICATIONS

Creative Materials, "Product Announcement: Flexible Electrically Conductive Adhesive Family as Solder Replacements in Solar Cells", http://www.creativematerials.com/news/pr-conductive-adhesive-for-solar-cells.php, Feb. 9, 2015, 2 pages.

Creative Materials, "124-08 A/B Electrically Conductive Epoxy Adhesive", www.creativematerials.com, Apr. 22, 2010, Revision: E, 1 page.

Herrmann, W. et al. "Hot Spot Investigations on PV Modules—New Concepts for a Test Standard and Consequences for Module Design with Respect to Bypass Diodes", TÜV Rheinland Sicherheit und Umweltschutz GmbH, 4 pages.

Yang, et al., "Investigation of the Relationship between Reverse Current of Crystalline Silicon Solar Cells and Conduction of Bypass Diode", Hindawi Publishing Corporation International Journal of Photoenergy, vol. 2012, Article ID 357218, 6 pages.

Breitenstein, O. et al., "Shunts due to laser scribing of solar cells evaluated by highly sensitive lock-in thermography", 11th International Photovoltaic Science and Engineering Conference (PVSEC-11), 20-24 Sep. 1999 Sapporo, Japan, 9 pages.

Kyocera, News Releases 2009, "Kyocera Explains Innovations Used in Solar Panel for New Toyota Prius", http://global.kyocera.com/new/2009/0902/fpri.html, Dec. 21, 2014, 2 pages.

Herrmann, W. et al., "Hot Spot Investigations on PV Modules—New Concepts for a Test Standard and Consequences for Module Design with Respect to Bypass Diodes," TÜV Rheinland Sicherheit und Umweltschutz GmbH, http://ieeexplore.ieee.org, Dec. 20, 2014, 6 pages.

Mäki, et al., "Power Losses in Long String and Parallel-Connected Short Strings of Series-Connected Silicon-Based Photovoltaic Modules Due to Partial Shading Conditions", IEEE Transactions on Energy Conversion, vol. 27, No. 1, Mar. 2012, pp. 173-183.

Halavani, et al., "Results of Pressue-Only Cell Interconnections in High Voltage PV-Modules", 29th European Photovoltaic Solar Energy Conference and Exhibition, Vienna University of Technology, pp. 64-68.

Heimann, M., et al., "Ultrasonic Bonding of Aluminum Ribbons to Interconnect High-Efficiency Crystalline-Silicon Solar Cells", Energy Procedia 27 (2012) pp. 670-675.

"Reducing AG Cost and Increasing Efficiency. Multicrystalline Silicon Solar Cells With Direct Plated Contacts Exceeding 17% Eficiency." 26th EU PVSEC Proceedings pp. 1199-1202.

Silvestre S., et al., "Study of bypass diodes configuration on PV modules", Applied Energy 86 (2009) pp. 1632-16450.

Scholten, "Silicone Encapsulation of c-Si Photovoltaic Modules", Solar Novus Today, Feb. 10, 2014, 5 pages, http://www.solarnovus.com.

ST Microelectronics, "How to choose a bypass diode for a silicon panel junction box", AN3432, 24 pages.

F.C. Nix et al., "The Thermal Expansion of Pure Metals: Copper, Gold, Aluminum, Nickel, and Iron", Oct. 15, 2914, vol. 60, 9 pages.

\* cited by examiner

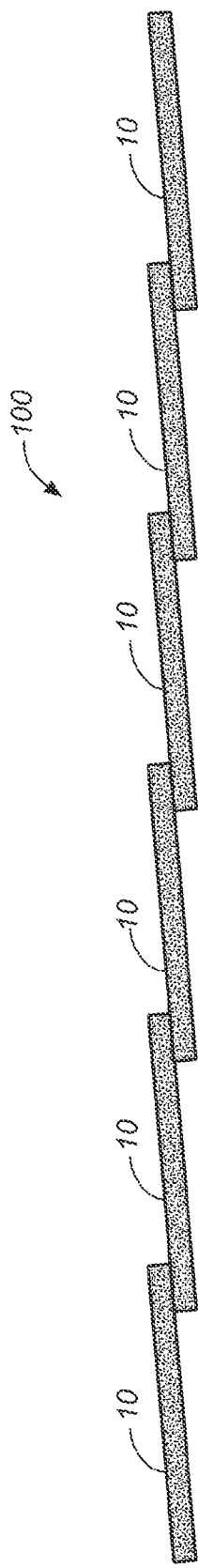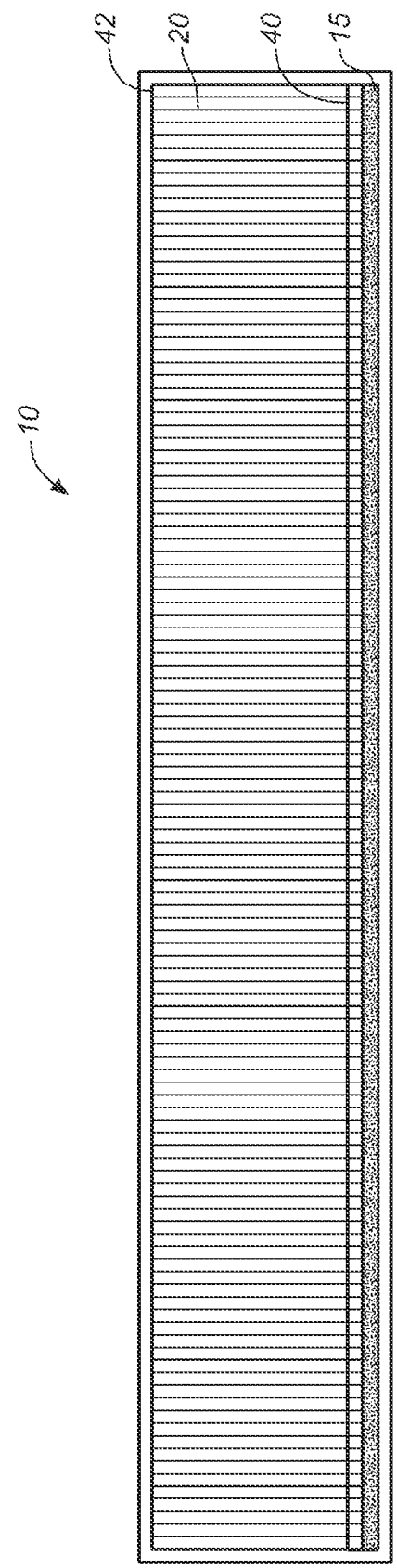

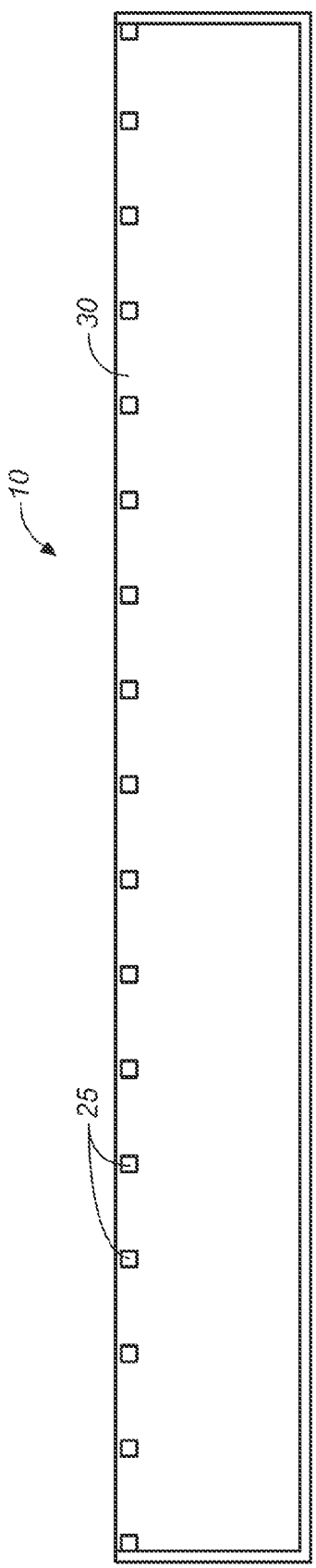
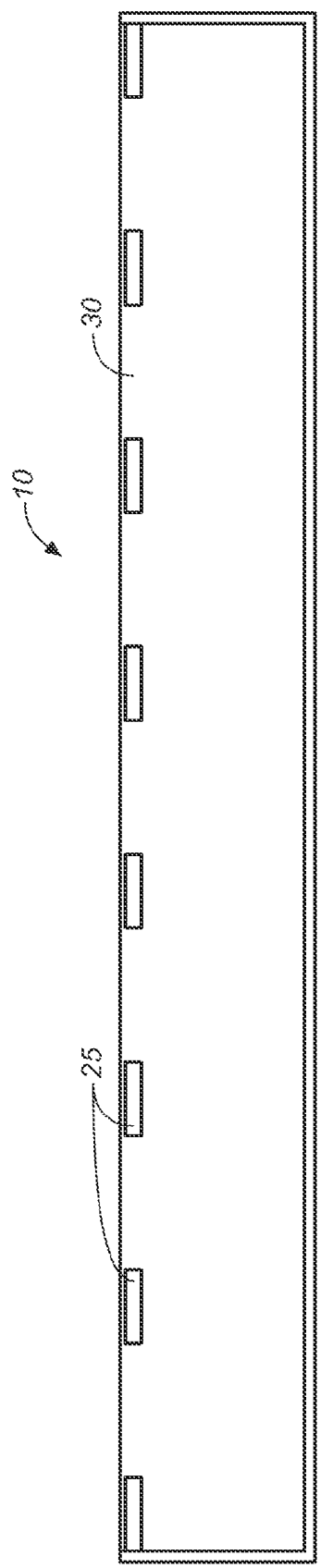
FIG. 2D
FIG. 2E

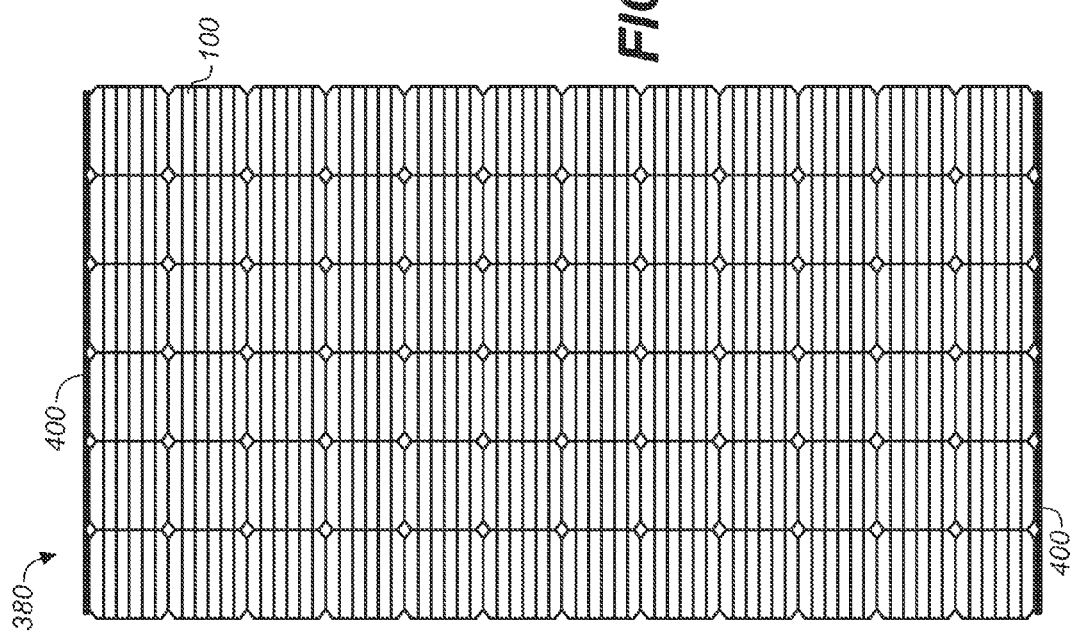
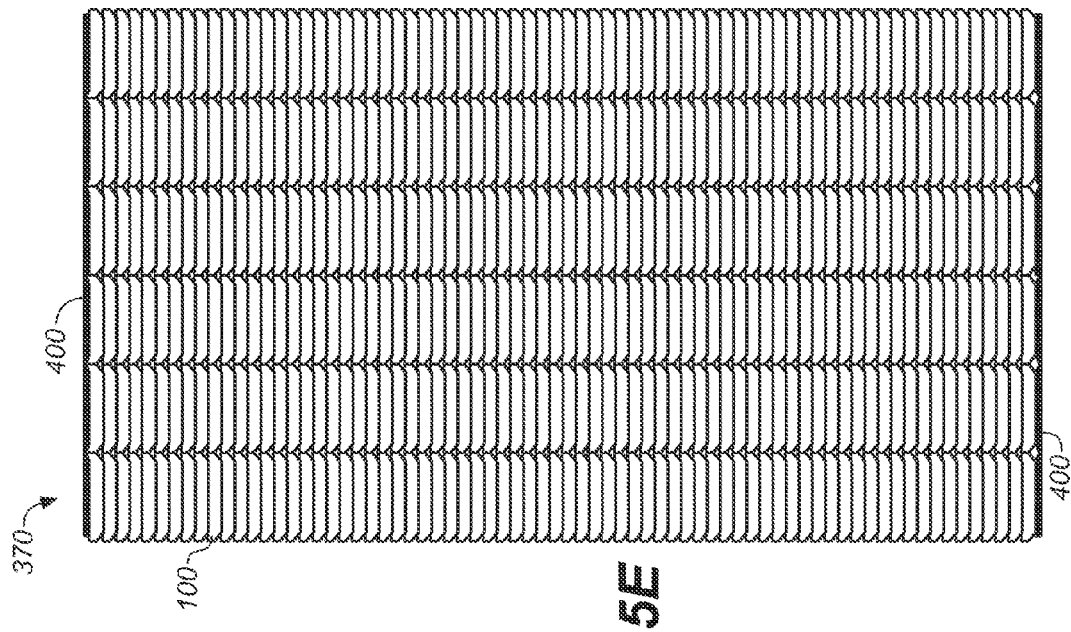

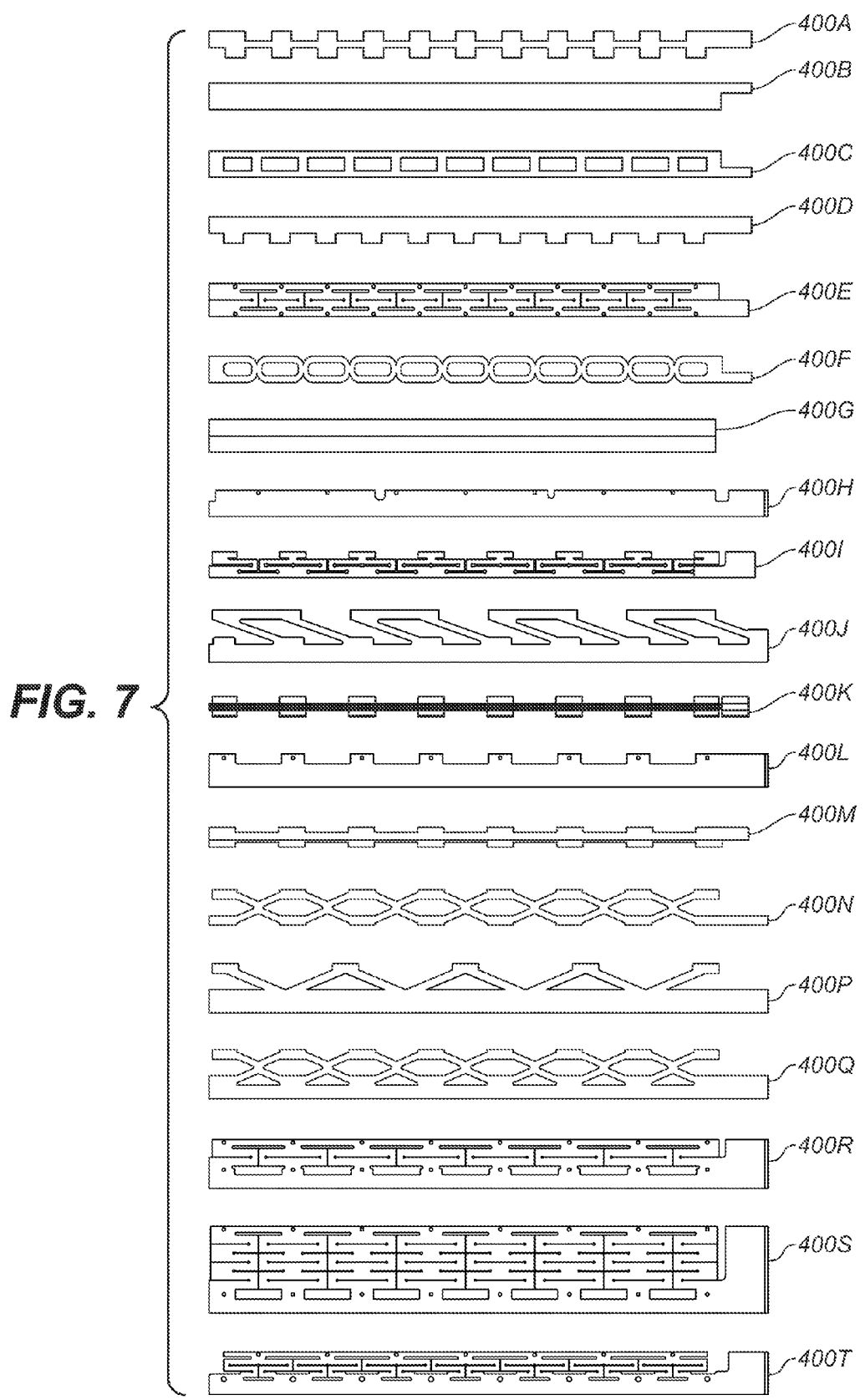

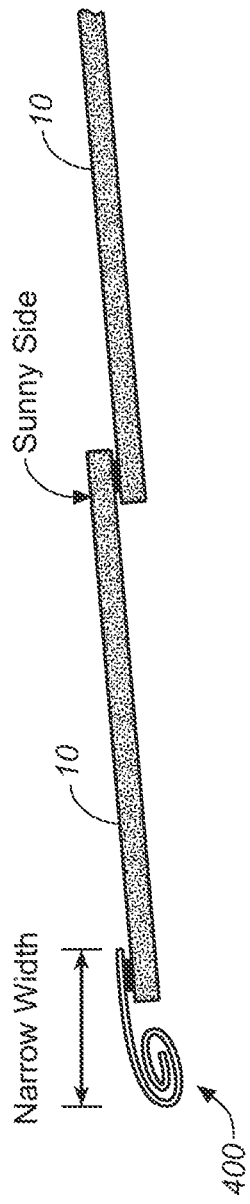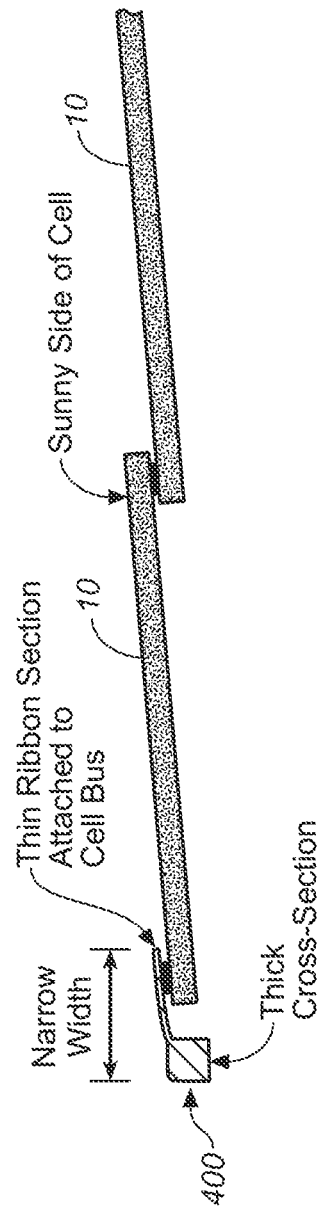
FIG. 8F
FIG. 8G

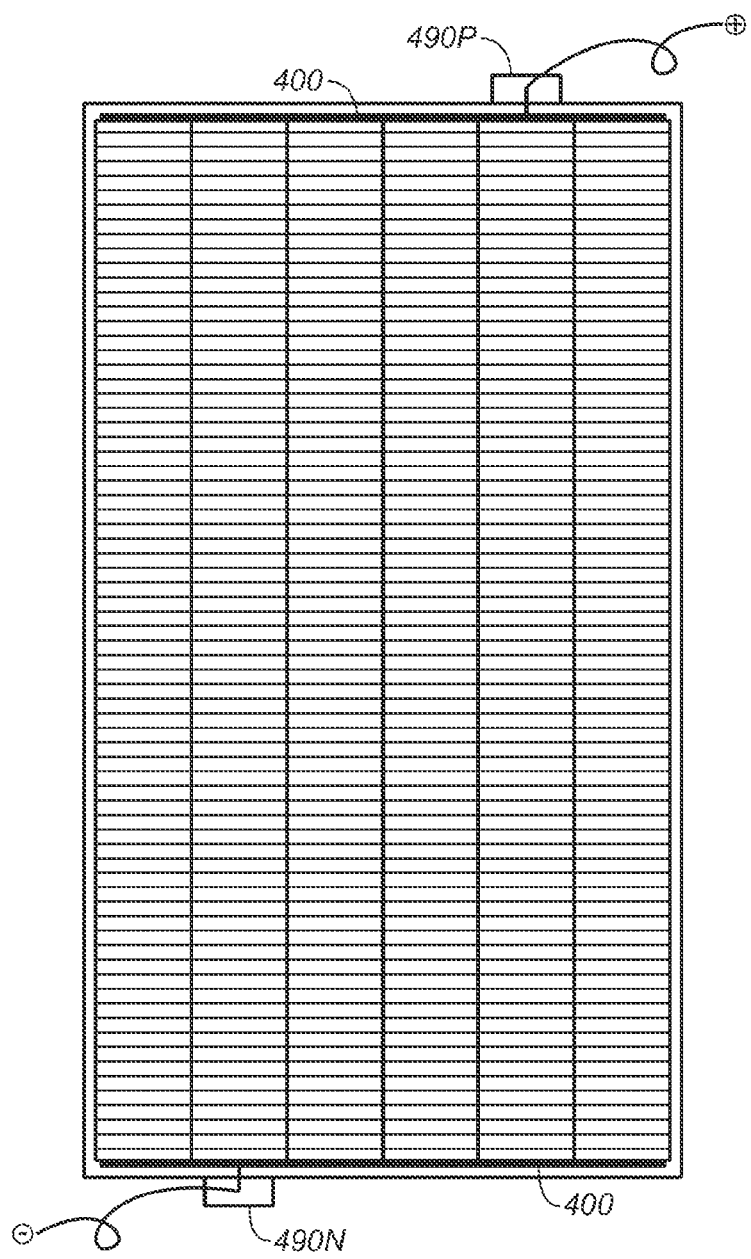
FIG. 9C  FIG. 9D

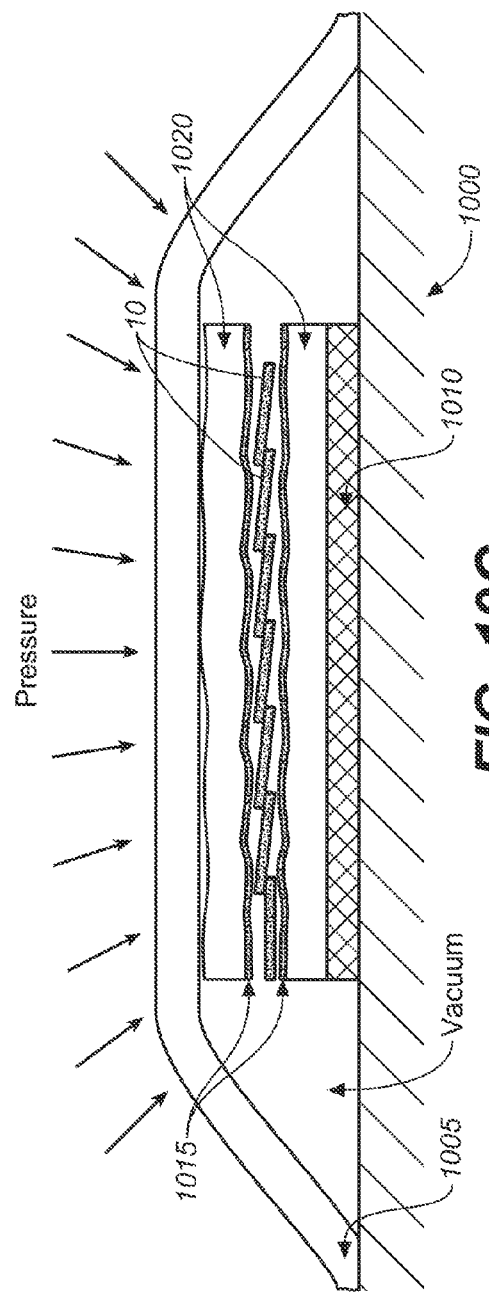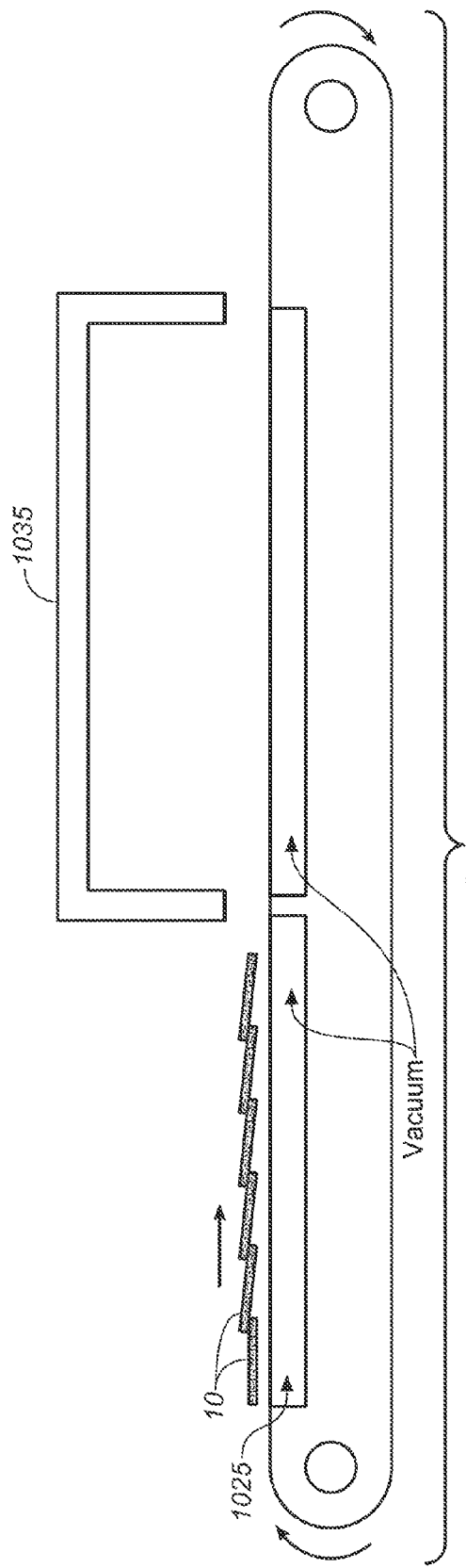

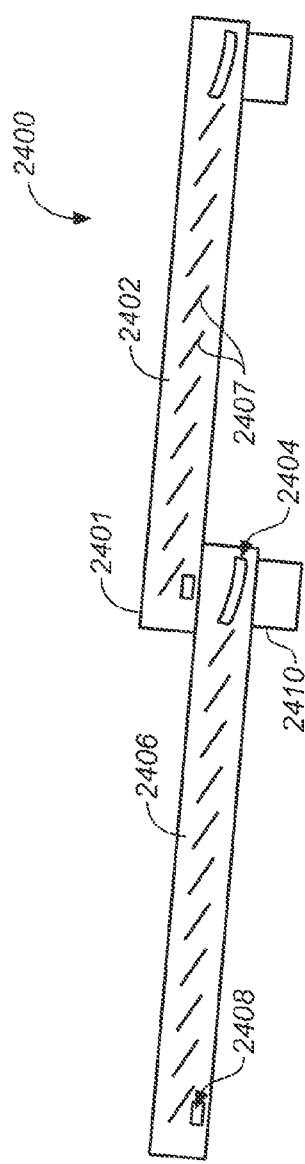
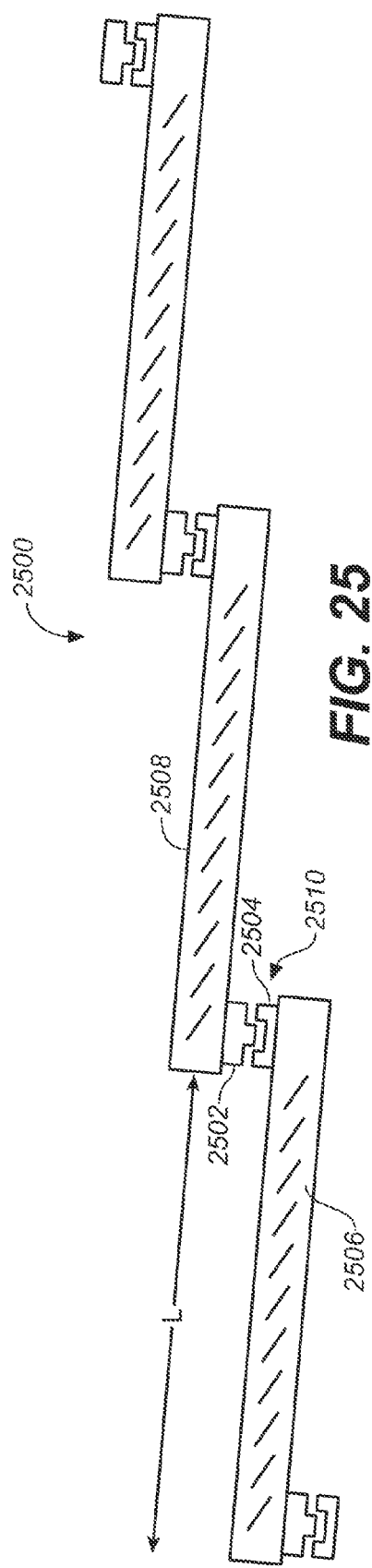

SHINGLED SOLAR CELL MODULE

CROSS REFERENCE TO RELATED APPLICATIONS

This nonprovisional patent application claims priority to U.S. Provisional Patent Application No. 62/003,223 titled "Shingled Solar Cell Module" filed May 27, 2014, to U.S. Provisional Patent Application No. 62/036,215 titled "Shingled Solar Cell Module" filed Aug. 12, 2014, to U.S. Provisional Patent Application No. 62/042,615 titled "Shingled Solar Cell Module" filed Aug. 27, 2014, and to U.S. Provisional Patent Application No. 62/048,858 titled "Shingled Solar Cell Module" filed Sep. 11, 2014, to U.S. Provisional Patent Application No. 62/064,260 titled "Shingled Solar Cell Module" filed Oct. 15, 2014, and to U.S. Provisional Patent Application No. 62/064,834 titled "Shingled Solar Cell Module" filed Oct. 16, 2014, each of which is incorporated herein by reference in its entirety. The instant nonprovisional patent application also claims priority to U.S. Design patent application Ser. No. 29/506,415 filed Oct. 15, 2014 and also incorporated by reference herein for all purposes.

FIELD OF THE INVENTION

The invention relates generally to solar cell modules in which the solar cells are arranged in a shingled manner.

BACKGROUND

Alternate sources of energy are needed to satisfy ever increasing world-wide energy demands. Solar energy resources are sufficient in many geographical regions to satisfy such demands, in part, by provision of electric power generated with solar (e.g., photovoltaic) cells.

SUMMARY

High efficiency arrangements of solar cells in a solar cell module, and methods of making such solar modules, are disclosed herein.

In one aspect, a solar module comprises a series connected string of N≥25 rectangular or substantially rectangular solar cells having on average a breakdown voltage greater than about 10 volts. The solar cells are grouped into one or more super cells each of which comprises two or more of the solar cells arranged in line with long sides of adjacent solar cells overlapping and conductively bonded to each other with an electrically and thermally conductive adhesive. No single solar cell or group of <N solar cells in the string of solar cells is individually electrically connected in parallel with a bypass diode. Safe and reliable operation of the solar module is facilitated by effective heat conduction along the super cells through the bonded overlapping portions of adjacent solar cells, which prevents or reduces formation of hot spots in reverse biased solar cells. The super cells may be encapsulated in a thermoplastic olefin polymer sandwiched between glass front and back sheets, for example, further enhancing the robustness of the module with respect to thermal damage. In some variations, N is ≥30, ≥50, or ≥100.

In another aspect, a super cell comprises a plurality of silicon solar cells each comprising rectangular or substantially rectangular front (sun side) and back surfaces with shapes defined by first and second oppositely positioned parallel long sides and two oppositely positioned short sides. Each solar cell comprises an electrically conductive front surface metallization pattern comprising at least one front surface contact pad positioned adjacent to the first long side, and an electrically conductive back surface metallization pattern comprising at least one back surface contact pad positioned adjacent the second long side. The silicon solar cells are arranged in line with first and second long sides of adjacent silicon solar cells overlapping and with front surface and back surface contact pads on adjacent silicon solar cells overlapping and conductively bonded to each other with a conductive adhesive bonding material to electrically connect the silicon solar cells in series. The front surface metallization pattern of each silicon solar cell comprises a barrier configured to substantially confine the conducive adhesive bonding material to the at least one front surface contact pads prior to curing of the conductive adhesive bonding material during manufacturing of the super cell.

In another aspect, a super cell comprises a plurality of silicon solar cells each comprising rectangular or substantially rectangular front (sun side) and back surfaces with shapes defined by first and second oppositely positioned parallel long sides and two oppositely positioned short sides. Each solar cell comprises an electrically conductive front surface metallization pattern comprising at least one front surface contact pad positioned adjacent to the first long side, and an electrically conductive back surface metallization pattern comprising at least one back surface contact pad positioned adjacent the second long side. The silicon solar cells are arranged in line with first and second long sides of adjacent silicon solar cells overlapping and with front surface and back surface contact pads on adjacent silicon solar cells overlapping and conductively bonded to each other with a conductive adhesive bonding material to electrically connect the silicon solar cells in series. The back surface metallization pattern of each silicon solar cell comprises a barrier configured to substantially confine the conducive adhesive bonding material to the at least one back surface contact pads prior to curing of the conductive adhesive bonding material during manufacturing of the super cell.

In another aspect, a method of making a string of solar cells comprises dicing one or more pseudo square silicon wafers along a plurality of lines parallel to a long edge of each wafer to form a plurality of rectangular silicon solar cells each having substantially the same length along its long axis. The method also comprises arranging the rectangular silicon solar cells in line with long sides of adjacent solar cells overlapping and conductively bonded to each other to electrically connect the solar cells in series. The plurality of rectangular silicon solar cells comprises at least one rectangular solar cell having two chamfered corners corresponding to corners or to portions of corners of the pseudo square wafer, and one or more rectangular silicon solar cells each lacking chamfered corners. The spacing between parallel lines along which the pseudo square wafer is diced is selected to compensate for the chamfered corners by making the width perpendicular to the long axis of the rectangular silicon solar cells that comprise chamfered corners greater than the width perpendicular to the long axis of the rectangular silicon solar cells that lack chamfered corners, so that each of the plurality of rectangular silicon solar cells in the string of solar cells has a front surface of substantially the same area exposed to light in operation of the string of solar cells.

In another aspect, a super cell comprises a plurality of silicon solar cells arranged in line with end portions of adjacent solar cells overlapping and conductively bonded to each other to electrically connect the solar cells in series. At least one of the silicon solar cells has chamfered comers that correspond to comers or portions of comers of a pseudo square silicon wafer from which it was diced, at least one of the silicon solar cells lacks chamfered comers, and each of the silicon solar cells has a front surface of substantially the same area exposed to light during operation of the string of solar cells.

In another aspect, a method of making two or more super cells comprises dicing one or more pseudo square silicon wafers along a plurality of lines parallel to a long edge of each wafer to form a first plurality of rectangular silicon solar cells comprising chamfered comers corresponding to comers or portions of comers of the pseudo square silicon wafers and a second plurality of rectangular silicon solar cells each of a first length spanning a full width of the pseudo square silicon wafers and lacking chamfered comers. The method also comprises removing the chamfered comers from each of the first plurality of rectangular silicon solar cells to form a third plurality of rectangular silicon solar cells each of a second length shorter than the first length and lacking chamfered comers. The method further comprises arranging the second plurality of rectangular silicon solar cells in line with long sides of adjacent rectangular silicon solar cells overlapping and conductively bonded to each other to electrically connect the second plurality of rectangular silicon solar cells in series to form a solar cell string having a width equal to the first length, and arranging the third plurality of rectangular silicon solar cells in line with long sides of adjacent rectangular silicon solar cells overlapping and conductively bonded to each other to electrically connect the third plurality of rectangular silicon solar cells in series to form a solar cell string having a width equal to the second length.

In another aspect, a method of making two or more super cells comprises dicing one or more pseudo square silicon wafers along a plurality of lines parallel to a long edge of each wafer to form a first plurality of rectangular silicon solar cells comprising chamfered comers corresponding to comers or portions of comers of the pseudo square silicon wafers and a second plurality of rectangular silicon solar cells lacking chamfered comers, arranging the first plurality of rectangular silicon solar cells in line with long sides of adjacent rectangular silicon solar cells overlapping and conductively bonded to each other to electrically connect the first plurality of rectangular silicon solar cells in series, and arranging the second plurality of rectangular silicon solar cells in line with long sides of adjacent rectangular silicon solar cells overlapping and conductively bonded to each other to electrically connect the second plurality of rectangular silicon solar cells in series.

In another aspect, a super cell comprises a plurality of silicon solar cells arranged in line in a first direction with end portions of adjacent silicon solar cells overlapping and conductively bonded to each other to electrically connect the silicon solar cells in series, and an elongated flexible electrical interconnect with its long axis oriented parallel to a second direction perpendicular to the first direction, conductively bonded to a front or back surface of an end one of the silicon solar cells at a plurality of discrete locations arranged along the second direction, running at least the full width of the end solar cell in the second direction, having a conductor thickness less than or equal to about 100 microns measured perpendicularly to the front or rear surface of the end silicon solar cell, providing a resistance to current flow in the second direction of less than or equal to about 0.012 Ohms, and configured to provide flexibility accommodating differential expansion in the second direction between the end silicon solar cell and the interconnect for a temperature range of about −40° C. to about 85° C.

The flexible electrical interconnect may have a conductor thickness less than or equal to about 30 microns measured perpendicularly to the front and rear surfaces of the end silicon solar cell, for example. The flexible electrical interconnect may extend beyond the super cell in the second direction to provide for electrical interconnection to at least a second super cell positioned parallel to and adjacent the super cell in a solar module. In addition, or alternatively, the flexible electrical interconnect may extend beyond the super cell in the first direction to provide for electrical interconnection to a second super cell positioned parallel to and in line with the super cell in a solar module.

In another aspect, a solar module comprises a plurality of super cells arranged in two or more parallel rows spanning a width of the module to form a front surface of the module. Each super cell comprises a plurality of silicon solar cells arranged in line with end portions of adjacent silicon solar cells overlapping and conductively bonded to each other to electrically connect the silicon solar cells in series. At least an end of a first super cell adjacent an edge of the module in a first row is electrically connected to an end of a second super cell adjacent the same edge of the module in a second row via a flexible electrical interconnect that is bonded to the front surface of the first super cell at a plurality of discrete locations with an electrically conductive adhesive bonding material, runs parallel to the edge of the module, and at least a portion of which folds around the end of the first super cell and is hidden from view from the front of the module.

In another aspect, a method of making a super cell comprises laser scribing one or more scribe lines on each of one or more silicon solar cells to define a plurality of rectangular regions on the silicon solar cells, applying an electrically conductive adhesive bonding material to the one or more scribed silicon solar cells at one or more locations adjacent a long side of each rectangular region, separating the silicon solar cells along the scribe lines to provide a plurality of rectangular silicon solar cells each comprising a portion of the electrically conductive adhesive bonding material disposed on its front surface adjacent a long side, arranging the plurality of rectangular silicon solar cells in line with long sides of adjacent rectangular silicon solar cells overlapping in a shingled manner with a portion of the electrically conductive adhesive bonding material disposed in between, and curing the electrically conductive bonding material, thereby bonding adjacent overlapping rectangular silicon solar cells to each other and electrically connecting them in series.

In another aspect, a method of making a super cell comprises laser scribing one or more scribe lines on each of one or more silicon solar cells to define a plurality of rectangular regions on the silicon solar cells, applying an electrically conductive adhesive bonding material to portions of the top surfaces of the one or more silicon solar cells, applying a vacuum between the bottom surfaces of the one or more silicon solar cells and a curved supporting surface to flex the one or more silicon solar cells against the curved supporting surface and thereby cleave the one or more silicon solar cells along the scribe lines to provide a plurality of rectangular silicon solar cells each comprising a portion of the electrically conductive adhesive bonding material disposed on its front surface adjacent a long side, arranging the plurality of rectangular silicon solar cells in line with long sides of adjacent rectangular silicon solar cells overlapping in a shingled manner with a portion of the electrically conductive adhesive bonding material disposed in between, and curing the electrically conductive bonding material, thereby bonding adjacent overlapping rectangular silicon solar cells to each other and electrically connecting them in series.

In another aspect, a method of making a solar module comprises assembling a plurality of super cells, with each super cell comprising a plurality of rectangular silicon solar cells arranged in line with end portions on long sides of adjacent rectangular silicon solar cells overlapping in a shingled manner. The method also comprises curing an electrically conductive bonding material disposed between the overlapping end portions of adjacent rectangular silicon solar cells by applying heat and pressure to the super cells, thereby bonding adjacent overlapping rectangular silicon solar cells to each other and electrically connecting them in series. The method also comprises arranging and interconnecting the super cells in a desired solar module configuration in a stack of layers comprising an encapsulant, and applying heat and pressure to the stack of layers to form a laminated structure.

Some variations of the method comprise curing or partially curing the electrically conductive bonding material by applying heat and pressure to the super cells prior to applying heat and pressure to the stack of layers to form the laminated structure, thereby forming cured or partially cured super cells as an intermediate product before forming the laminated structure. In some variations, as each additional rectangular silicon solar cell is added to a super cell during assembly of the super cell, the electrically conductive adhesive bonding material between the newly added solar cell and its adjacent overlapping solar cell is cured or partially cured before any other rectangular silicon solar cell is added to the super cell. Alternatively, some variations comprise curing or partially curing all of the electrically conductive bonding material in a super cell in the same step.

If the super cells are formed as partially cured intermediate products, the method may comprise completing the curing of the electrically conductive bonding material while applying heat and pressure to the stack of layers to form the laminated structure.

Some variations of the method comprise curing the electrically conductive bonding material while applying heat and pressure to the stack of layers to form a laminated structure, without forming cured or partially cured super cells as an intermediate product before forming the laminated structure.

The method may comprise dicing one or more standard size silicon solar cells into rectangular shapes of smaller area to provide the rectangular silicon solar cells. The electrically conductive adhesive bonding material may be applied to the one or more silicon solar cells before dicing the one or more silicon solar cells to provide the rectangular silicon solar cells with pre-applied electrically conductive adhesive bonding material. Alternatively, the electrically conductive adhesive bonding material may be applied to the rectangular silicon solar cells after dicing the one or more silicon solar cells to provide the rectangular silicon solar cells.

These and other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

FIG. 1 shows a cross-sectional diagram of a string of series-connected solar cells arranged in a shingled manner with the ends of adjacent solar cells overlapping to form a shingled super cell.

FIG. 2A shows a diagram of the front (sun side) surface and front surface metallization pattern of an example rectangular solar cell that may be used to form shingled super cells.

FIGS. 2D and 2E show diagrams of the rear surfaces and example rear surface metallization patterns for the solar cell shown in FIG. 2A.

FIG. 3B shows the front surface of the wafer and an example front surface metallization pattern. FIG. 3C shows the rear surface of the wafer and an example rear surface metallization pattern.

FIG. 3D shows the front surface of the wafer and an example front surface metallization pattern. FIG. 3E shows the rear surface of the wafer and an example rear surface metallization pattern.

FIG. 5E shows a diagram of another example rectangular solar module similar in configuration to that of FIG. 5C, in which all of the solar cells from which the super cells are formed are chevron solar cells having chamfered corners corresponding to corners of pseudo-square wafers from which the solar cells were separated.

FIG. 5F shows a diagram of another example rectangular solar module similar in configuration to that of FIG. 5C, in which the solar cells from which the super cells are formed comprise a mixture of chevron and rectangular solar cells arranged to reproduce the shapes of the pseudo-square wafers from which they were separated.

FIG. 7 shows example flexible interconnects that may be used to interconnect super cells in series or in parallel. Some of the examples exhibit patterning that increase their flexibility (mechanical compliance) along their long axes, along their short axes, or along their long axes and their short axes.

FIG. 8D-8G show additional examples of electrical interconnects bonded to a front terminal contact of a super cell at an end of a row of super cells, adjacent an edge of a solar module. The example interconnects are configured to have a small foot print on the front surface of the module.

FIG. 9C shows an example glass-glass rectangular solar module comprising six rectangular shingled super cells, with the long side of each super cell having a length of approximately the length of the long side of the module. The super cells are arranged in six rows that are electrically connected in parallel with each other. Two junction boxes are mounted on opposite edges of the module, maximizing the active area of the module.

FIG. 9D shows a side view of the solar module illustrated in FIG. 9C.

FIGS. 10B-1 and 10B-2 show an example physical layout for various electrical interconnections for a solar module as illustrated in FIG. 5B having the schematic circuit diagram of FIG. 10A.

FIGS. 11B-1 and 11B-2 show an example physical layout for various electrical interconnections for a solar module as illustrated in FIG. 5A having the schematic electrical circuit diagram of FIG. 11A.

FIGS. 11C-1 and 11C-2 show another example physical layout for various electrical interconnections for a solar module as illustrated in FIG. 5A having the schematic electrical circuit diagram of FIG. 11A.

FIGS. 12B-1 and 12B-2 show an example physical layout for various electrical interconnections for a solar module as illustrated in FIG. 5A having the schematic circuit diagram of FIG. 12A.

FIGS. 12C-1, 12C-2, and 12C-3 show another example physical layout for various electrical interconnections for a solar module as illustrated in FIG. 5A having the schematic circuit diagram of FIG. 12A.

FIGS. 13C-1 and 13C-2 show an example physical layout for various electrical interconnections for a solar module as illustrated in FIG. 5A having the schematic circuit diagram of FIG. 13A. Slightly modified, the physical layout of FIGS. 13C-1 and 13C-2 is suitable for a solar module as illustrated in FIG. 5B having the schematic circuit diagram of FIG. 13B.

FIGS. 14C-1 and 14C-2 show an example physical layout for various electrical interconnections for a solar module as illustrated in FIG. 14A having the schematic circuit diagram of FIG. 14B.

FIGS. 19A-19D show example arrangements by which super cells may be cured with heat and pressure.

FIGS. 24-25 show simplified cross-sectional views of arrays comprising a plurality of modules assembled in shingled configurations.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "parallel or substantially parallel" and to encompass minor deviations from parallel geometries rather than to require that any parallel arrangements described herein be exactly parallel. The term "perpendicular" is intended to mean "perpendicular or substantially perpendicular" and to encompass minor deviations from perpendicular geometries rather than to require that any perpendicular arrangement described herein be exactly perpendicular. The term "square" is intended to mean "square or substantially square" and to encompass minor deviations from square shapes, for example substantially square shapes having chamfered (e.g., rounded or otherwise truncated) corners. The term "rectangular" is intended to mean "rectangular or substantially rectangular" and to encompass minor deviations from rectangular shapes, for example substantially rectangular shapes having chamfered (e.g., rounded or otherwise truncated) corners.

This specification discloses high-efficiency shingled arrangements of silicon solar cells in solar cell modules, as well as front and rear surface metallization patterns and interconnects for solar cells that may be used in such arrangements. This specification also discloses methods for manufacturing such solar modules. The solar cell modules may be advantageously employed under "one sun" (non-concentrating) illumination, and may have physical dimensions and electrical specifications allowing them to be substituted for conventional silicon solar cell modules.

Figure 10A:
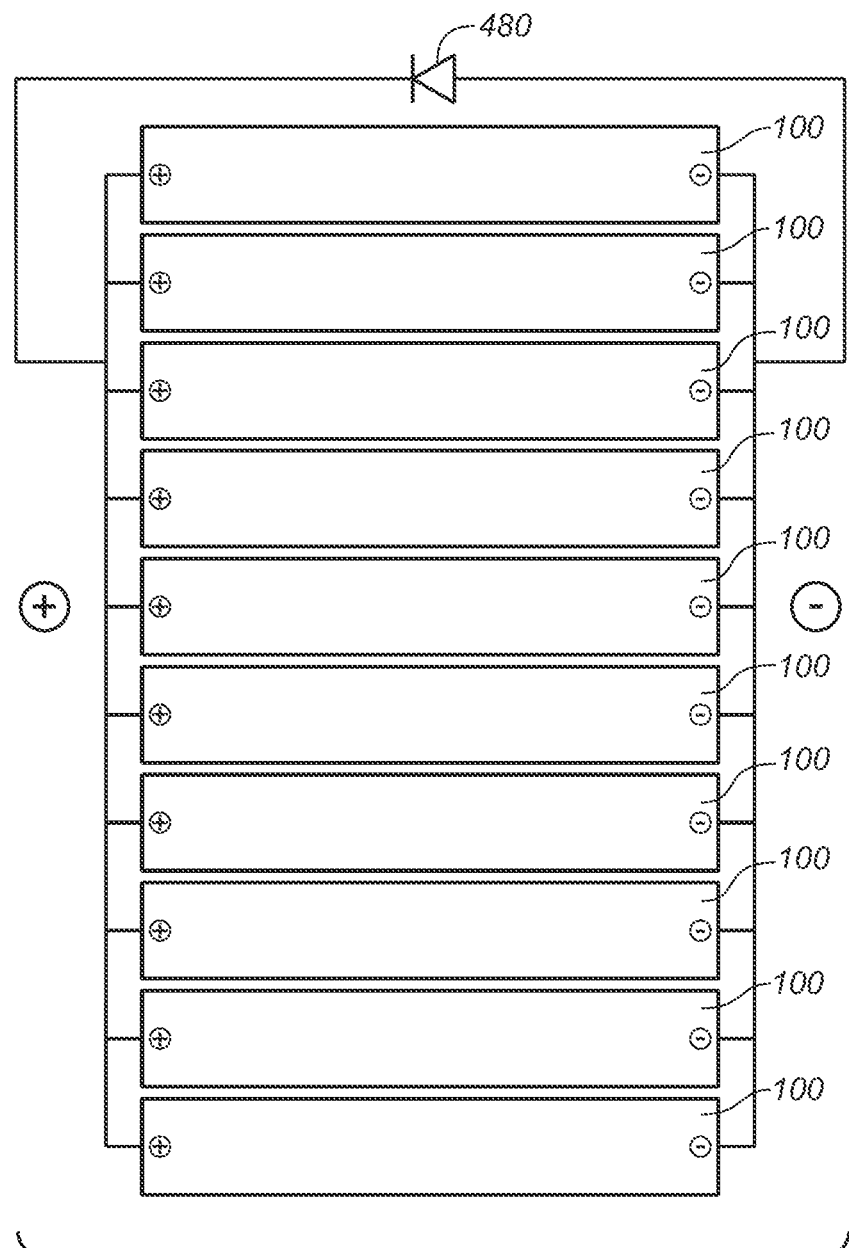
FIG. 10A shows an example schematic electrical circuit diagram for a solar module as illustrated in FIG. 5B.
Figures 1, 10B:
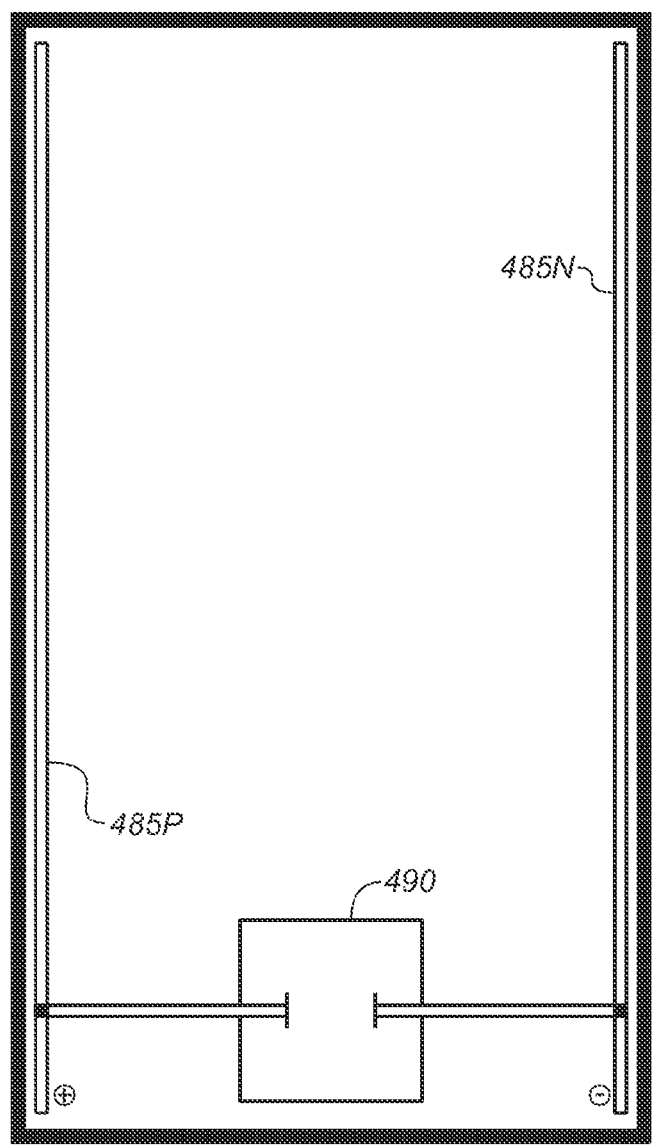

FIG. 1 shows a cross-sectional view of a string of series-connected solar cells 10 arranged in a shingled manner with the ends of adjacent solar cells overlapping and electrically connected to form a super cell 100. Each solar cell 10 comprises a semiconductor diode structure and electrical contacts to the semiconductor diode structure by which electric current generated in solar cell 10 when it is illuminated by light may be provided to an external load.

In the examples described in this specification, each solar cell 10 is a crystalline silicon solar cell having front (sun side) surface and rear (shaded side) surface metallization patterns providing electrical contact to opposite sides of an n-p junction, the front surface metallization pattern is disposed on a semiconductor layer of n-type conductivity, and the rear surface metallization pattern is disposed on a semiconductor layer of p-type conductivity. However, any other suitable solar cells employing any other suitable material system, diode structure, physical dimensions, or electrical contact arrangement may be used instead of or in addition to solar cells 10 in the solar modules described in this specification. For example, the front (sun side) surface metallization pattern may be disposed on a semiconductor layer of p-type conductivity, and the rear (shaded side) surface metallization pattern disposed on a semiconductor layer of n-type conductivity.

Referring again to FIG. 1, in super cell 100 adjacent solar cells 10 are conductively bonded to each other in the region in which they overlap by an electrically conducting bonding material that electrically connects the front surface metallization pattern of one solar cell to the rear surface metallization pattern of the adjacent solar cell. Suitable electrically conducting bonding materials may include, for example, electrically conducting adhesives and electrically conducting adhesive films and adhesive tapes, and conventional solders. Preferably, the electrically conducting bonding material provides mechanical compliance in the bond between the adjacent solar cells that accommodates stress arising from mismatch between the coefficient of thermal expansion (CTE) of the electrically conducting bonding material and that of the solar cells (e.g., the CTE of silicon). To provide such mechanical compliance, in some variations the electrically conducting bonding material is selected to have a glass transition temperature of less than or equal to about 0° C. To further reduce and accommodate stress parallel to the overlapping edges of the solar cells arising from CTE mismatch, the electrically conductive bonding material may optionally be applied only at discrete locations along the overlapping regions of the solar cells rather than in a continuous line extending substantially the length of the edges of the solar cells The thickness of the electrically conductive bond between adjacent overlapping solar cells formed by the electrically conductive bonding material, measured perpendicularly to the front and rear surfaces of the solar cells, may be for example less than about 0.1 mm. Such a thin bond reduces resistive loss at the interconnection between cells, and also promotes flow of heat along the super cell from any hot spot in the super cell that might develop during operation. The thermal conductivity of the bond between solar cells may be, for example, ≥about 1.5 Watts/(meter K).

FIG. 2A shows the front surface of an example rectangular solar cell 10 that may be used in a super cell 100. Other shapes for solar cell 10 may also be used, as suitable. In the illustrated example the front surface metallization pattern of solar cell 10 includes a bus bar 15 positioned adjacent to the edge of one of the long sides of solar cell 10 and running parallel to the long sides for substantially the length of the long sides, and fingers 20 attached perpendicularly to the bus bar and running parallel to each other and to the short sides of solar cell 10 for substantially the length of the short sides.

In the example of FIG. 2A solar cell 10 has a length of about 156 mm, a width of about 26 mm, and thus an aspect ratio (length of short side/length of long side) of about 1:6. Six such solar cells may be prepared on a standard 156 mm×156 mm dimension silicon wafer, then separated (diced) to provide solar cells as illustrated. In other variations, eight solar cells 10 having dimensions of about 19.5 mm×156 mm, and thus an aspect ratio of about 1:8, may be prepared from a standard silicon wafer. More generally, solar cells 10 may have aspect ratios of, for example, about 1:2 to about 1:20 and may be prepared from standard size wafers or from wafers of any other suitable dimensions.

Figure 3A:
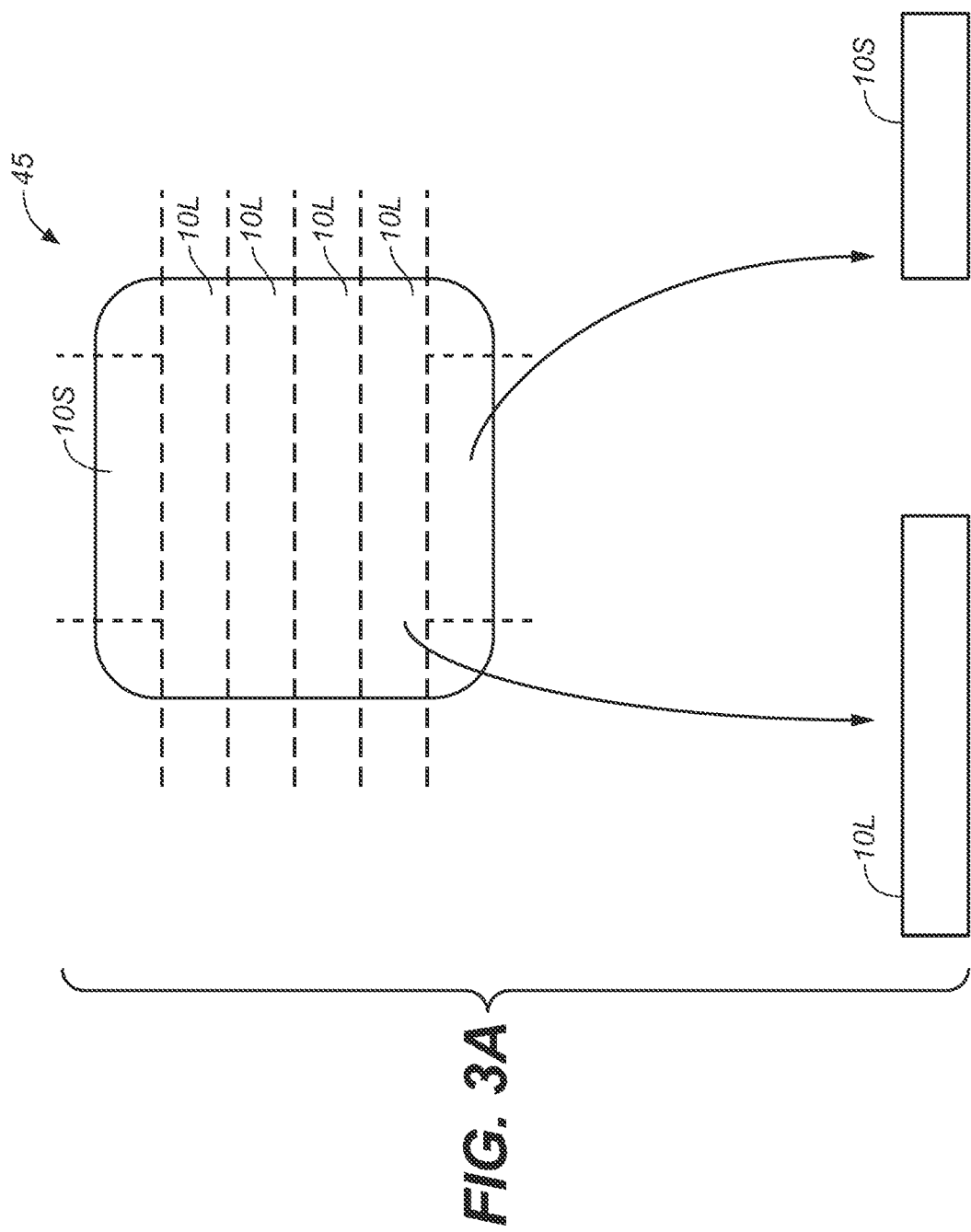
FIG. 3A shows a diagram illustrating an example method by which a standard size and shape pseudo square silicon solar cell may be separated (e.g., cut, or broken) into rectangular solar cells of two different lengths that may be used to form shingled super cells.

FIG. 3A shows an example method by which a standard size and shape pseudo square silicon solar cell wafer 45 may be cut, broken, or otherwise divided to form rectangular solar cells as just described. In this example several full width rectangular solar cells 10L are cut from the central portion of the wafer, and in addition several shorter rectangular solar cells 10S are cut from end portions of the wafer and the chamfered or rounded corners of the wafer are discarded. Solar cells 10L may be used to form shingled super cells of one width, and solar cells 10S may be used to form shingled super cells of a narrower width.

Figure 2B:
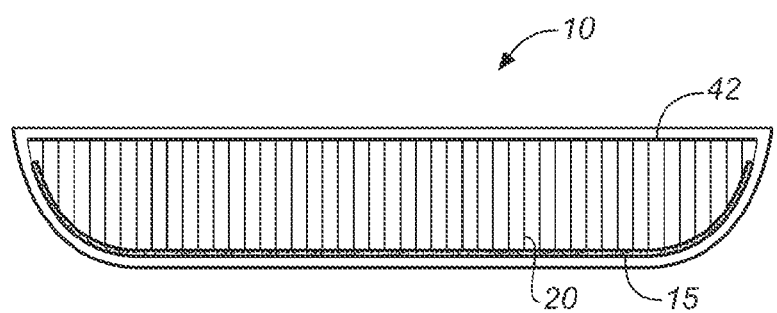
FIGS. 2B and 2C show diagrams of the front (sun side) surface and front surface metallization patterns of two example rectangular solar cells having rounded corners that may be used to form shingled super cells
Figure 2C:
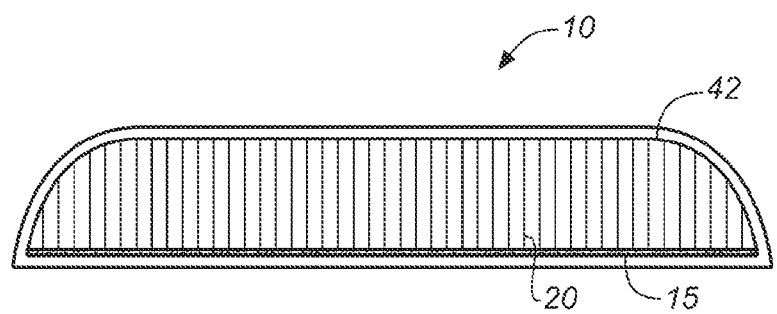
Figure 2F:
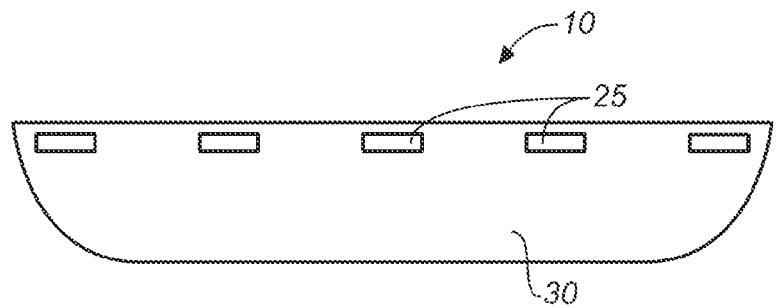
FIGS. 2F and 2G show diagrams of the rear surfaces and example rear surface metallization patterns for the solar cells shown in FIGS. 2B and 2C, respectively.
Figure 2G:
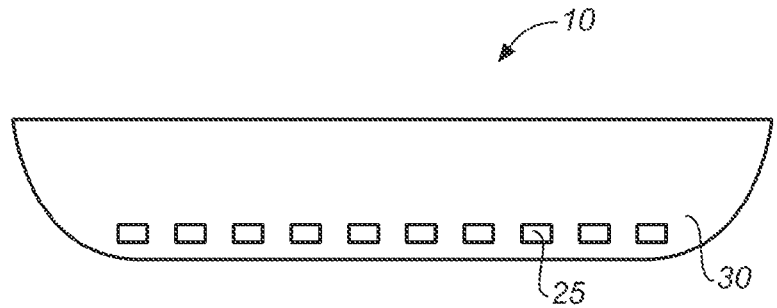
Figure 3B:
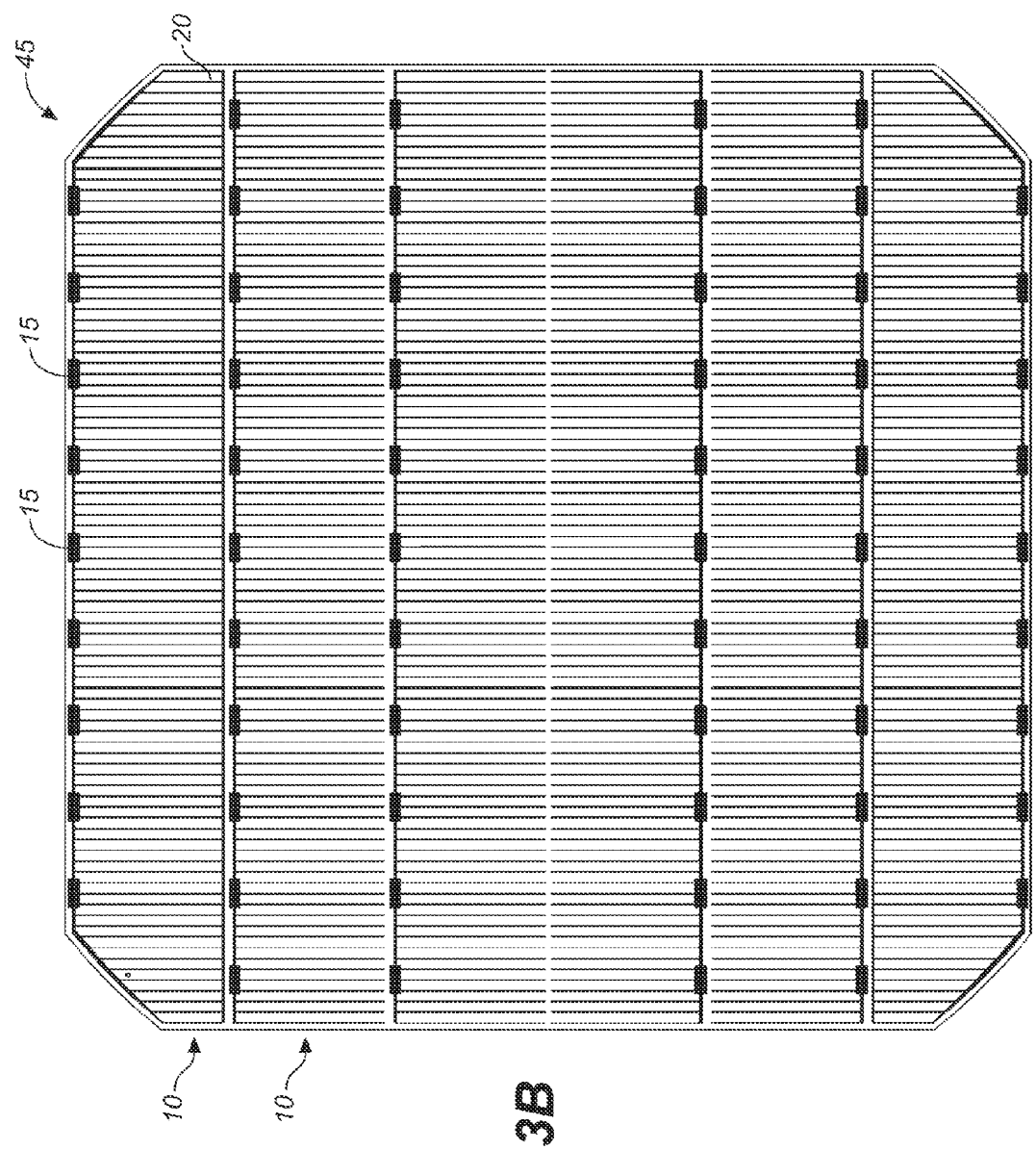
FIGS. 3B and 3C show diagrams illustrating another example method by which a pseudo square silicon solar cell may be separated into rectangular solar cells.
Figure 3C:
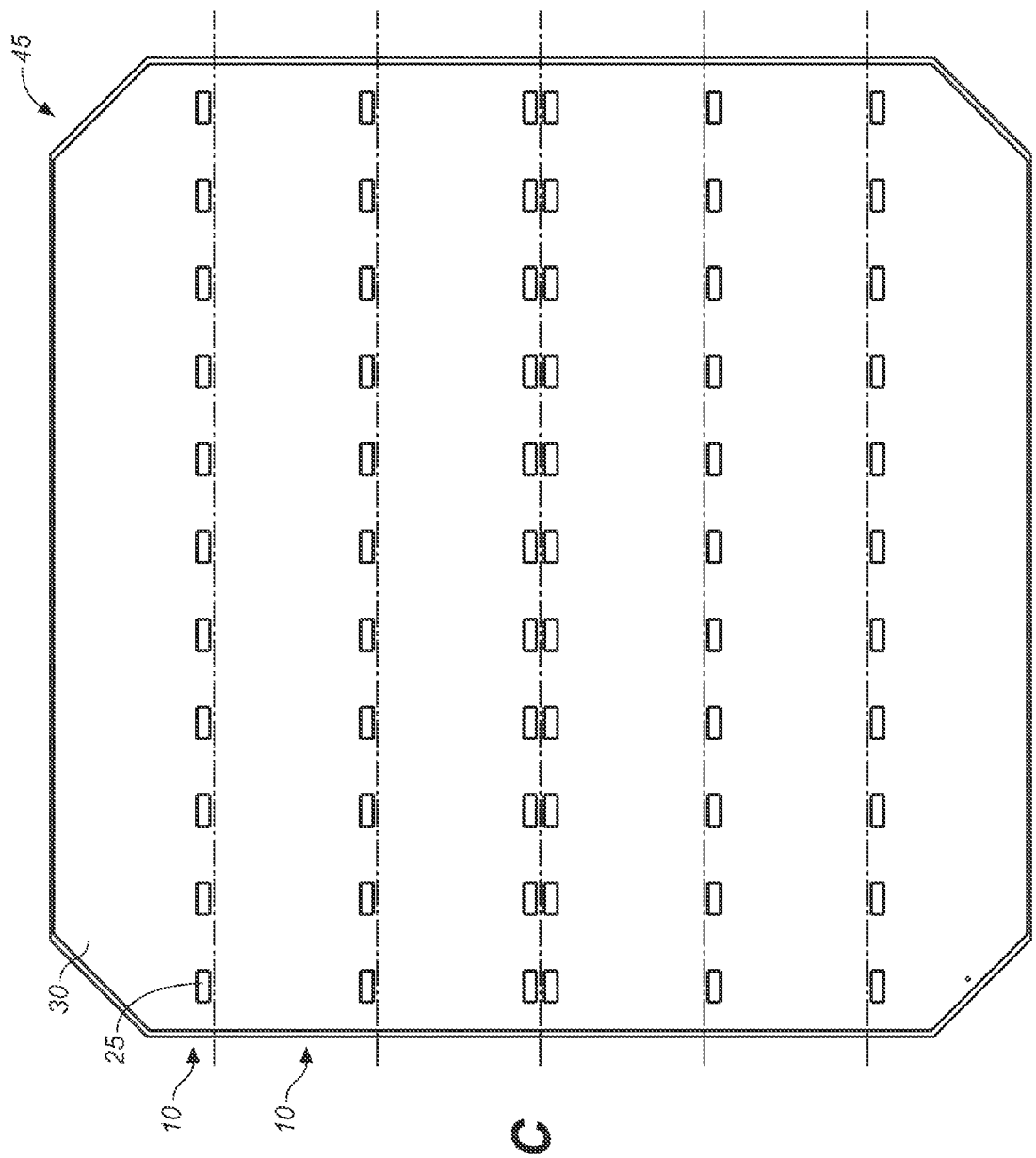

Alternatively, the chamfered (e.g., rounded) corners may be retained on the solar cells cut from end portions of the wafer. FIGS. 2B-2C show the front surfaces of example "chevron" rectangular solar cells 10 substantially similar to that of FIG. 2A, but having chamfered corners retained from the wafer from which the solar cells were cut. In FIG. 2B, bus bar 15 is positioned adjacent to and runs parallel to the shorter of the two long sides for substantially the length of that side, and further extends at both ends at least partially around the chamfered corners of the solar cell. In FIG. 2C, bus bar 15 is positioned adjacent to and runs parallel to the longer of the two long sides for substantially the length of that side. FIGS. 3B-3C show front and rear views of a pseudo square wafer 45 that may be diced along the dashed lines shown in FIG. 3C to provide a plurality of solar cells 10 having front surface metallization patterns similar to that shown in FIG. 2A, and two chamfered solar cells 10 having front surface metallization patterns similar to that shown in FIG. 2B.

In the example front surface metallization pattern shown in FIG. 2B, the two end portions of bus bar 15 that extend around the chamfered corners of the cell may each have a width that tapers (gradually narrows) with increasing distance from the portion of the bus bar located adjacent the long side of the cell. Similarly, in the example front surface metallization pattern shown in FIG. 3B, the two end portions of the thin conductor that interconnects discrete contact pads 15 extend around the chambered corners of the solar cell and taper with increasing distance from the long side of the solar cell along which the discrete contact pads are arranged. Such tapering is optional, but may advantageously reduce metal use and shading of the active region of the solar cell without significantly increasing resistive loss.

Figure 3D:
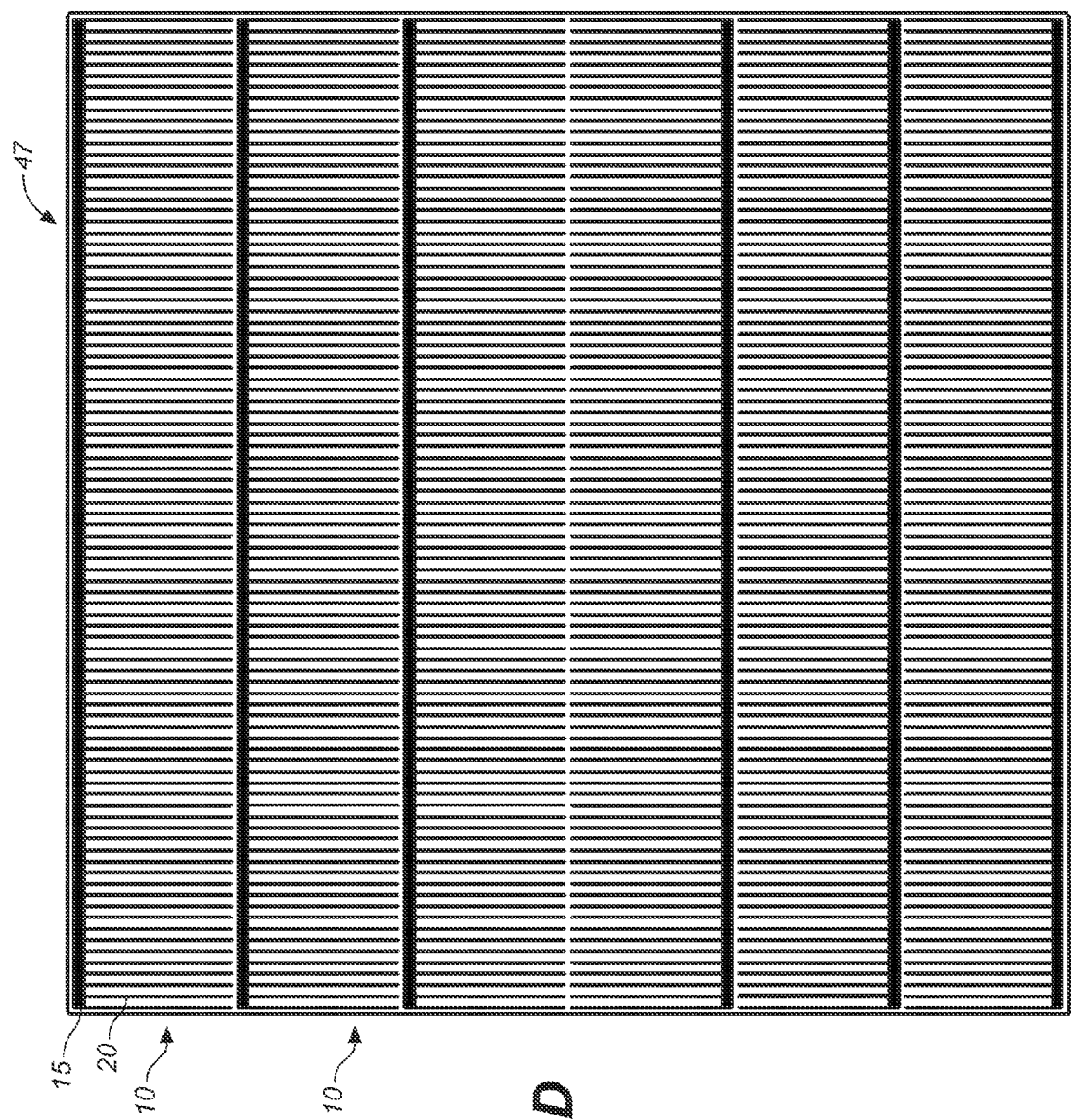
FIGS. 3D and 3E show diagrams illustrating an example method by which a square silicon solar cell may be separated into rectangular solar cells.
Figure 3E:
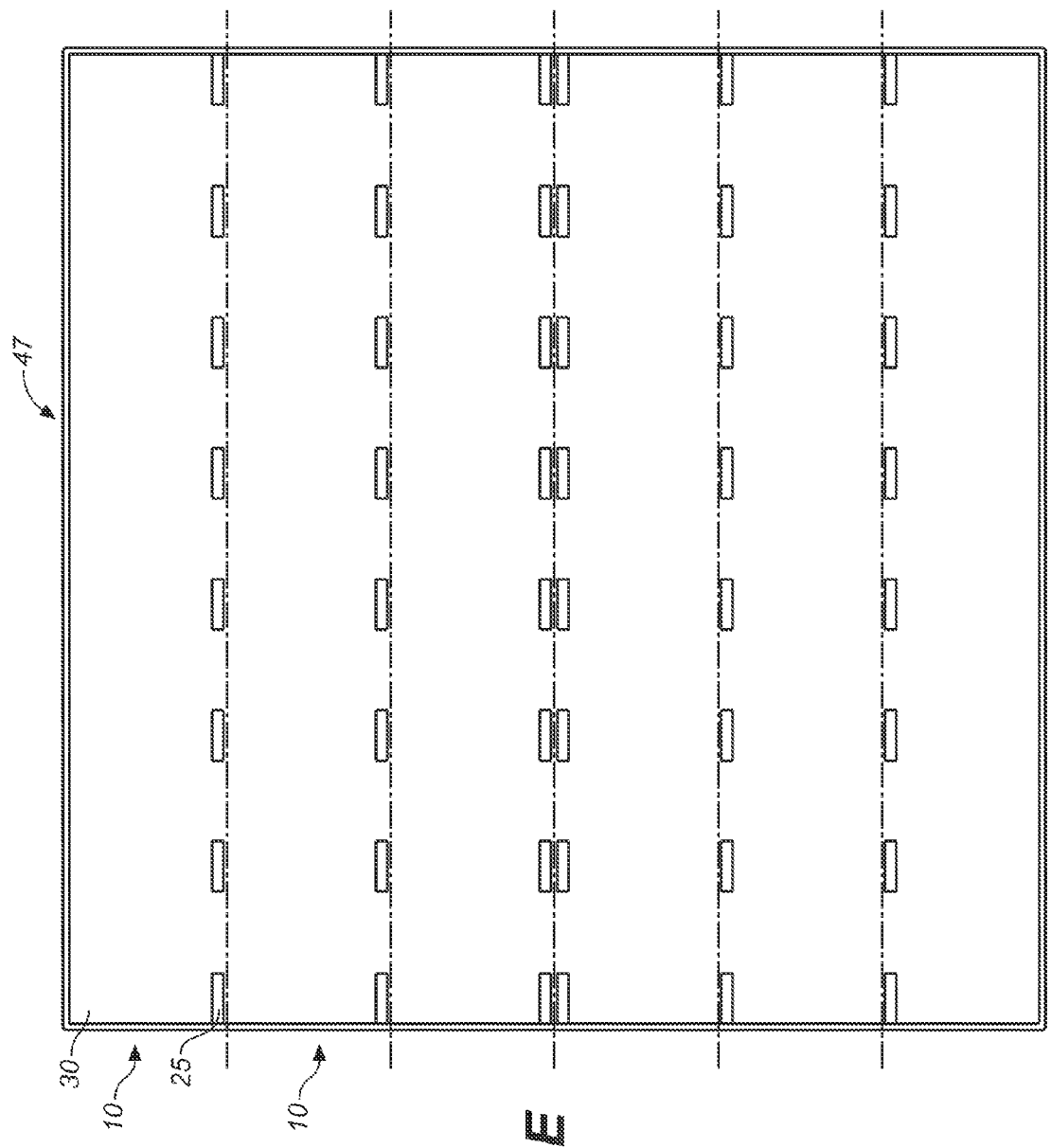

FIGS. 3D-3E show front and rear views of a perfect square wafer 47 that may be diced along the dashed lines shown in FIG. 3E to provide a plurality of solar cells 10 having front surface metallization patterns similar to that shown in FIG. 2A.

Chamfered rectangular solar cells may be used to form super cells comprising only chamfered solar cells. Additionally or alternatively, one or more such chamfered rectangular solar cells may be used in combination with one or more unchamfered rectangular solar cells (e.g., FIG. 2A) to form a super cell. For example, the end solar cells of a super cell may be chamfered solar cells, and the middle solar cells unchamfered solar cells. If chamfered solar cells are used in combination with unchamfered solar cells in a super cell, or more generally in a solar module, it may be desirable to use dimensions for the solar cells that result in the chamfered and unchamfered solar cells having the same front surface area exposed to light during operation of the solar cells. Matching the solar cell areas in this manner matches the current produced in the chamfered and unchamfered solar cells, which improves the performance of a series connected string that includes both chamfered and unchamfered solar cells. The areas of chamfered and unchamfered solar cells cut from the same pseudo square wafer may be matched, for example, by adjusting locations of the lines along which the wafer is diced to make the chamfered solar cells slightly wider than the unchamfered solar cells in the direction perpendicular to their long axes, to compensate for the missing corners on the chamfered solar cells.

A solar module may comprise only super cells formed exclusively from unchamfered rectangular solar cells, or only super cells formed from chamfered rectangular solar cells, or only super cells that include chamfered and unchamfered solar cells, or any combination of these three variations of super cell.

In some instances portions of a standard size square or pseudo square solar cell wafer (e.g., wafer 45 or wafer 47) near the edges of the wafer may convert light to electricity with lower efficiency than portions of the wafer located away from the edges. To improve the efficiency of the resulting rectangular solar cells, in some variations one or more edges of the wafer are trimmed to remove the lower efficiency portions before the wafer is diced. The portions trimmed from the edges of the wafer may have widths of about 1 mm to about 5 mm, for example. Further, as shown in FIGS. 3B and 3D, the two end solar cells 10 to be diced from a wafer may be oriented with their front surface bus bars (or discrete contact pads) 15 along their outside edges and thus along two of the edges of the wafer. Because in the super cells disclosed in this specification bus bars (or discrete contact pads) 15 are typically overlapped by an adjacent solar cell, low light conversion efficiency along those two edges of the wafer typically does not affect performance of the solar cells. Consequently, in some variations edges of a square or pseudo square wafer oriented parallel to the short sides of the rectangular solar cells are trimmed as just described, but edges of the wafer oriented parallel to the long sides of rectangular solar cells are not. In other variations, one, two, three, or four edges of a square wafer (e.g., wafer 47 in FIG. 3D) are trimmed as just described. In other variations, one, two, three, or four of the long edges of a pseudo-square wafer are trimmed as just described.

Solar cells having long and narrow aspect ratios and areas less than that of a standard 156 mm×156 mm solar cell, as illustrated, may be advantageously employed to reduce $I^2R$ resistive power losses in the solar cell modules disclosed in this specification. In particular, the reduced area of solar cells 10 compared to standard size silicon solar cells decreases the current produced in the solar cell, directly reducing resistive power loss in the solar cell and in a series connected string of such solar cells. In addition, arranging such rectangular solar cells in a super cell 100 so that current flows through the super cell parallel to the short sides of the solar cells may reduce the distance that the current must flow through the semiconductor material to reach fingers 20 in the front surface metallization pattern and reduce the required length of the fingers, which may also reduce resistive power loss.

As noted above, bonding overlapped solar cells 10 to each other in their overlapping region to electrically connect the solar cells in series reduces the length of the electrical connection between adjacent solar cells, compared to conventionally tabbed series-connected strings of solar cells. This also reduces resistive power loss.

Figure 2H:
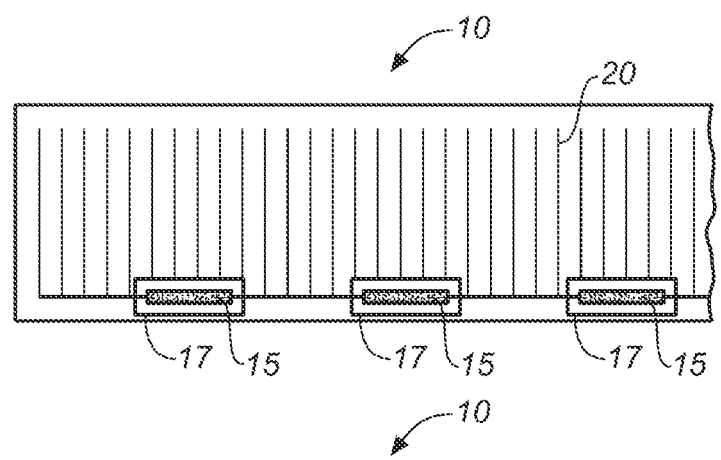
FIG. 2H shows a diagram of the front (sun side) surface and front surface metallization pattern of another example rectangular solar cell that may be used to form shingled super cells. The front surface metallization pattern comprises discrete contact pads each of which is surrounded by a barrier configured to prevent uncured conductive adhesive bonding material deposited on its contact pad from flowing away from the contact pad.
Figure 2I:
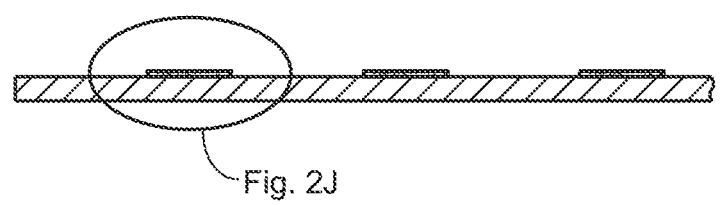
FIG. 2I shows a cross-sectional view of the solar cell of FIG. 2H and identifies detail of the front surface metallization pattern shown in expanded view in FIGS. 2J and 2K that includes a contact pad and portions of a barrier surrounding the contact pad.
Figure 2J:
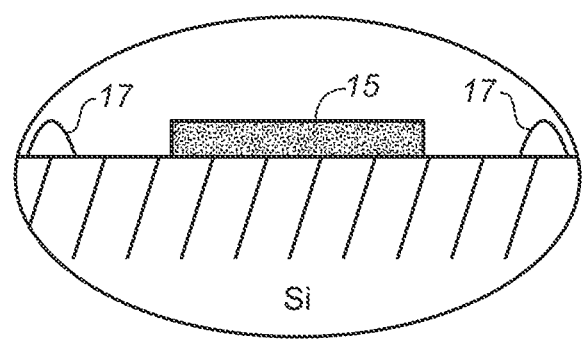
FIG. 2J shows an expanded view of detail from FIG. 2I.
Figure 2K:
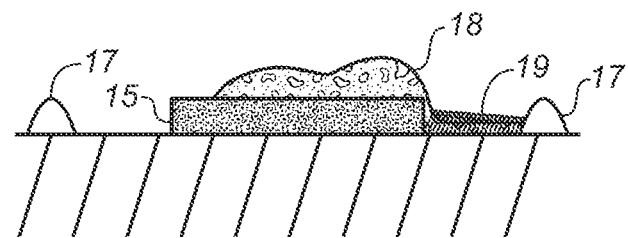
FIG. 2K shows an expanded view of detail from FIG. 2I with uncured conductive adhesive bonding material substantially confined to the location of the discrete contact pad by the barrier.

Referring again to FIG. 2A, in the illustrated example the front surface metallization pattern on solar cell 10 comprises an optional bypass conductor 40 running parallel to and spaced apart from bus bar 15. (Such a bypass conductor may also optionally be used in the metallization patterns shown in FIGS. 2B-2C, 3B, and 3D, and is also shown in FIG. 2Q in combination with discrete contact pads 15 rather than a continuous bus bar). Bypass conductor 40 interconnects fingers 20 to electrically bypass cracks that may form between bus bar 15 and bypass conductor 40. Such cracks, which may sever fingers 20 at locations near to bus bar 15, may otherwise isolate regions of solar cell 10 from bus bar 15. The bypass conductor provides an alternative electrical path between such severed fingers and the bus bar. The illustrated example shows a bypass conductor 40 positioned parallel to bus bar 15, extending about the full length of the bus bar, and interconnecting every finger 20. This arrangement may be preferred but is not required. If present, the bypass conductor need not run parallel to the bus bar and need not extend the full length of the bus bar. Further, a bypass conductor interconnects at least two fingers, but need not interconnect all fingers. Two or more short bypass conductors may be used in place of a longer bypass conductor, for example. Any suitable arrangement of bypass conductors may be used. The use of such bypass conductors is described in greater detail in U.S. patent application Ser. No. 13/371,790, titled "Solar Cell With Metallization Compensating For Or Preventing Cracking," and filed Feb. 13, 2012, which is incorporated herein by reference in its entirety.

The example front surface metallization pattern of FIG. 2A also includes an optional end conductor 42 that interconnects fingers 20 at their far ends, opposite from bus bar 15. (Such an end conductor may also optionally be used in the metallization patterns shown in FIGS. 2B-2C, 3B, and 3D, and 2Q). The width of conductor 42 may be about the same as that of a finger 20, for example. Conductor 42 interconnects fingers 20 to electrically bypass cracks that may form between bypass conductor 40 and conductor 42, and thereby provides a current path to bus bar 15 for regions of solar cell 10 that might otherwise be electrically isolated by such cracks.

Although some of the illustrated examples show a front bus bar 15 extending substantially the length of the long sides of solar cell 10 with uniform width, this is not required. For example, as alluded to above front bus bar 15 may be replaced by two or more front surface discrete contact pads 15 which may be arranged, for example, in line with each other along a side of solar cell 10 as shown in FIGS. 2H, 2Q, and 3B for example. Such discrete contact pads may optionally be interconnected by thinner conductors running between them, as shown for example in the figures just mentioned. In such variations, the width of the contact pads measured perpendicularly to the long side of the solar cell may be for example about 2 to about 20 times that of the thin conductors interconnecting the contact pads. There may be a separate (e.g., small) contact pad for each finger in the front surface metallization pattern, or each contact pad may be connected to two or more fingers. Front surface contact pads 15 may be square or have a rectangular shape elongated parallel to the edge of the solar cell, for example. Front surface contact pads 15 may have widths perpendicular to the long side of the solar cell of about 1 mm to about 1.5 mm, for example, and lengths parallel to the long side of the solar cell of about 1 mm to about 10 mm for example. The spacing between contact pads 15 measured parallel to the long side of the solar cell may be about 3 mm to about 30 mm, for example.

Alternatively, solar cell 10 may lack both a front bus bar 15 and discrete front contact pads 15 and include only fingers 20 in the front surface metallization pattern. In such variations, the current-collecting functions that would otherwise be performed by a front bus bar 15 or contact pads 15 may instead be performed, or partially performed, by the conductive material used to bond two solar cells 10 to each other in the overlapping configuration described above.

Solar cells lacking both a bus bar 15 and contact pads 15 may either include bypass conductor 40, or not include bypass conductor 40. If bus bar 15 and contact pads 15 are absent, bypass conductor 40 may be arranged to bypass cracks that form between the bypass conductor and the portion of the front surface metallization pattern that is conductively bonded to the overlapping solar cell.

The front surface metallization patterns, including bus bar or discrete contact pads 15, fingers 20, bypass conductor 40 (if present), and end conductor 42 (if present) may be formed, for example, from silver paste conventionally used for such purposes and deposited, for example, by conventional screen printing methods. Alternatively, the front surface metallization patterns may be formed from electroplated copper. Any other suitable materials and processes may be also used. In variations in which the front surface metallization pattern is formed from silver, the use of discrete front surface contact pads 15 rather than a continuous bus bar 15 along the edge of the cell reduces the amount of silver on the solar cell, which may advantageously reduce cost. In variations in which the front surface metallization pattern is formed from copper or from another conductor less expensive than silver, a continuous bus 15 may be employed without a cost disadvantage.

FIGS. 2D-2G, 3C, and 3E show example rear surface metallization patterns for a solar cell. In these examples the rear surface metallization patterns include discrete rear surface contact pads 25 arranged along one of the long edges of the rear surface of the solar cell and a metal contact 30 covering substantially all of the remaining rear surface of the solar cell. In a shingled super cell, contact pads 25 are bonded for example to a bus bar or to discrete contact pads arranged along the edge of the upper surface of an adjacent overlapping solar cell to electrically connect the two solar cells in series. For example, each discrete rear surface contact pad 25 may be aligned with and bonded to a corresponding discrete front surface contact pad 15 on the front surface of the overlapping solar cell by electrically conductive bonding material applied only to the discrete contact pads. Discrete contact pads 25 may be square (FIG. 2D) or have a rectangular shape elongated parallel to the edge of the solar cell (FIGS. 2E-2G, 3C, 3E), for example. Contact pads 25 may have widths perpendicular to the long side of the solar cell of about 1 mm to about 5 mm, for example, and lengths parallel to the long side of the solar cell of about 1 mm to about 10 mm for example. The spacing between contact pads 25 measured parallel to the long side of the solar cell may be about 3 mm to about 30 mm, for example.

Contact 30 may be formed, for example, from aluminum and/or electroplated copper. Formation of an aluminum back contact 30 typically provides a back surface field that reduces back surface recombination in the solar cell and thereby improves solar cell efficiency. If contact 30 is formed from copper rather than aluminum, contact 30 may be used in combination with another passivation scheme (e.g., aluminum oxide) to similarly reduce back surface recombination. Discrete contact pads 25 may be formed, for example, from silver paste. The use of discrete silver contact pads 25 rather than a continuous silver contact pad along the edge of the cell reduces the amount of silver in the rear surface metallization pattern, which may advantageously reduce cost.

Further, if the solar cells rely on a back surface field provided by formation of an aluminum contact to reduce back surface recombination, the use of discrete silver contacts rather than a continuous silver contact may improve solar cell efficiency. This is because the silver rear surface contacts do not provide a back surface field and therefore tend to promote carrier recombination and produce dead (inactive) volumes in the solar cells above the silver contacts. In conventionally ribbon-tabbed solar cell strings those dead volumes are typically shaded by ribbons and/or bus bars on the front surface of the solar cell, and thus do not result in any extra loss of efficiency. In the solar cells and super cells disclosed herein, however, the volume of the solar cell above rear surface silver contact pads 25 is typically unshaded by any front surface metallization, and any dead volumes resulting from use of silver rear surface metallization reduce the efficiency of the cell. The use of discrete silver contact pads 25 rather than a continuous silver contact pad along the edge of the rear surface of the solar cell thus reduces the volume of any corresponding dead zones and increases the efficiency of the solar cell.

Figure 2L:
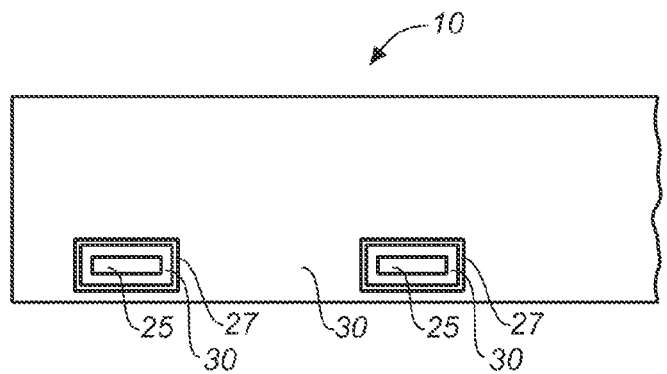
FIG. 2L shows a diagram of the rear surface and an example rear surface metallization pattern for the solar cell of FIG. 2H. The rear surface metallization pattern comprises discrete contact pads each of which is surrounded by a barrier configured to prevent uncured conductive adhesive bonding material deposited on its contact pad from flowing away from the contact pad.
Figure 2M:
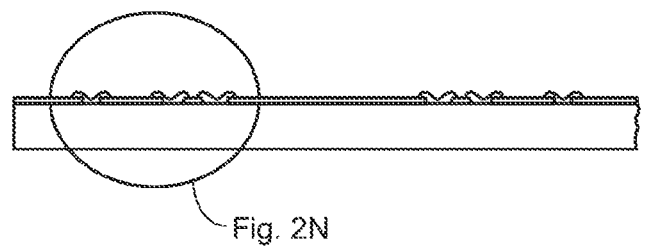
FIG. 2M shows a cross-sectional view of the solar cell of FIG. 2L and identifies detail of the rear surface metallization pattern shown in expanded view in FIG. 2N that includes a contact pad and portions of a barrier surrounding the contact pad.
Figure 2N:
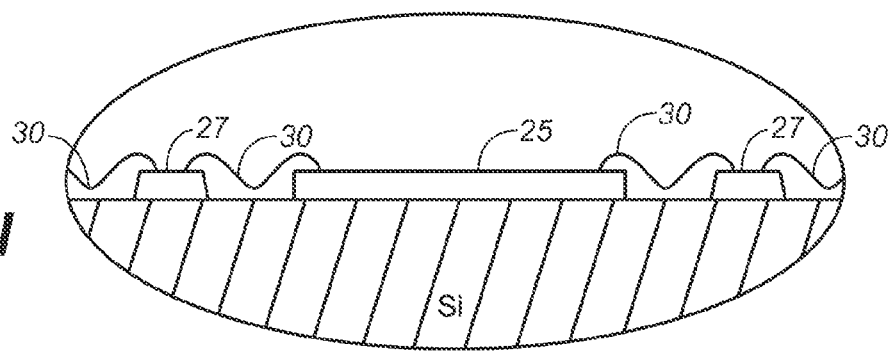
FIG. 2N shows an expanded view of detail from FIG. 2M.
Figure 2O:
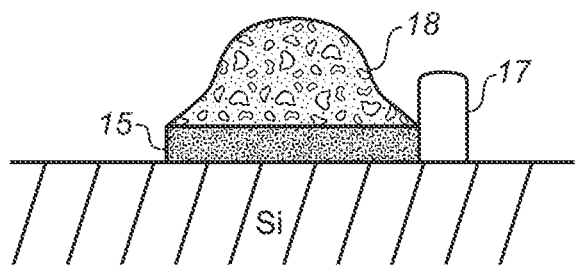
FIG. 2O shows another variation of a metallization pattern comprising a barrier configured to prevent uncured conductive adhesive bonding material from flowing away from a contact pad. The barrier abuts one side of the contact pad and is taller than the contact pad.
Figure 2P:
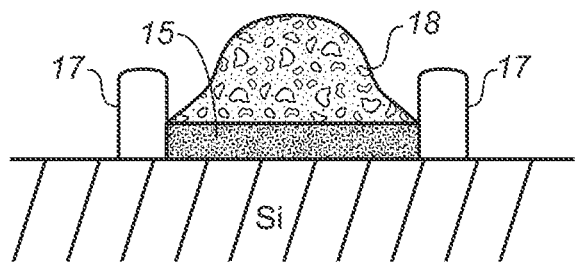
FIG. 2P shows another variation of the metallization pattern of FIG. 2O, with the barrier abutting at least two sides of the contact pad
Figure 2Q:
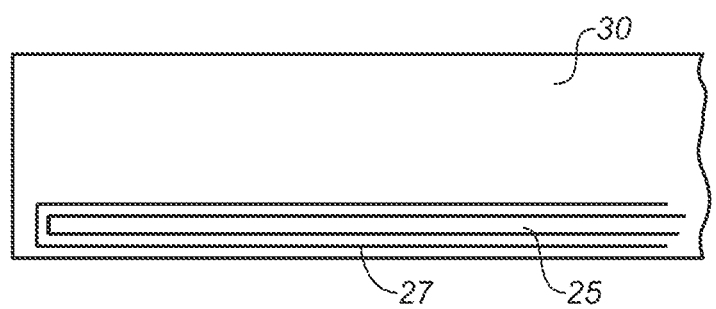
FIG. 2Q shows a diagram of the rear surface and an example rear surface metallization pattern for another example rectangular solar cell. The rear surface metallization pattern comprises a continuous contact pad running substantially the length of a long side of the solar cell along an edge of the solar cell. The contact pad is surrounded by a barrier configured to prevent uncured conductive adhesive bonding material deposited on the contact pad from flowing away from the contact pad.
Figure 2R:
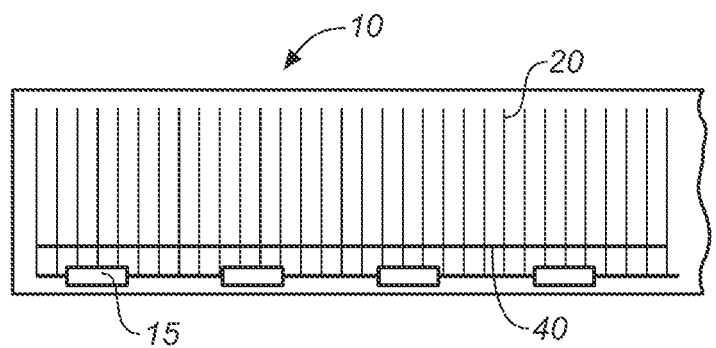
FIG. 2R shows a diagram of the front (sun side) surface and front surface metallization pattern of another example rectangular solar cell that may be used to form shingled super cells. The front surface metallization pattern comprises discrete contact pads arranged in a row along an edge of the solar cell and a long thin conductor running parallel to and inboard from the row of contact pads. The long thin conductor forms a barrier configured to prevent uncured conductive adhesive bonding material deposited on its contact pads from flowing away from the contact pads and onto active areas of the solar cell.

In variations not relying on a back surface field to reduce back surface recombination, the rear surface metallization pattern may employ a continuous bus bar 25 extending the length of the solar cell rather than discrete contact pads 25, as shown for example in FIG. 2R. Such a bus bar 25 may be formed for example, from tin or silver.

Other variations of the rear surface metallization patterns may employ discrete tin contact pads 25. Variations of the rear surface metallization patterns may employ finger contacts similar to those shown in the front surface metallization patterns of FIGS. 2A-2C and may lack contact pads and a bus bar.

Although the particular example solar cells shown in the figures are described as having particular combinations of front and rear surface metallization patterns, more generally any suitable combination of front and rear surface metallization patterns may be used. For example, one suitable combination may employ a silver front surface metallization pattern comprising discrete contact pads 15, fingers 20, and an optional bypass conductor 40, and a rear surface metallization pattern comprising an aluminum contact 30 and discrete silver contact pads 25. Another suitable combination may employ a copper front surface metallization pattern comprising a continuous bus bar 15, fingers 20, and an optional bypass conductor 40, and a rear surface metallization pattern comprising a continuous bus bar 25 and a copper contact 30.

In the super cell manufacturing process (described in more detail below) the electrically conductive bonding material used to bond adjacent overlapping solar cells in a super cell may be dispensed only onto (discrete or continuous) contact pads at the edge of the front or rear surface of the solar cell, and not onto the surrounding portions of the solar cell. This reduces use of material and, as described above, may reduce or accommodate stress arising from CTE mismatch between the electrically conductive bonding material and the solar cell. However, during or after deposition and prior to curing, portions of the electrically conductive bonding material may tend to spread beyond the contact pads and onto surrounding portions of the solar cell. For example, a binding resin portion of the electrically conductive bonding material may be drawn off of a contact pad onto textured or porous adjacent portions of the solar cell surface by capillary forces. In addition, during the deposition process some of the conductive bonding material may miss the contact pad and instead be deposited on adjacent portions of the solar cell surface, and possibly spread from there. This spreading and/or inaccurate deposition of the conductive bonding material may weaken the bond between the overlapping solar cells and may damage the portions of the solar cell onto which the conductive bonding material has spread or been mistakenly deposited. Such spreading of the electrically conductive bonding material may be reduced or prevented, for example, with a metallization pattern that forms a dam or barrier near or around each contact pad to retain the electrically conductive bonding material substantially in place.

As shown in FIGS. 2H-2K, for example, the front surface metallization pattern may comprise discrete contact pads 15, fingers 20, and barriers 17, with each barrier 17 surrounding a corresponding contact pad 15 and acting as a dam to form a moat between the contact pad and the barrier. Portions 19 of uncured conductive adhesive bonding material 18 that flow off of the contact pads, or that miss the contact pads when dispensed onto the solar cell, may be confined by barriers 17 to the moats. This prevents the conductive adhesive bonding material from spreading further from the contact pads onto surrounding portions of the cell. Barriers 17 may be formed from the same material as fingers 20 and contact pads 15 (e.g., silver), for example, may have heights of about 10 microns to about 40 microns, for example, and may have widths of about 30 microns to about 100 microns, for example. The moat formed between a barrier 17 and a contact pad 15 may have a width of about 100 microns to about 2 mm, for example. Although the illustrated examples comprise only a single barrier 17 around each front contact pad 15, in other variations two or more such barriers may be positioned concentrically, for example, around each contact pad. A front surface contact pad and its one or more surrounding barriers may form a shape similar to a "bulls-eye" target, for example. As shown in FIG. 2H, for example, barriers 17 may interconnect with fingers 20 and with the thin conductors interconnecting contact pads 15.

Similarly, as shown in FIGS. 2L-2N, for example, the rear surface metallization pattern may comprise (e.g., silver) discrete rear contact pads 25, (e.g., aluminum) contact 30 covering substantially all of the remaining rear surface of the solar cell, and (e.g., silver) barriers 27, with each barrier 27 surrounding a corresponding rear contact pad 25 and acting as a dam to form a moat between the contact pad and the barrier. A portion of contact 30 may fill the moat, as illustrated. Portions of uncured conductive adhesive bonding material that flow off of contact pads 25, or that miss the contact pads when dispensed onto the solar cell, may be confined by barriers 27 to the moats. This prevents the conductive adhesive bonding material from spreading further from the contact pads onto surrounding portions of the cell. Barriers 27 may have heights of about 10 microns to about 40 microns, for example, and may have widths of about 50 microns to about 500 microns, for example. The moat formed between a barrier 27 and a contact pad 25 may have a width of about 100 microns to about 2 mm, for example. Although the illustrated examples comprise only a single barrier 27 around each rear surface contact pad 25, in other variations two or more such barriers may be positioned concentrically, for example, around each contact pad. A rear surface contact pad and its one or more surrounding barriers may form a shape similar to a "bulls-eye" target, for example.

A continuous bus bar or contact pad running substantially the length of the edge of a solar cell may also be surrounded by a barrier that prevents spreading of the conductive adhesive bonding material. For example, FIG. 2Q shows such a barrier 27 surrounding a rear surface bus bar 25. A front surface bus bar (e.g., bus bar 15 in FIG. 2A) may be similarly surrounded by a barrier. Similarly, a row of front or rear surface contact pads may be surrounded as a group by such a barrier, rather than individually surrounded by separate barriers.

Rather than surrounding a bus bar or one or more contact pads as just described, a feature of the front or rear surface metallization pattern may form a barrier running substantially the length of the solar cell parallel to the overlapped edge of the solar cell, with the bus bar or contact pads positioned between the barrier and the edge of the solar cell. Such a barrier may do double duty as a bypass conductor (described above). For example, in FIG. 2R bypass conductor 40 provides a barrier that tends to prevent uncured conductive adhesive bonding material on contact pads 15 from spreading onto the active area of the front surface of the solar cell. A similar arrangement may be used for rear surface metallization patterns.

Barriers to the spread of conductive adhesive bonding material may be spaced apart from contact pads or bus bars to form a moat as just described, but this is not required. Such barriers may instead abut a contact pad or bus bar, as shown in FIG. 2O or 2P for example. In such variations the barrier is preferably taller than the contact pad or bus bar, to retain the uncured conductive adhesive bonding material on the contact pad or bus bar. Although FIGS. 2O and 2P show portions of a front surface metallization pattern, similar arrangements may be used for rear surface metallization patterns.

Barriers to the spread of conductive adhesive bonding material and/or moats between such barriers and contact pads or bus bars, and any conductive adhesive bonding material that has spread into such moats, may optionally lie within the region of the solar cell surface overlapped by the adjacent solar cell in the super cell, and thus be hidden from view and shielded from exposure to solar radiation.

Alternatively or in addition to the use of barriers as just described, the electrically conductive bonding material may be deposited using a mask or by any other suitable method (e.g., screen printing) allowing accurate deposition and thus requiring reduced amounts of electrically conductive bonding material that are less likely to spread beyond the contact pads or miss the contact pads during deposition.

More generally, solar cells 10 may employ any suitable front and rear surface metallization patterns.

Figure 4A:
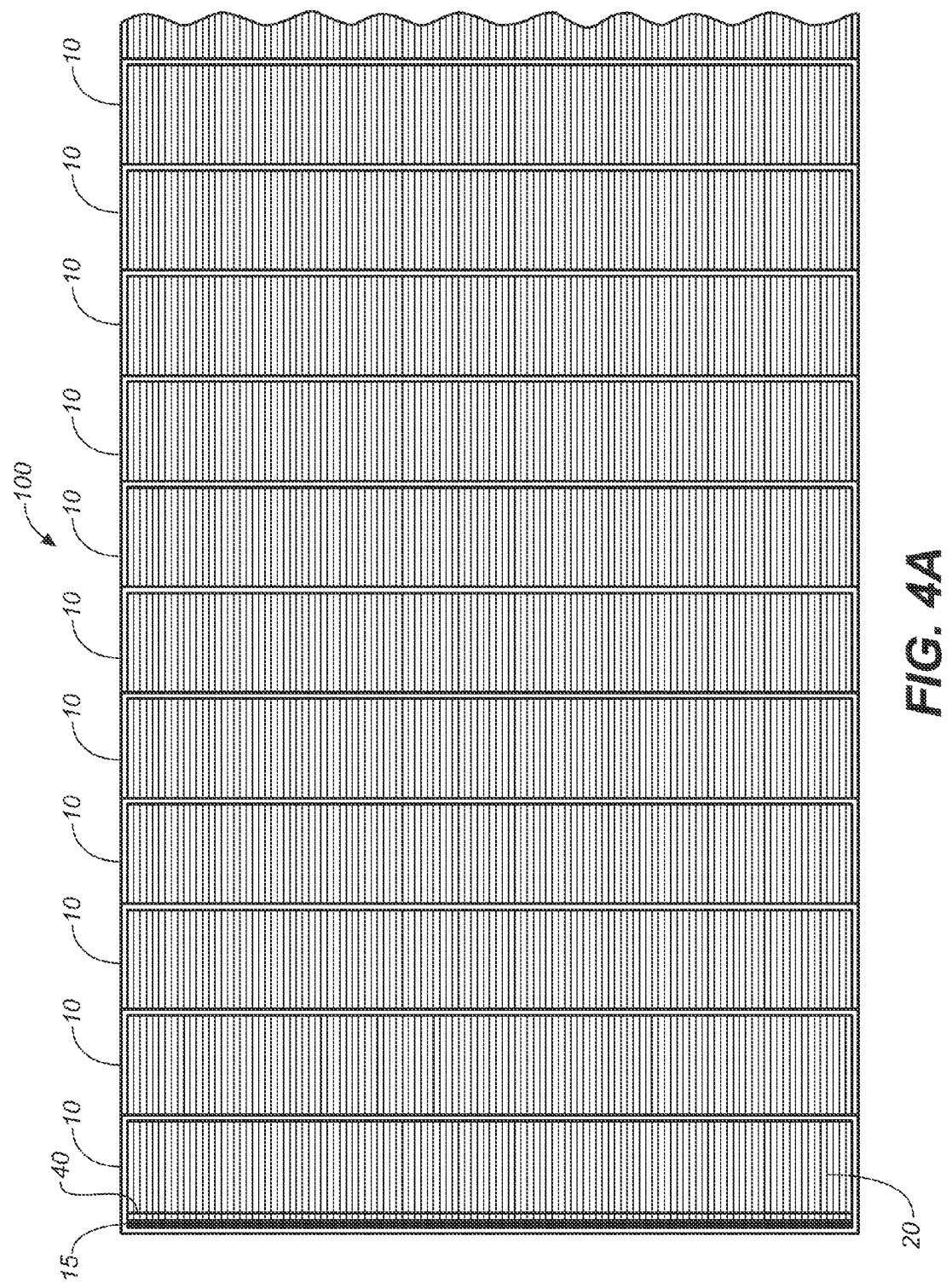
FIG. 4A shows a fragmentary view of the front surface of an example rectangular super cell comprising rectangular solar cells as shown for example in FIG. 2A arranged in a shingled manner as shown in FIG. 1.
Figure 4B:
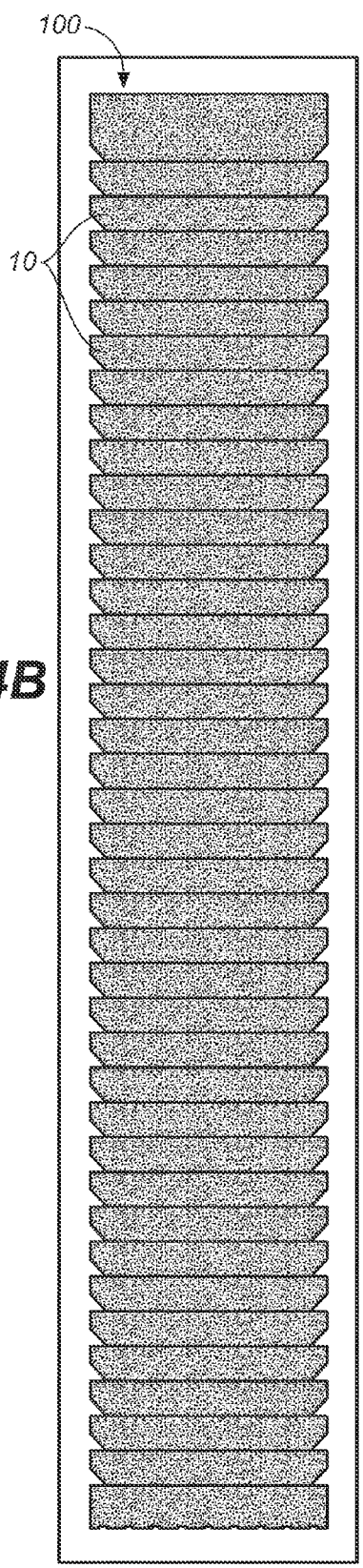
FIGS. 4B and 4C show front and rear views, respectively, of an example rectangular super cell comprising "chevron" rectangular solar cells having chamfered corners, as shown for example in FIG. 2B, arranged in a shingled manner as shown in FIG. 1.
Figure 4C:
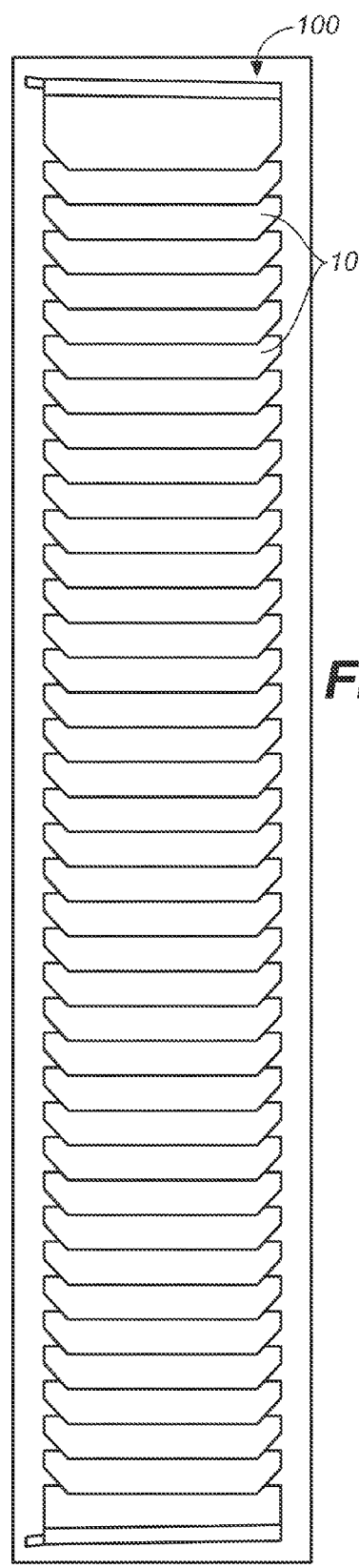

FIG. 4A shows a portion of the front surface of an example rectangular super cell 100 comprising solar cells 10 as shown in FIG. 2A arranged in a shingled manner as shown in FIG. 1. As a result of the shingling geometry, there is no physical gap between pairs of solar cells 10. In addition, although bus bar 15 of the solar cell 10 at one end of super cell 100 is visible, the bus bars (or front surface contact pads) of the other solar cells are hidden beneath overlapping portions of adjacent solar cells. As a consequence, super cell 100 efficiently uses the area it takes up in a solar module. In particular, a larger portion of that area is available to produce electricity than is the case for conventionally tabbed solar cell arrangements and solar cell arrangements including numerous visible bus bars on the illuminated surface of the solar cells. FIGS. 4B-4C show front and rear views, respectively, of another example super cell 100 comprising primarily chamfered chevron rectangular silicon solar cells but otherwise similar to that of FIG. 4A.

In the example illustrated in FIG. 4A, bypass conductors 40 are hidden by overlapping portions of adjacent cells. Alternatively, solar cells comprising bypass conductors 40 may be overlapped similarly to as shown in FIG. 4A without covering the bypass conductors.

The exposed front surface bus bar 15 at one end of super cell 100 and the rear surface metallization of the solar cell at the other end of super cell 100 provide negative and positive (terminal) end contacts for the super cell that may be used to electrically connect super cell 100 to other super cells and/or to other electrical components as desired.

Adjacent solar cells in super cell 100 may overlap by any suitable amount, for example by about 1 millimeter (mm) to about 5 mm.

As shown in FIGS. 5A-5G, for example, shingled super cells as just described may efficiently fill the area of a solar module. Such solar modules may be square or rectangular, for example. Rectangular solar modules as illustrated in FIGS. 5A-5G may have shorts sides having a length, for example, of about 1 meter and long sides having a length, for example, of about 1.5 to about 2.0 meters. Any other suitable shapes and dimensions for the solar modules may also be used. Any suitable arrangement of super cells in a solar module may be used.

In a square or rectangular solar module, the super cells are typically arranged in rows parallel to the short or long sides of the solar module. Each row may include one, two, or more super cells arranged end-to-end. A super cell 100 forming part of such a solar module may include any suitable number of solar cells 10 and be of any suitable length. In some variations super cells 100 each have a length approximately equal to the length of the short sides of a rectangular solar module of which they are a part. In other variations super cells 100 each have a length approximately equal to one half the length of the short sides of a rectangular solar module of which they are a part. In other variations super cells 100 each have a length approximately equal to the length of the long sides of a rectangular solar module of which they are a part. In other variations super cells 100 each have a length approximately equal to one half the length of the long sides of a rectangular solar module of which they are a part. The number of solar cells required to make super cells of these lengths depends of course on the dimensions of the solar module, the dimensions of the solar cells, and the amount by which adjacent solar cells overlap. Any other suitable lengths for super cells may also be used.

In variations in which a super cell 100 has a length approximately equal to the length of the short sides of a rectangular solar module, the super cell may include, for example, 56 rectangular solar cells having dimensions of about 19.5 millimeters (mm) by about 156 mm, with adjacent solar cells overlapped by about 3 mm. Eight such rectangular solar cells may be separated from a conventional square or pseudo square 156 mm wafer. Alternatively such a super cell may include, for example, 38 rectangular solar cells having dimensions of about 26 mm by about 156 mm, with adjacent solar cells overlapped by about 2 mm. Six such rectangular solar cells may be separated from a conventional square or pseudo square 156 mm wafer. In variations in which a super cell 100 has a length approximately equal to half the length of the short sides of a rectangular solar module, the super cell may include, for example, 28 rectangular solar cells having dimensions of about 19.5 millimeters (mm) by about 156 mm, with adjacent solar cells overlapped by about 3 mm. Alternatively, such a super cell may include, for example, 19 rectangular solar cells having dimensions of about 26 mm by about 156 mm, with adjacent solar cells overlapped by about 2 mm.

In variations in which a super cell 100 has a length approximately equal to the length of the long sides of a rectangular solar module, the super cell may include, for example, 72 rectangular solar cells having dimensions of about 26 mm by about 156 mm, with adjacent solar cells overlapped by about 2 mm. In variations in which a super cell 100 has a length approximately equal to one half the length of the long sides of a rectangular solar module, the super cell may include, for example, 36 rectangular solar cells having dimensions of about 26 mm by about 156 mm, with adjacent solar cells overlapped by about 2 mm.

Figure 5B:
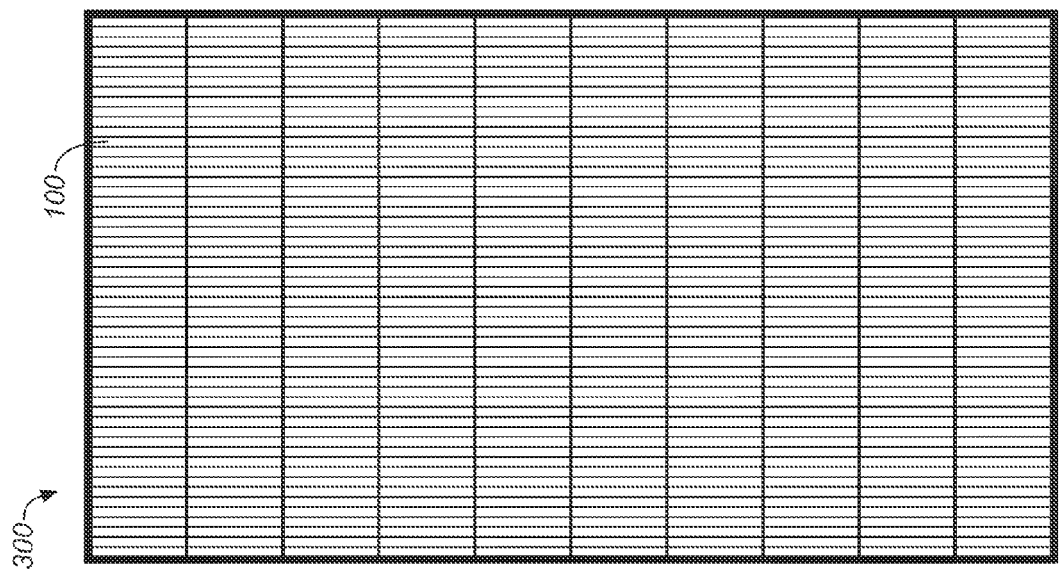
FIG. 5B shows a diagram of another example rectangular solar module comprising a plurality of rectangular shingled super cells, with the long side of each super cell having a length of approximately the length of the short sides of the module. The super cells are arranged with their long sides parallel to the short sides of the module.
Figure 5A:
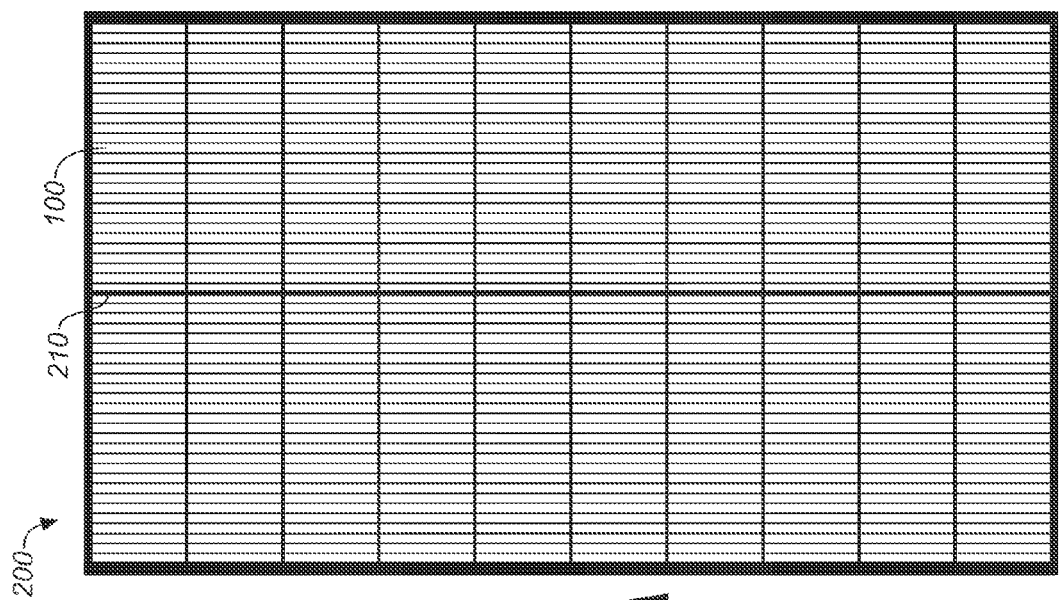
FIG. 5A shows a diagram of an example rectangular solar module comprising a plurality of rectangular shingled super cells, with the long side of each super cell having a length of approximately half the length of the short sides of the module. Pairs of the super cells are arranged end-to-end to form rows with the long sides of the super cells parallel to the short sides of the module.

FIG. 5A shows an example rectangular solar module 200 comprising twenty rectangular super cells 100, each of which has a length approximately equal to one half the length of the short sides of the solar module. The super cells are arranged end-to-end in pairs to form ten rows of super cells, with the rows and the long sides of the super cells oriented parallel to the short sides of the solar module. In other variations, each row of super cells may include three or more super cells. Also, a similarly configured solar module may include more or fewer rows of super cells than shown in this example. (FIG. 14A for example shows a solar module comprising twenty-four rectangular super cells arranged in twelve rows of two super cells each).

Gap 210 shown in FIG. 5A facilitates making electrical contact to front surface end contacts (e.g., exposed bus bars or discrete contacts 15) of super cells 100 along the center line of the solar module, in variations in which the super cells in each row are arranged so that at least one of them has a front surface end contact on the end of the super cell adjacent to the other super cell in the row. For example, the two super cells in a row may be arranged with one super cell having its front surface terminal contact along the center line of the solar module and the other super cell having its rear surface terminal contact along the center line of the solar module. In such an arrangement the two super cells in a row may be electrically connected in series by an interconnect arranged along the center line of the solar module and bonded to the front surface terminal contact of one super cell and to the rear surface terminal contact of the other super cell. (See e.g. FIG. 8C discussed below). In variations in which each row of super cells includes three or more super cells, additional gaps between super cells may be present and may similarly facilitate making electrical contact to front surface end contacts that are located away from the sides of the solar module.

FIG. 5B shows an example rectangular solar module 300 comprising ten rectangular super cells 100, each of which has a length approximately equal to the length of the short sides of the solar module. The super cells are arranged as ten parallel rows with their long sides oriented parallel to the short sides of the module. A similarly configured solar module may include more or fewer rows of such side-length super cells than shown in this example.

FIG. 5B also shows what solar module 200 of FIG. 5A looks like when there are no gaps between adjacent super cells in the rows of super cells in solar module 200. Gap 210 of FIG. 5A can be eliminated, for example, by arranging the super cells so that both super cells in each row have their back surface end contacts along the center line of the module. In this case the super cells may be arranged nearly abutting each other with little or no extra gap between them because no access to the front surface of the super cell is required along the center of the module. Alternatively, two super cells 100 in a row may be arranged with one having its front surface end contact along a side of the module and its rear surface end contact along the center line of the module, the other having its front surface end contact along the center line of the module and its rear surface end contact along the opposite side of the module, and the adjacent ends of the super cells overlapping. A flexible interconnect may be sandwiched between the overlapping ends of the super cells, without shading any portion of the front surface of the solar module, to provide an electrical connection to the front surface end contact of one of the super cells and the rear surface end contact of the other super cell. For rows containing three or more super cells these two approaches may be used in combination.

The super cells and rows of super cells shown in FIGS. 5A-5B may be interconnected by any suitable combination of series and parallel electrical connections, for example as described further below with respect to FIGS. 10A-15. The interconnections between super cells may be made, for example, using flexible interconnects similarly to as described below with respect to FIGS. 5C-5G and subsequent figures.

Figure 5D:
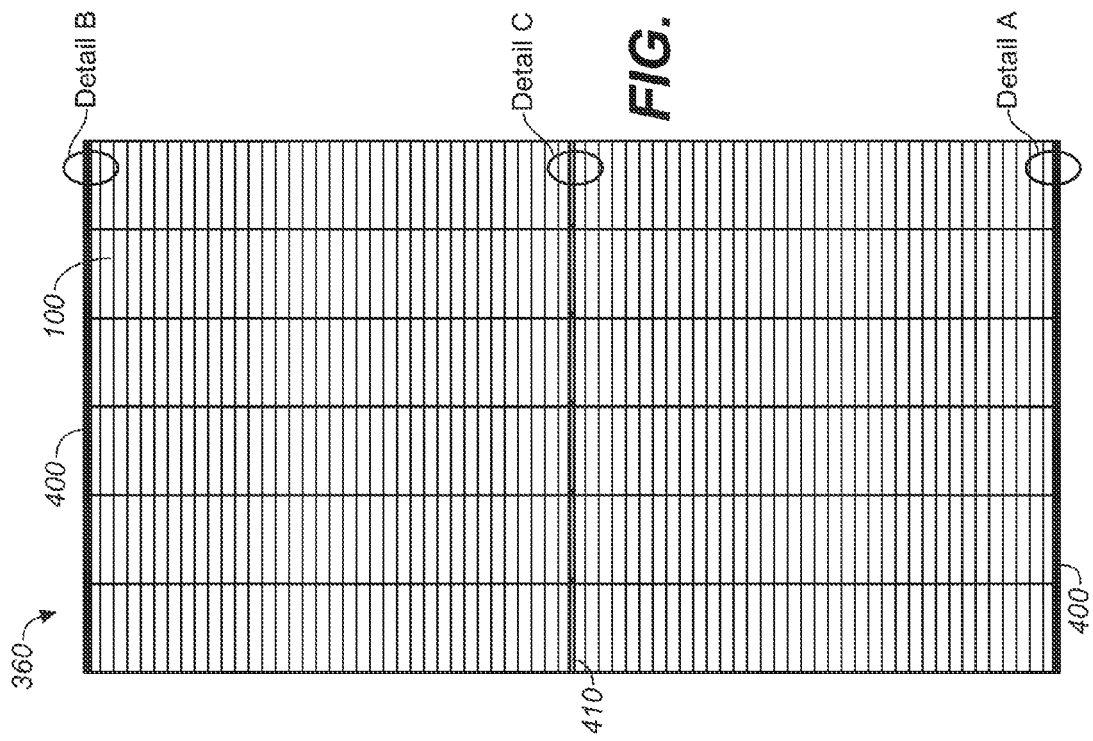
FIG. 5D shows a diagram of an example rectangular solar module comprising a plurality of rectangular shingled super cells, with the long side of each super cell having a length of approximately half the length of the long sides of the module. Pairs of the super cells are arranged end-to-end to form rows with the long sides of the super cells parallel to the long sides of the module.
Figure 5C:
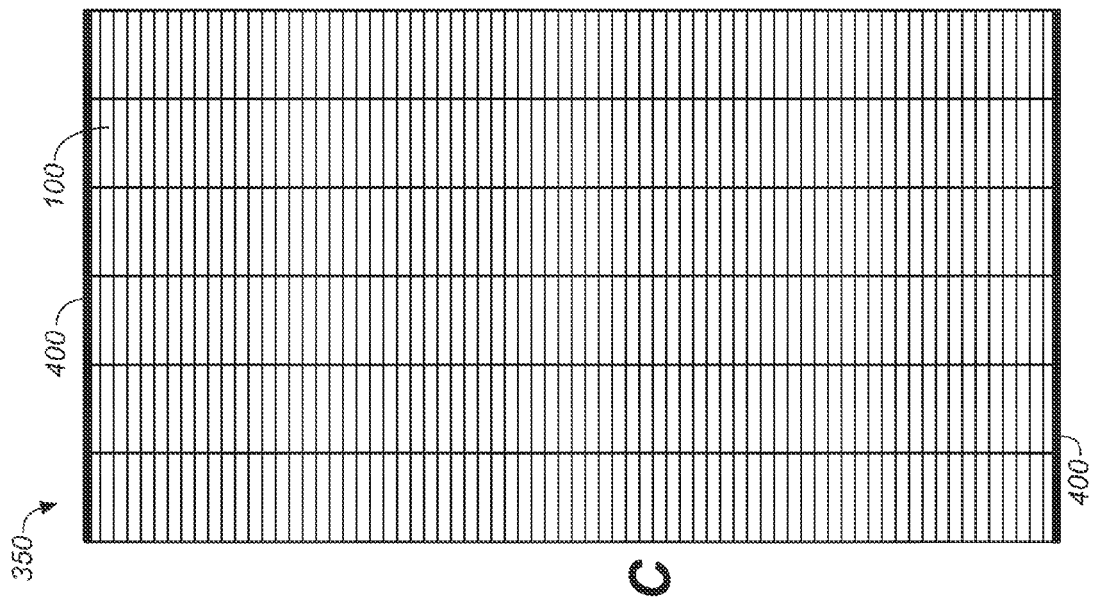
FIG. 5C shows a diagram of another example rectangular solar module comprising a plurality of rectangular shingled super cells, with the long side of each super cell having a length of approximately the length of the long side of the module. The super cells are arranged with their long sides parallel to the sides of the module.

FIG. 5C shows an example rectangular solar module 350 comprising six rectangular super cells 100, each of which has a length approximately equal to the length of the long sides of the solar module. The super cells are arranged as six parallel rows with their long sides oriented parallel to the long sides of the module. A similarly configured solar module may include more or fewer rows of such side-length super cells than shown in this example. Each super cell in this example (and in several of the following examples) comprises 72 rectangular solar cells each having a width approximately equal to ⅙ the width of a 156 mm square or pseudo square wafer. Any other suitable number of rectangular solar cells of any other suitable dimensions may also be used. In this example the front surface terminal contacts of the super cells are electrically connected to each other with flexible interconnects 400 positioned adjacent to and running parallel to the edge of one short side of the module. The rear surface terminal contacts of the super cells are similarly connected to each other by flexible interconnects positioned adjacent to and running parallel to the edge of the other short side, behind the solar module. The rear surface interconnects are hidden from view in FIG. 5C. This arrangement electrically connects the six module-length super cells in parallel. Details of the flexible interconnects and their arrangement in this and other solar module configurations are discussed in more detail below with respect to FIGS. 6-8G.

FIG. 5D shows an example rectangular solar module 360 comprising twelve rectangular super cells 100, each of which has a length approximately equal to one half the length of the long sides of the solar module. The super cells are arranged end-to-end in pairs to form six rows of super cells, with the rows and the long sides of the super cells oriented parallel to the long sides of the solar module. In other variations, each row of super cells may include three or more super cells. Also, a similarly configured solar module may include more or fewer rows of super cells than shown in this example. Each super cell in this example (and in several of the following examples) comprises 36 rectangular solar cells each having a width approximately equal to ⅙ the width of a 156 mm square or pseudo square wafer. Any other suitable number of rectangular solar cells of any other suitable dimensions may also be used. Gap 410 facilitates making electrical contact to front surface end contacts of super cells 100 along the center line of the solar module. In this example, flexible interconnects 400 positioned adjacent to and running parallel to the edge of one short side of the module electrically interconnect the front surface terminal contacts of six of the super cells. Similarly, flexible interconnects positioned adjacent to and running parallel to the edge of the other short side of the module behind the module electrically connect the rear surface terminal contacts of the other six super cells. Flexible interconnects (not shown in this figure) positioned along gap 410 interconnect each pair of super cells in a row in series and, optionally, extend laterally to interconnect adjacent rows in parallel. This arrangement electrically connects the six rows of super cells in parallel. Optionally, in a first group of super cells the first super cell in each row is electrically connected in parallel with the first super cell in each of the other rows, in a second group of super cells the second super cell is electrically connected in parallel with the second super cell in each of the other rows, and the two groups of super cells are electrically connect in series. The later arrangement allows each of the two groups of super cells to be individually put in parallel with a bypass diode.

Figure 8A:
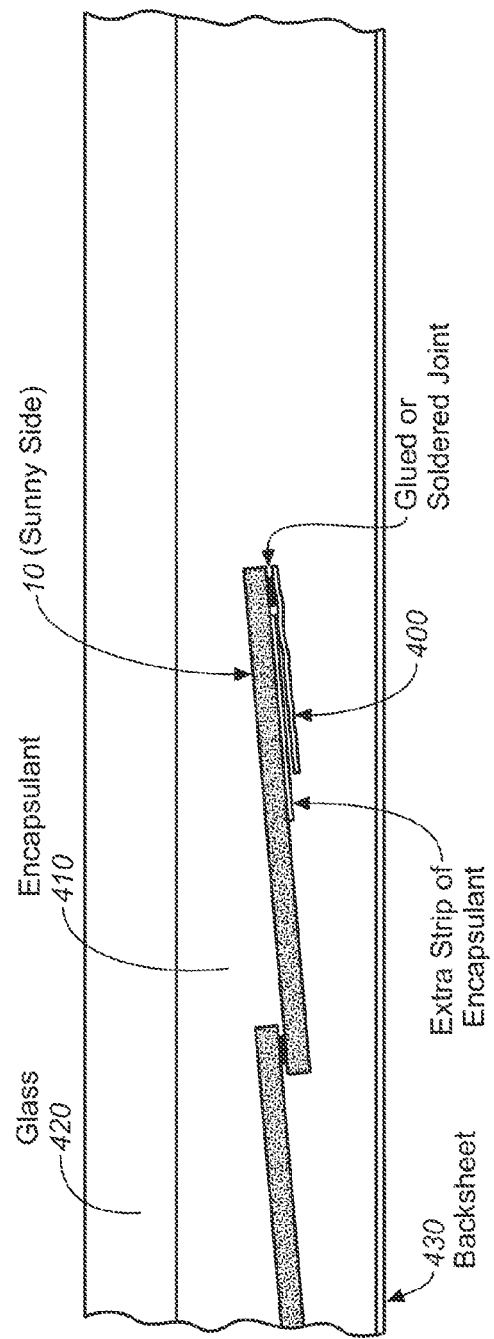
FIG. 8A shows Detail A from FIG. 5D: a cross-sectional view of the example solar module of FIG. 5D showing cross-sectional details of flexible electrical interconnects bonded to the rear surface terminal contacts of the rows of super cells.

Detail A in FIG. 5D identifies the location of a cross-sectional view shown in FIG. 8A of the interconnection of the rear surface terminal contacts of super cells along the edge of one short side of the module. Detail B similarly identifies the location of a cross-sectional view shown in FIG. 8B of the interconnection of the front surface terminal contacts of super cells along the edge of the other short side of the module. Detail C identifies the location of a cross-sectional view shown in FIG. 8C of series interconnection of the super cells within a row along gap 410.

FIG. 5E shows an example rectangular solar module configured similarly to that of FIG. 5C, except that in this example all of the solar cells from which the super cells are formed are chevron solar cells having chamfered corners corresponding to corners of pseudo-square wafers from which the solar cells were separated.

FIG. 5F shows another example rectangular solar module configured similarly to that of FIG. 5C, except that in this example the solar cells from which the super cells are formed comprise a mixture of chevron and rectangular solar cells arranged to reproduce the shapes of the pseudo-square wafers from which they were separated. In the example of FIG. 5F, the chevron solar cells may be wider perpendicular to their long axes than are the rectangular solar cells to compensate for the missing corners on the chevron cells, so that the chevron solar cells and the rectangular solar cells have the same active area exposed to solar radiation during operation of the module and therefore matched current.

Figure 5G:
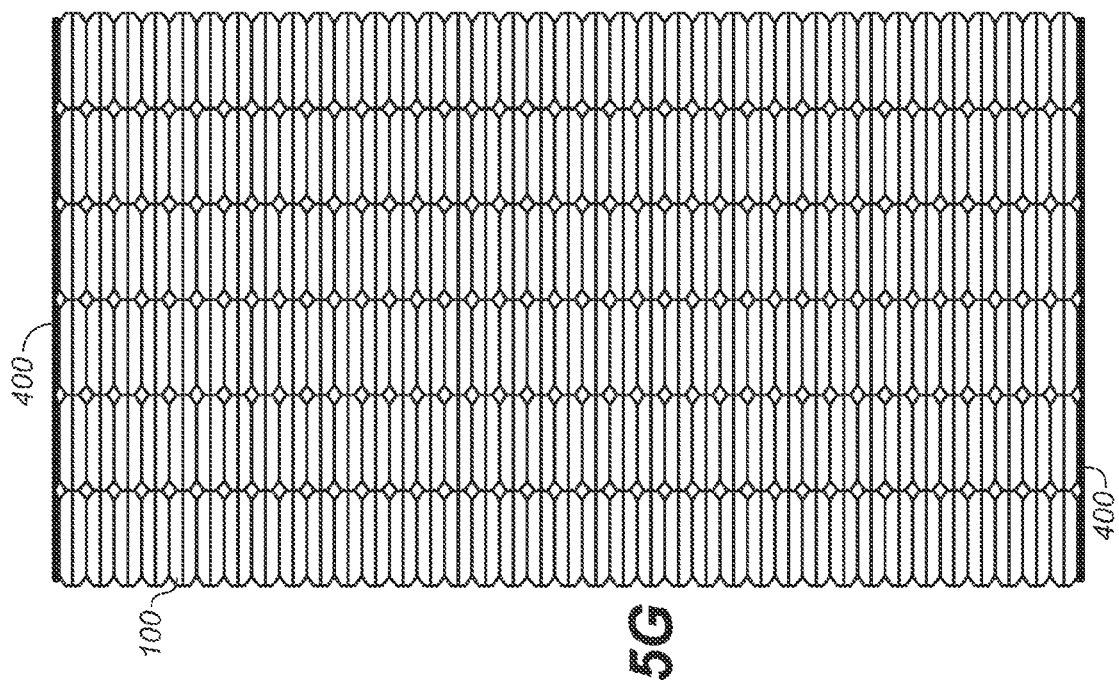
FIG. 5G shows a diagram of another example rectangular solar module similar in configuration to that of FIG. 5E, except that adjacent chevron solar cells in a super cell are arranged as mirror images of each other so that their overlapping edges are of the same length.

FIG. 5G shows another example rectangular solar module configured similarly to that of FIG. 5E (i.e., including only chevron solar cells) except that in the solar module of FIG. 5G adjacent chevron solar cells in a super cell are arranged as mirror images of each other so that their overlapping edges are of the same length. This maximizes the length of each overlapping joint, and thereby facilitates heat flow through the super cell.

Other configurations of rectangular solar modules may include one or more rows of super cells formed only from rectangular (non-chamfered) solar cells, and one or more rows of super cells formed only from chamfered solar cells. For example, a rectangular solar module may be configured similarly to that of FIG. 5C, except having the two outer rows of super cells each replaced by a row of super cells formed only from chamfered solar cells. The chamfered solar cells in those rows may be arranged in mirror image pairs as shown in FIG. 5G, for example.

In the example solar modules shown in FIGS. 5C-5G, the electric current along each row of super cells is about $\frac{1}{6}$ of that in a conventional solar module of the same area because the rectangular solar cells from which the super cells are formed has an active area of about $\frac{1}{6}$ that of a conventionally sized solar cell. Because in these examples the six rows of super cells are electrically connected in parallel, however, the example solar modules may generate a total electric current equal to that generated by a conventional solar module of the same area. This facilitates substation of the example solar modules of FIGS. 5C-5G (and other examples described below) for conventional solar modules.

Figure 6:
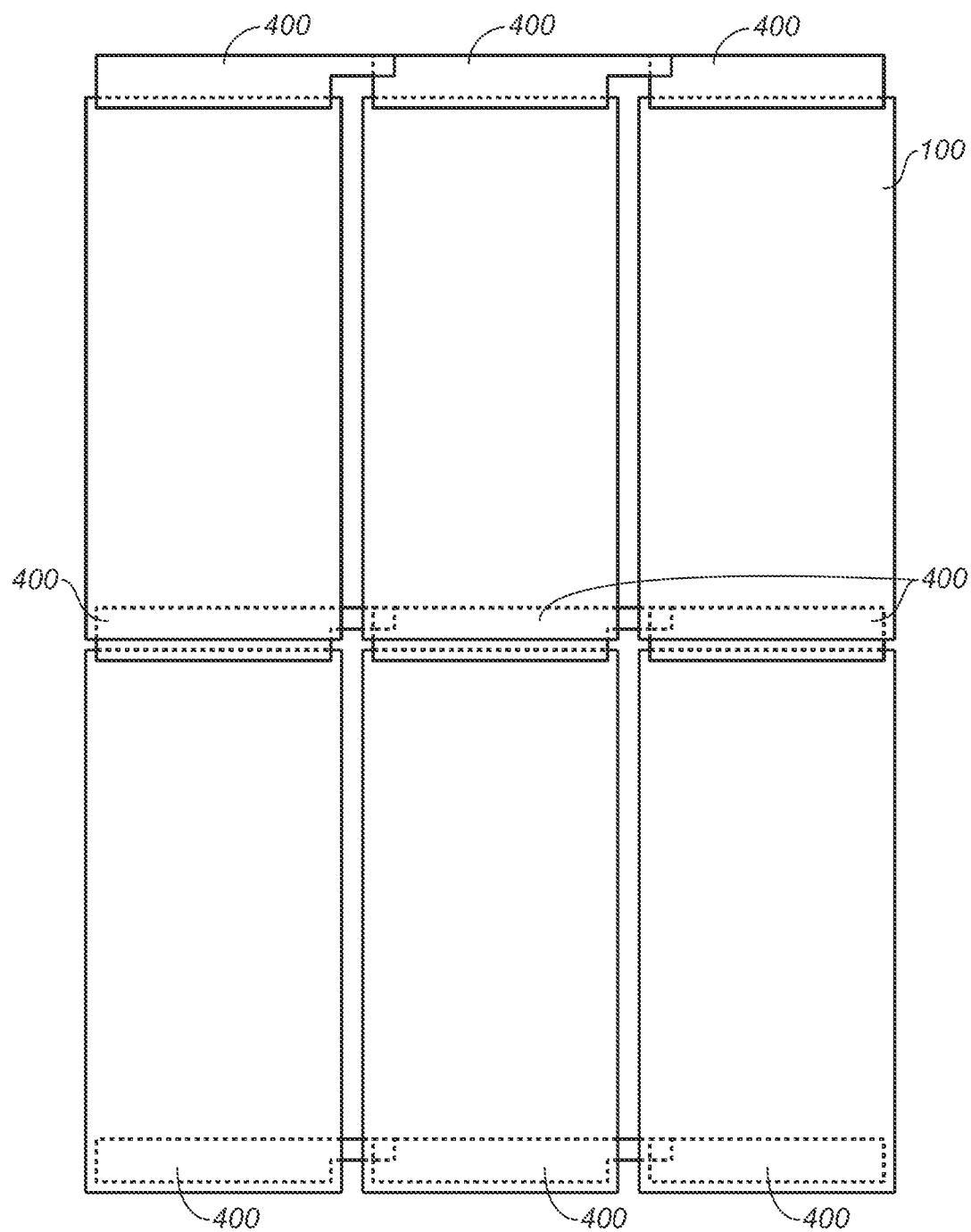
FIG. 6 shows an example arrangement of three rows of super cells interconnected with flexible electrical interconnects to put the super cells within each row in series with each other, and to put the rows in parallel with each other. These may be three rows in the solar module of FIG. 5D, for example.

FIG. 6 shows in more detail than FIGS. 5C-5G an example arrangement of three rows of super cells interconnected with flexible electrical interconnects to put the super cells within each row in series with each other, and to put the rows in parallel with each other. These may be three rows in the solar module of FIG. 5D, for example. In the example of FIG. 6, each super cell 100 has a flexible interconnect 400 conductively bonded to its front surface terminal contact, and another flexible interconnect conductively bonded to its rear surface terminal contact. The two super cells within each row are electrically connected in series by a shared flexible interconnect conductively bonded to the front surface terminal contact of one super cell and to the rear surface terminal contact of the other super cell. Each flexible interconnect is positioned adjacent to and runs parallel to an end of a super cell to which it is bonded, and may extend laterally beyond the super cell to be conductively bonded to a flexible interconnect on a super cell in an adjacent row, electrically connecting the adjacent rows in parallel. Dotted lines in FIG. 6 depict portions of the flexible interconnects that are hidden from view by overlying portions of the super cells, or portions of the super cells that are hidden from view by overlying portions of the flexible interconnects.

Flexible interconnects 400 may be conductively bonded to the super cells with, for example, a mechanically compliant electrically conductive bonding material as described above for use in bonding overlapped solar cells. Optionally, the electrically conductive bonding material may be located only at discrete positions along the edges of the super cell rather than in a continuous line extending substantially the length of the edge of the super cell, to reduce or accommodate stress parallel to the edges of the super cell arising from mismatch between the coefficient of thermal expansion of the electrically conductive bonding material or the interconnects and that of the super cell.

Flexible interconnects 400 may be formed from or comprise thin copper sheets, for example. Flexible interconnects 400 may be optionally patterned or otherwise configured to increase their mechanical compliance (flexibility) both perpendicular to and parallel to the edges of the super cells to reduce or accommodate stress perpendicular and parallel to the edges of the super cells arising from mismatch between the CTE of the interconnect and that of the super cells. Such patterning may include, for example, slits, slots, or holes. Conductive portions of interconnects 400 may have a thickness of, for example, less than about 100 microns, less than about 50 microns, less than about 30 microns, or less than about 25 microns to increase the flexibility of the interconnects. The mechanical compliance of the flexible interconnect, and its bonds to the super cells, should be sufficient for the interconnected super cells to survive stress arising from CTE mismatch during the lamination process described in more detail below with respect to methods of manufacturing shingled solar cell modules, and to survive stress arising from CTE mismatch during temperature cycling testing between about −40° C. and about 85° C.

Preferably, flexible interconnects 400 exhibit a resistance to current flow parallel to the ends of the super cells to which they are bonded of less than or equal to about 0.015 Ohms, less than or equal to about 0.012 Ohms, or less than or equal to about 0.01 Ohms.

FIG. 7 shows several example configurations, designated by reference numerals 400A-400T, that may be suitable for flexible interconnect 400.

Figure 8B:
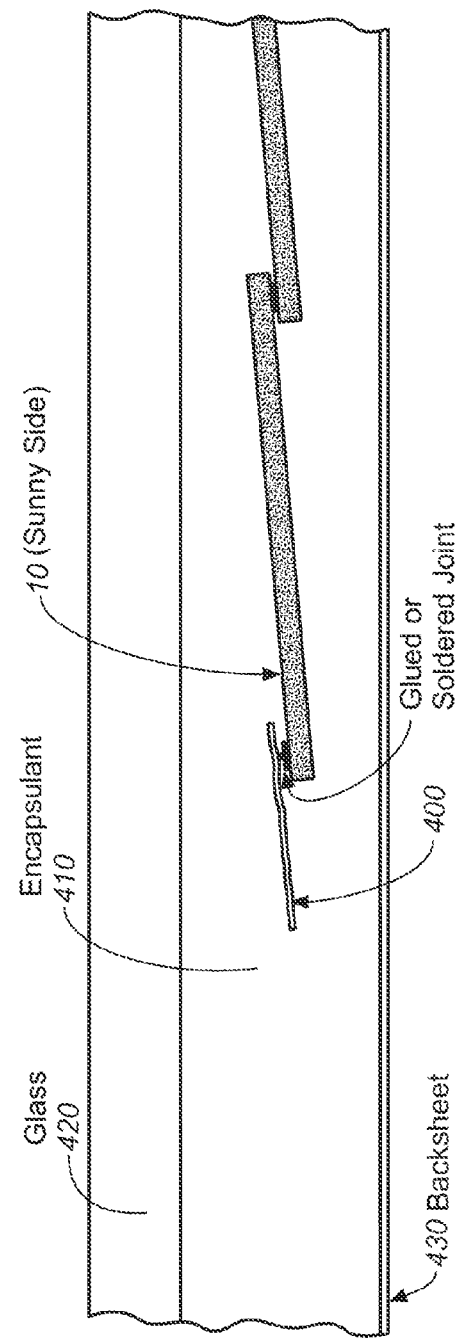
FIG. 8B shows Detail C from FIG. 5D: a cross-sectional view of the example solar module of FIG. 5D showing cross-sectional details of flexible electrical interconnects bonded to the front (sunny side) surface terminal contacts of the rows of super cells.
Figure 8C:
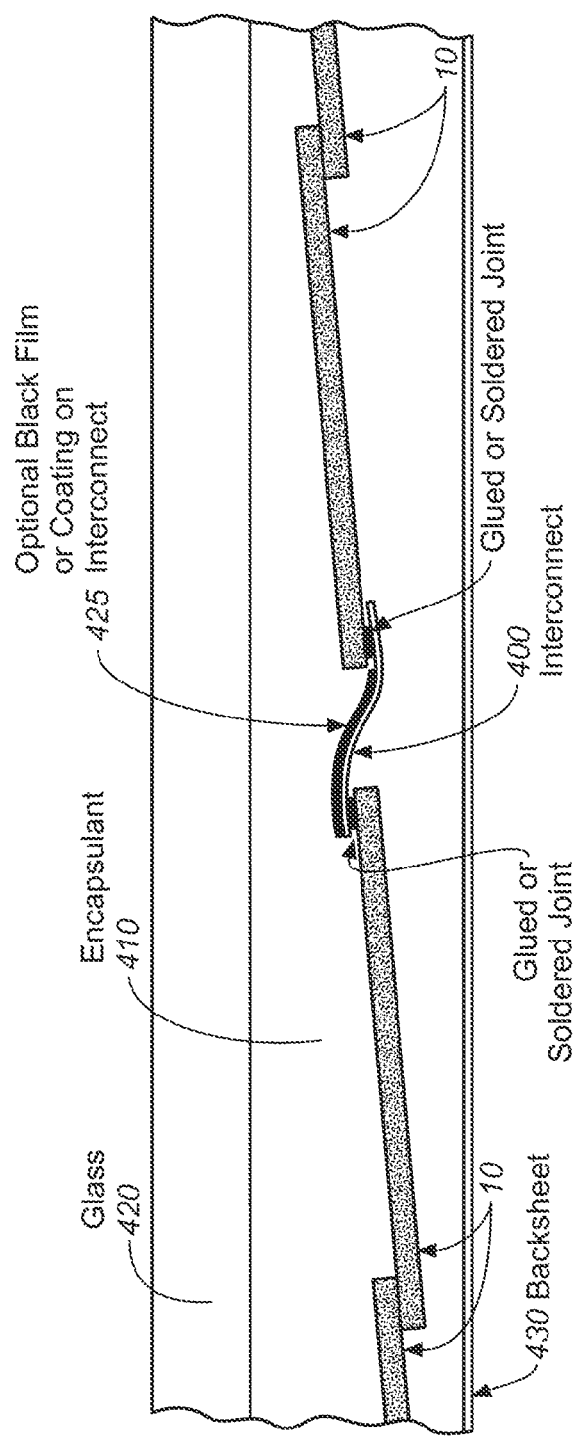
FIG. 8C shows Detail B from FIG. 5D: a cross-sectional view of the example solar module of FIG. 5D showing cross-sectional details of flexible interconnects arranged to interconnect two super cells in a row in series.

As shown in the cross-sectional views of FIGS. 8A-8C, for example, the solar modules described in this specification typically comprise a laminate structure with super cells and one or more encapsulant materials 410 sandwiched between a transparent front sheet 420 and a back sheet 430. The transparent front sheet may be glass, for example. Optionally, the back sheet may also be transparent, which may allow bifacial operation of the solar module. The back sheet may be a polymer sheet, for example. Alternatively, the solar module may be a glass-glass module with both the front and back sheets glass.

The cross-sectional view of FIG. 8A (detail A from FIG. 5D) shows an example of a flexible interconnect 400 conductively bonded to a rear surface terminal contact of a super cell near the edge of the solar module and extending inward beneath the super cell, hidden from view from the front of the solar module. An extra strip of encapsulant may be disposed between interconnect 400 and the rear surface of the super cell, as illustrated.

The cross-sectional view of FIG. 8B (Detail B from FIG. 5B) shows an example of a flexible interconnect 400 conductively bonded to a front surface terminal contact of a super cell.

The cross-sectional view of FIG. 8C (Detail C from FIG. 5B) shows an example of a shared flexible interconnect 400 conductively bonded to the front surface terminal contact of one super cell and to the rear surface terminal contact of the other super cell to electrically connect the two super cells in series.

Flexible interconnects electrically connected to the front surface terminal contact of a super cell may be configured or arranged to occupy only a narrow width of the front surface of the solar module, which may for example be located adjacent an edge of the solar module. The region of the front surface of the module occupied by such interconnects may have a narrow width perpendicular to the edge of the super cell of, for example, ≤about 10 mm, ≤about 5 mm, or ≤about 3 mm. In the arrangement shown in FIG. 8B, for example, flexible interconnect 400 may be configured to extend beyond the end of the super cell by no more than such a distance. FIGS. 8D-8G show additional examples of arrangements by which a flexible interconnect electrically connected to a front surface terminal contact of a super cell may occupy only a narrow width of the front surface of the module. Such arrangements facilitate efficient use of the front surface area of the module to produce electricity.

Figure 8D:
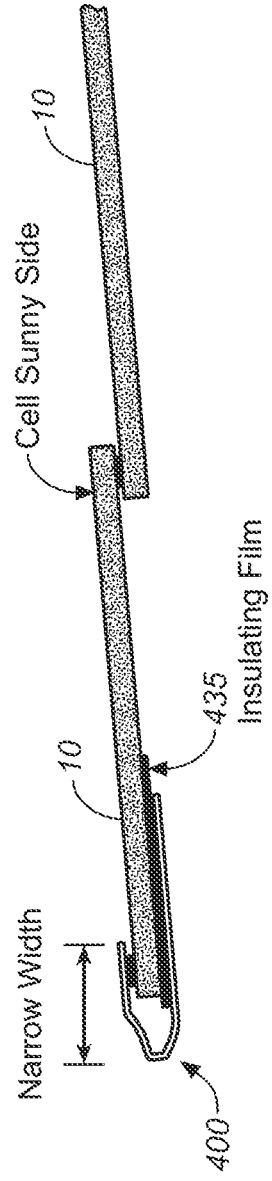

FIG. 8D shows a flexible interconnect 400 that is conductively bonded to a terminal front surface contact of a super cell and folded around the edge of the super cell to the rear of the super cell. An insulating film 435, which may be pre-coated on flexible interconnect 400, may be disposed between flexible interconnect 400 and the rear surface of the super cell.

Figure 8E:
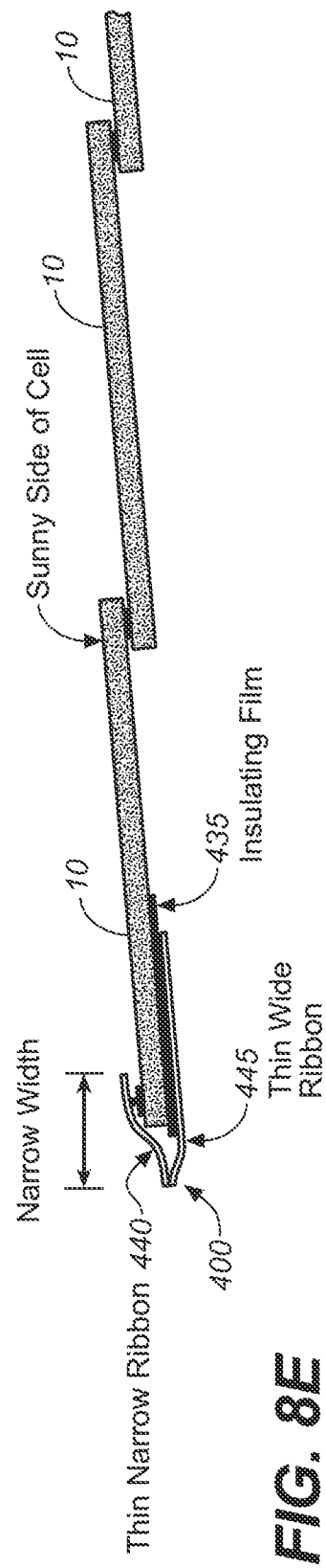

FIG. 8E shows a flexible interconnect 400 comprising a thin narrow ribbon 440 that is conductively bonded to a terminal front surface contact of a super cell and also to a thin wide ribbon 445 that extends behind the rear surface of the super cell. An insulating film 435, which may be pre-coated on ribbon 445, may be disposed between ribbon 445 and the rear surface of the super cell.

FIG. 8F shows a flexible interconnect 400 bonded to a terminal front surface contact of a super cell and rolled and pressed into a flattened coil that occupies only a narrow width of the solar module front surface.

FIG. 8G shows a flexible interconnect 400 comprising a thin ribbon section that is conductively bonded to a terminal front surface contact of a super cell and a thick cross-section portion located adjacent to the super cell.

In FIGS. 8A-8G, flexible interconnects 400 may extend along the full lengths of the edges of the super cells (e.g., into the drawing page) as shown in FIG. 6 for example.

Optionally, portions of a flexible interconnect 400 that are otherwise visible from the front of the module may be covered by a dark film or coating or otherwise colored to reduce visible contrast between the interconnect and the super cell, as perceived by a human having normal color vision. For example, in FIG. 8C optional black film or coating 425 covers portions of the interconnect 400 that would otherwise be visible from the front of the module. Otherwise visible portions of interconnect 400 shown in the other figures may be similarly covered or colored.

Conventional solar modules typically include three or more bypass diodes, with each bypass diode connected in parallel with a series connected group of 18-24 silicon solar cells. This is done to limit the amount of power that may be dissipated as heat in a reverse biased solar cell. A solar cell may become reverse biased, for example, because of a defect, a dirty front surface, or uneven illumination that reduces its ability to pass current generated in the string. Heat generated in a solar cell in reverse bias depends on the voltage across the solar cell and the current through the solar cell. If the voltage across the reverse biased solar cell exceeds the breakdown voltage of the solar cell, the heat dissipated in the cell will be equal to the breakdown voltage times the full current generated in the string. Silicon solar cells typically have a breakdown voltage of 16-30 Volts. Because each silicon solar cell produces a voltage of about 0.64 Volts in operation, a string of more than 24 solar cells could produce a voltage across a reverse biased solar cell exceeding the breakdown voltage.

In conventional solar modules in which the solar cells are spaced apart from each other and interconnected with ribbons, heat is not readily transported away from a hot solar cell. Consequently, the power dissipated in a solar cell at breakdown voltage could produce a hot spot in the solar cell that causes significant thermal damage and perhaps a fire. In conventional solar modules a bypass diode is therefore required for every group of 18-24 series connected solar cells to insure that no solar cell in the string can be reverse biased above the breakdown voltage.

Applicants have discovered that heat is readily transported along a silicon super cell through the thin electrically and thermally conductive bonds between adjacent overlapping silicon solar cells. Further, the current through a super cell in the solar modules described herein is typically less than that through a string of conventional solar cells, because the super cells described herein are typically formed by shingling rectangular solar cells each of which has an active area less than (for example, ⅙) that of a conventional solar cell. Furthermore, the rectangular aspect ratio of the solar cells typically employed herein provides extended regions of thermal contact between adjacent solar cells. As a consequence, less heat is dissipated in a solar cell reverse biased at the breakdown voltage, and the heat readily spreads through the super cell and the solar module without creating a dangerous hot spot. Applicants have therefore recognized that solar modules formed from super cells as described herein may employ far fewer bypass diodes than conventionally believed to be required.

For example, in some variations of solar modules as described herein a super cell comprising N>25 solar cells, N≥about 30 solar cells, N≥about 50 solar cells, N≥about 70 solar cells, or N≥about 100 solar cells may be employed with no single solar cell or group of <N solar cells in the super cell individually electrically connected in parallel with a bypass diode. Optionally, a full super cell of these lengths may be electrically connected in parallel with a single bypass diode. Optionally, super cells of these lengths may be employed without a bypass diode.

Several additional and optional design features may make solar modules employing super cells as described herein even more tolerant to heat dissipated in a reverse biased solar cell. Referring again to FIGS. 8A-8C, encapsulant 410 may be or comprise a thermoplastic olefin (TPO) polymer, TPO encapsulants are more photo-thermal stable than standard ethylene-vinyl acetate (EVA) encapsulants. EVA will brown with temperature and ultraviolet light and lead to hot spot issues created by current limiting cells. These problems are reduced or avoided with TPO encapsulant. Further, the solar modules may have a glass-glass structure in which both the transparent front sheet 420 and the back sheet 430 are glass. Such a glass-glass enables the solar module to safely operate at temperatures greater than those tolerated by a conventional polymer back sheet. Further still, junction boxes may be mounted on one or more edges of a solar module, rather than behind the solar module where a junction box would add an additional layer of thermal insulation to the solar cells in the module above it.

Figure 9A:
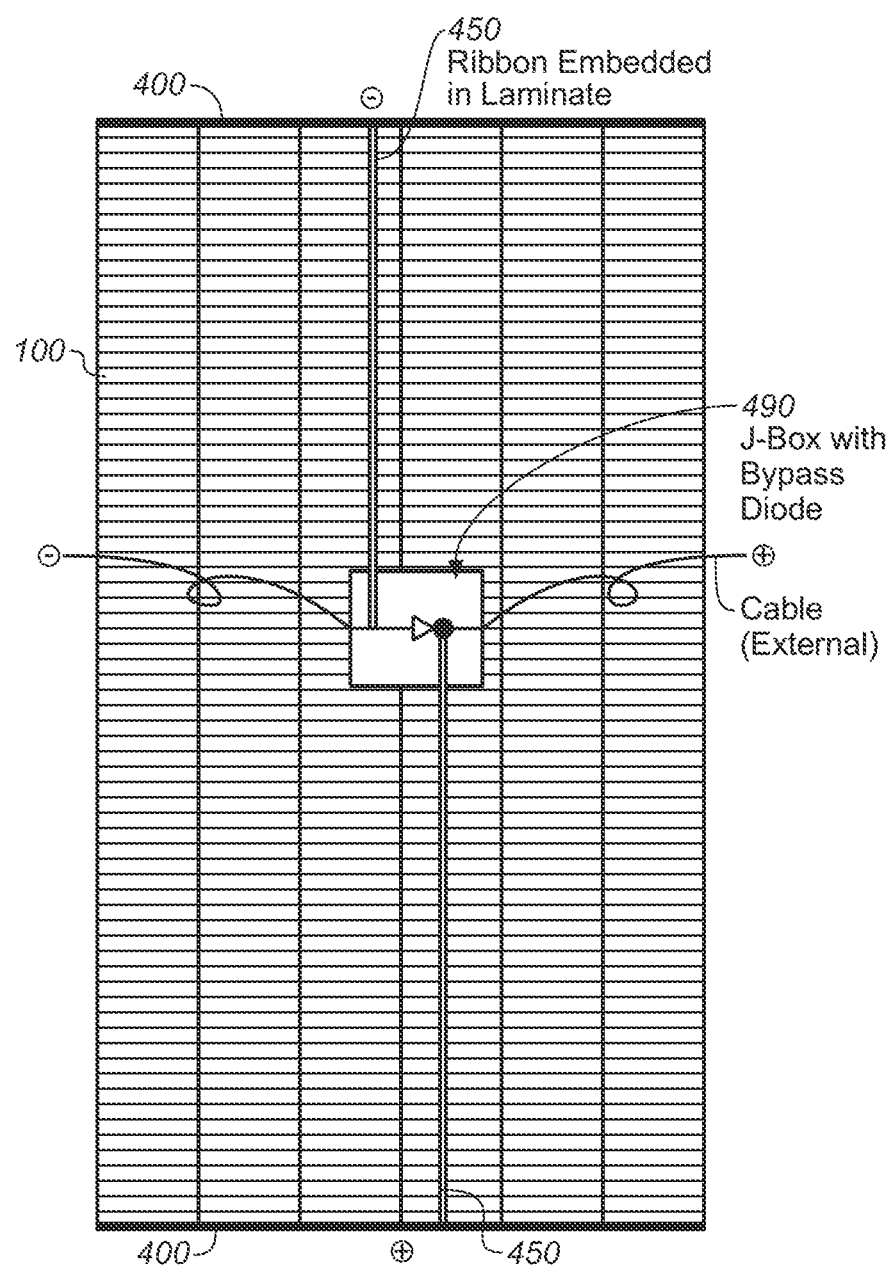
FIG. 9A shows a diagram of another example rectangular solar module comprising six rectangular shingled super cells, with the long side of each super cell having a length of approximately the length of the long side of the module. The super cells are arranged in six rows that are electrically connected in parallel with each other and in parallel with a bypass diode disposed in a junction box on the rear surface of the solar module. Electrical connections between the super cells and the bypass diode are made through ribbons embedded in the laminate structure of the module.

FIG. 9A shows an example rectangular solar module comprising six rectangular shingled super cells arranged in six rows extending the length of the long sides of the solar module. The six super cells are electrically connected in parallel with each other and with a bypass diode disposed in a junction box 490 on the rear surface of the solar module. Electrical connections between the super cells and the bypass diode are made through ribbons 450 embedded in the laminate structure of the module.

Figure 9B:
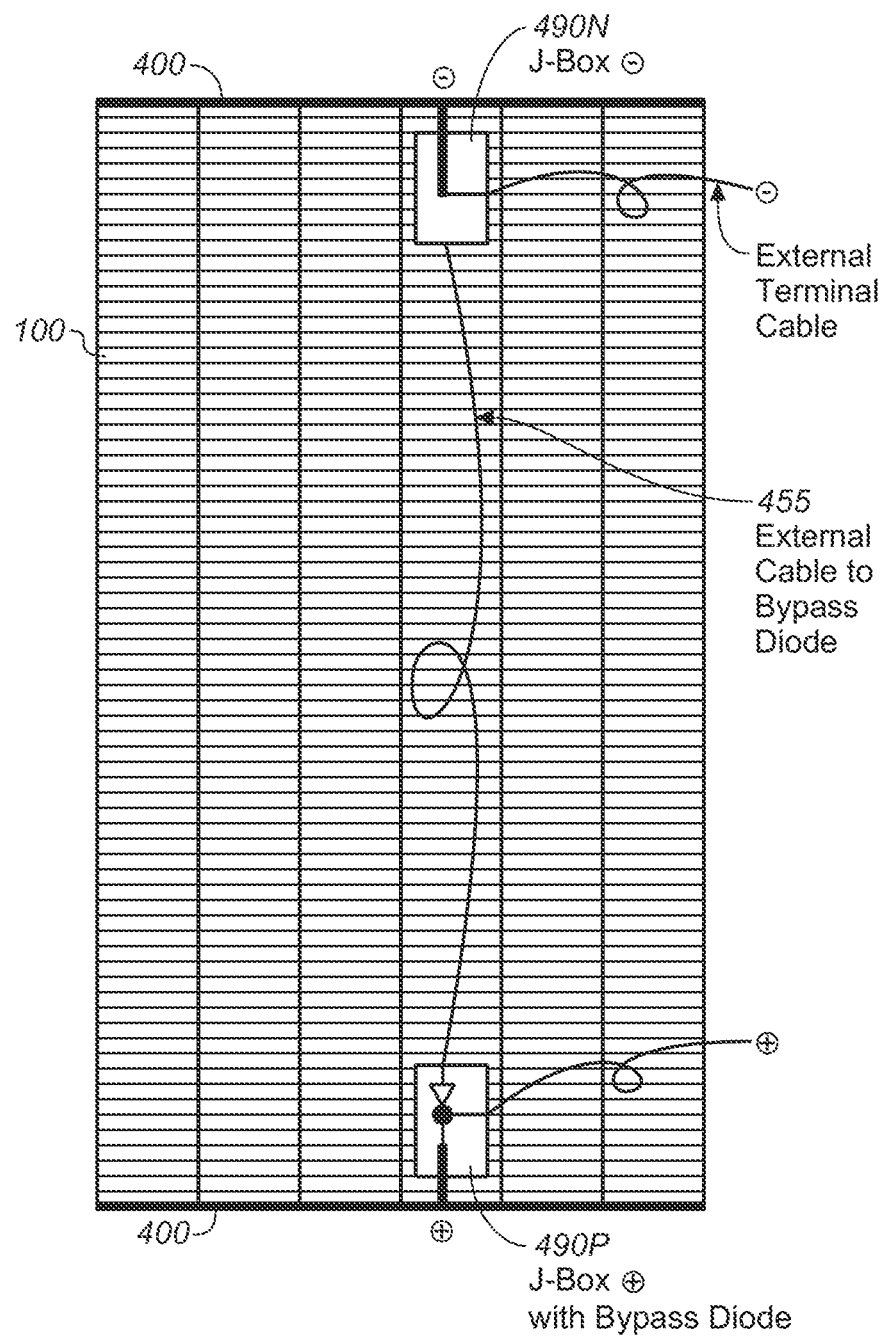
FIG. 9B shows a diagram of another example rectangular solar module comprising six rectangular shingled super cells, with the long side of each super cell having a length of approximately the length of the long side of the module. The super cells are arranged in six rows that are electrically connected in parallel with each other and in parallel with a bypass diode disposed in a junction box on the rear surface and near an edge of the solar module. A second junction box is located on the rear surface near an opposite edge of the solar module. Electrical connection between the super cells and the bypass diode are made through an external cable between the junction boxes.

FIG. 9B shows another example rectangular solar module comprising six rectangular shingled super cells arranged in six rows extending the length of the long sides of the solar module. The super cells are electrically connected in parallel with each other. Separate positive 490P and negative 490N terminal junction boxes are disposed on the rear surface of the solar module at opposite ends of the solar module. The super cells are electrically connected in parallel with a bypass diode located in one of the junction boxes by an external cable 455 running between the junction boxes.

FIGS. 9C-9D show an example glass-glass rectangular solar module comprising six rectangular shingled super cells arranged in six rows extending the length of the long sides of the solar module in a lamination structure comprising glass front and back sheets. The super cells are electrically connected in parallel with each other. Separate positive 490P and negative 490N terminal junction boxes are mounted on opposite edges of the solar module.

Shingled super cells open up unique opportunities for module layout with respect to module level power management devices (for example, DC/AC micro-inverters, DC/DC module power optimizers, voltage intelligence and smart switches, and related devices). The key feature of module level power management systems is power optimization. Super cells as described and employed herein may produce higher voltages than traditional panels. In addition, super cell module layout may further partition the module. Both higher voltages and increased partitioning create potential advantages for power optimization.

Figure 9E:
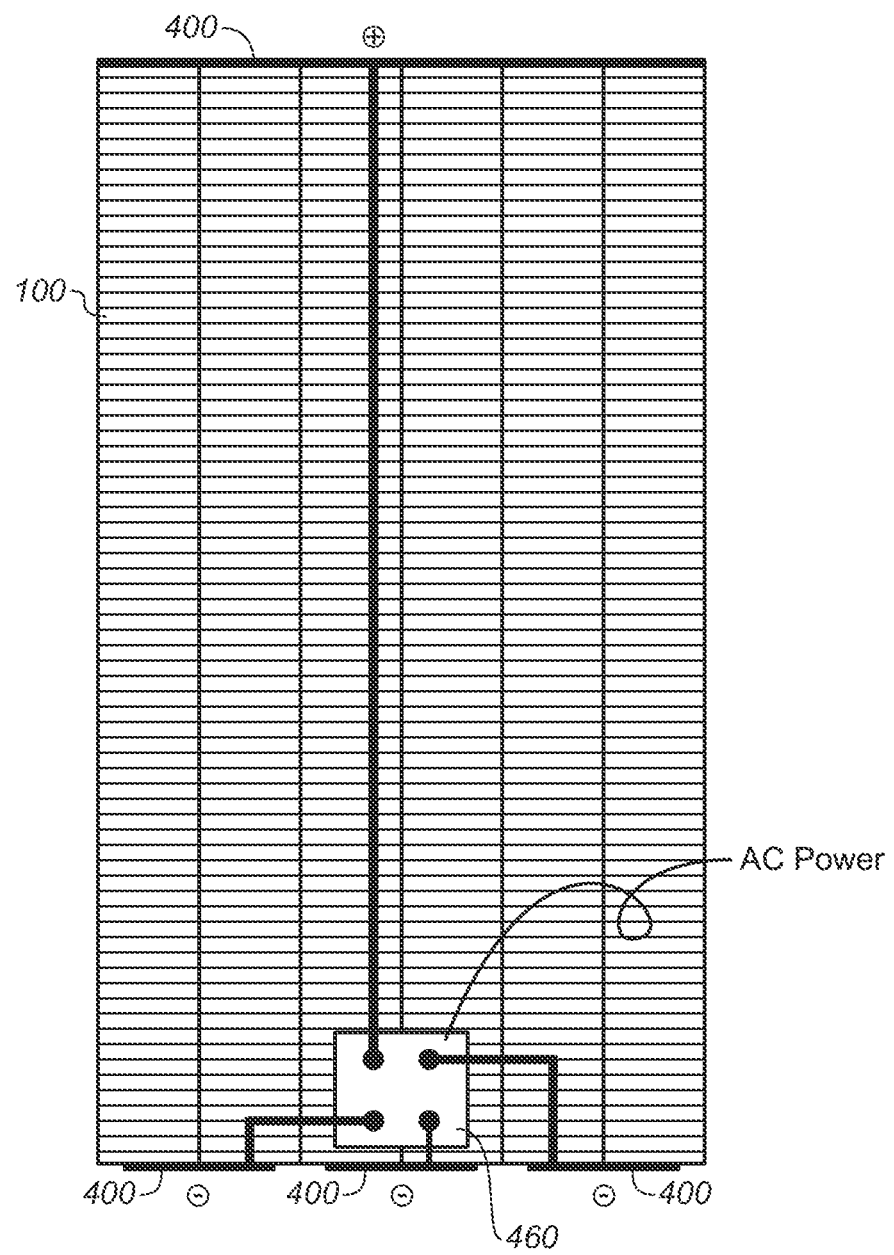
FIG. 9E shows another example solar module comprising six rectangular shingled super cells, with the long side of each super cell having a length of approximately the length of the long side of the module. The super cells are arranged in six rows, with three pairs of rows individually connected to a power management device on the solar module.

FIG. 9E shows one example architecture for module level power management using shingled super cells. In this figure an example rectangular solar module comprises six rectangular shingled super cells arranged in six rows extending the length of the long sides of the solar module. Three pairs of super cells are individually connected to a power management system 460, enabling more discrete power optimization of the module.

Figure 9F:
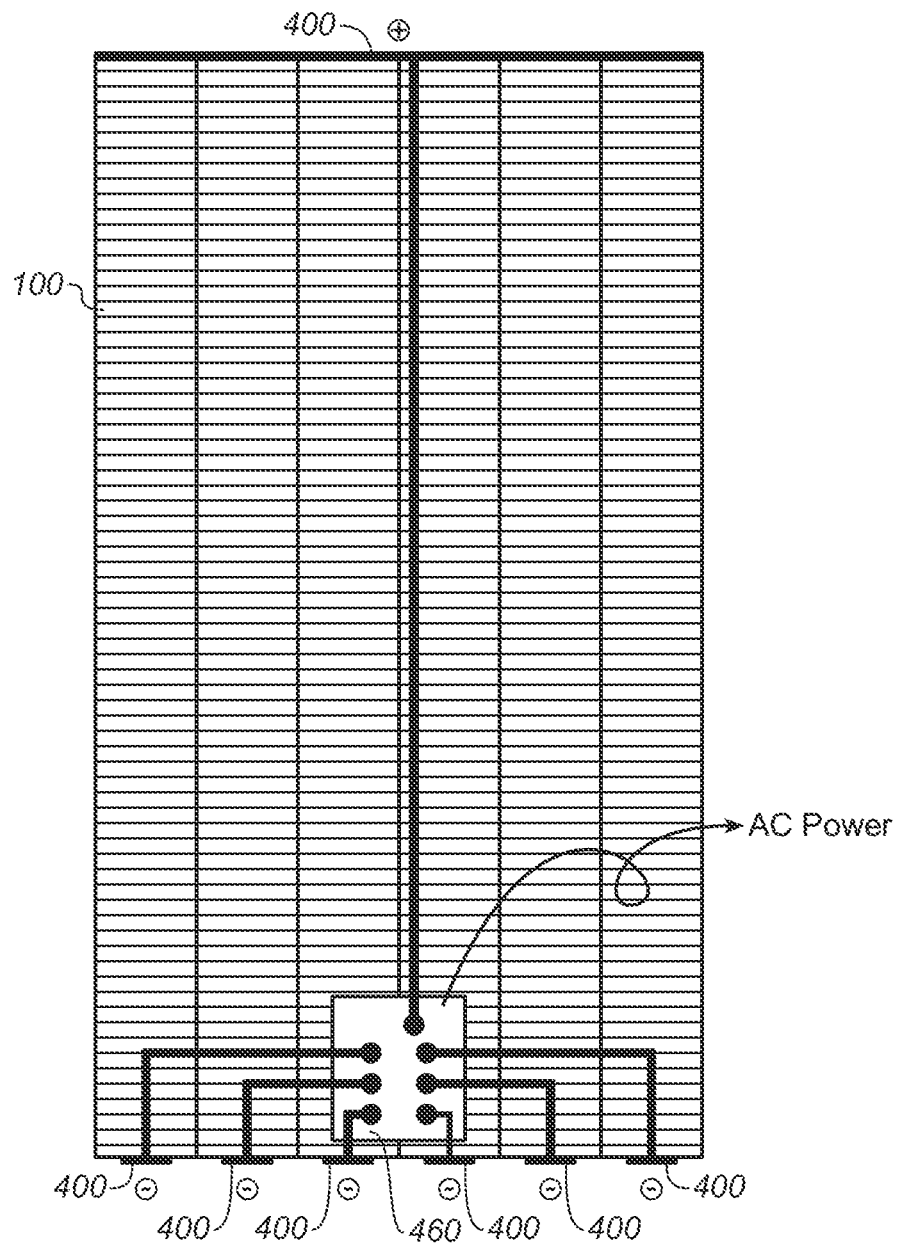
FIG. 9F shows another example solar module comprising six rectangular shingled super cells, with the long side of each super cell having a length of approximately the length of the long side of the module. The super cells are arranged in six rows, with each row individually connected to a power management device on the solar module.

FIG. 9F shows another example architecture for module level power management using shingled super cells. In this figure an example rectangular solar module comprises six rectangular shingled super cells arranged in six rows extending the length of the long sides of the solar module. The six super cells are individually connected to a power management system 460, enabling yet more discrete power optimization of the module.

Figure 9G:
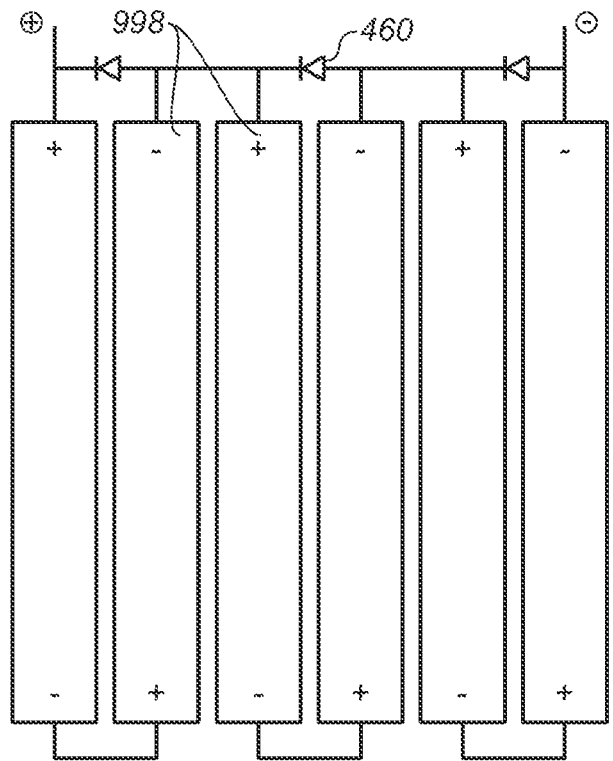
FIGS. 9G and 9H show other embodiments of architectures for module level power management using shingled super cells.

FIG. 9G shows another example architecture for module level power management using shingled super cells. In this figure an example rectangular solar module comprises six or more rectangular shingled super cells 998 arranged in six or more rows, where the three or more super cells pairs are individually connected to a bypass diode or a power management system 460, to allow yet more discrete power optimization of the module.

Figure 9H:
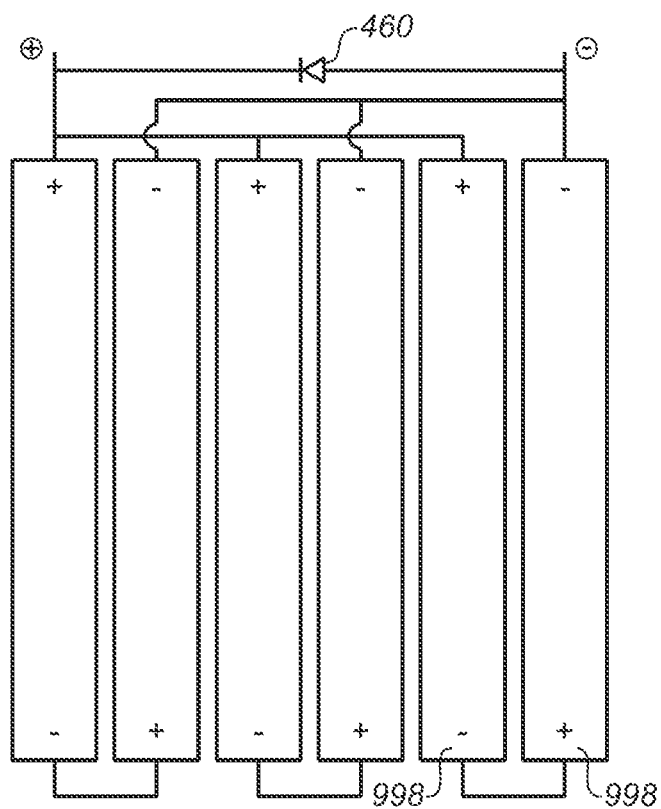

FIG. 9H shows another example architecture for module level power management using shingled super cells. In this figure an example rectangular solar module comprises six or more rectangular shingled super cells 998 arranged in six or more rows, where each two super cell are connected in series, and all pairs are connected in parallel. A bypass diode or power management system 460 is connected in parallel to all pairs, permitting power optimization of the module.

In some variations, module level power management allows elimination of all bypass diodes on the solar module while still excluding the risk of hot spots. This is accomplished by integrating voltage intelligence at the module level. By monitoring the voltage output of a solar cell circuit (e.g., one or more super cells) in the solar module, a "smart switch" power management device can determine if that circuit includes any solar cells in reverse bias. If a reverse biased solar cell is detected, the power management device can disconnect the corresponding circuit from the electrical system using, for example, a relay switch or other component. For example, if the voltage of a monitored solar cell circuit drops below a predetermined threshold ($V_{Limit}$), then the power management device will shut off (open circuit) that circuit while ensuring that the module or string of modules remain connected.

In certain embodiments, where a voltage of the circuits drops by more than a certain percentage or magnitude (e.g., 20% or 10V) from the other circuits in same solar array, it will be shut off. The electronics will detect this change based upon inter-module communication.

Implementation of such voltage intelligence may be incorporated into existing module level power management solutions (e.g., from Enphase Energy Inc., Solaredge Technologies, Inc., Tigo Energy, Inc.) or through a custom circuit design.

One example of how the $V_{Limit}$ threshold voltage may be calculated is:

$$CellVoc_{@Low\ Irr\ \&\ High\ Temp} \times N_{number\ of\ cells\ in\ series} - Vrb_{Reverse\ breakdown\ voltage} \leq V_{Limit},$$

where:
$CellVoc_{@Low\ Irr\ \&\ High\ Temp}$=open circuit voltage of a cell working at low irradiation and at high temperature (lowest expected working Voc);

$N_{number\ of\ cells\ in\ series}$=a number of cells connected in series in each super cell monitored.

$Vrb_{Reverse\ breakdown\ voltage}$=revered polarity voltage needed to pass current through a cell.

This approach to module level power management using a smart switch may allow, for example more than 100 silicon solar cells to be connected in series within a single module without affecting safety or module reliability. In addition, such a smart switch can be used to limit string voltage going to a central inverter. Longer module strings can therefore be installed without safety or permitting concerns regarding over voltage. The weakest module can be bypassed (switched off) if string voltages run up against the limit.

FIGS. 10A, 11A, 12A, 13A, 13B, and 14B described below provide additional example schematic electrical circuits for solar modules employing shingled super cells. FIGS. 10B-1, 10B-2, 11B-1, 11B-2, 11C-1, 11C-2, 12B-1, 12B-2, 12C-1, 12C-2, 12C-3, 13C-1, 13C-2, 14C-1, and 14C-2 provide example physical layouts corresponding to those schematic circuits. The description of the physical layouts assumes that the front surface end contact of each super cell is of negative polarity and the rear surface end contact of each super cell is of positive polarity. If instead the modules employ super cells having front surface end contacts of positive polarity and rear surface end contacts of negative polarity, then the discussion of the physical layouts below may be modified by swapping positive for negative and by reversing the orientation of the bypass diodes. Some of the various buses referred to in the description of these figures may be formed, for example, with interconnects 400 described above. Other buses described in these figures may be implemented, for example, with ribbons embedded in the laminate structure of solar module or with external cables.

FIG. 10A shows an example schematic electrical circuit for a solar module as illustrated in FIG. 5B, in which the solar module includes ten rectangular super cells 100 each of which has a length approximately equal to the length of the short sides of the solar module. The super cells are arranged in the solar module with their long sides oriented parallel to the short sides of the module. All of the super cells are electrically connected in parallel with a bypass diode 480.

Figures 2, 10B:
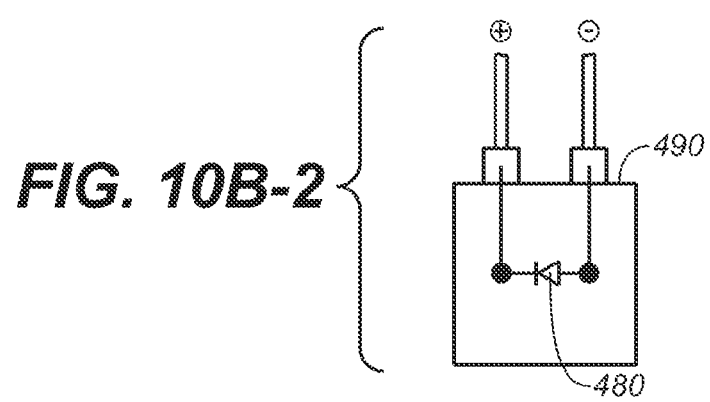

FIGS. 10B-1 and 10B-2 show an example physical layout for the solar module of FIG. 10A. Bus 485N connects the negative (front surface) end contacts of super cells 100 to the positive terminal of bypass diode 480 in junction box 490 located on the rear surface of the module. Bus 485P connects the positive (rear surface) end contacts of super cells 100 to the negative terminal of bypass diode 480. Bus 485P may lie entirely behind the super cells. Bus 485N and/or its interconnection to the super cells occupy a portion of the front surface of the module.

Figure 11A:
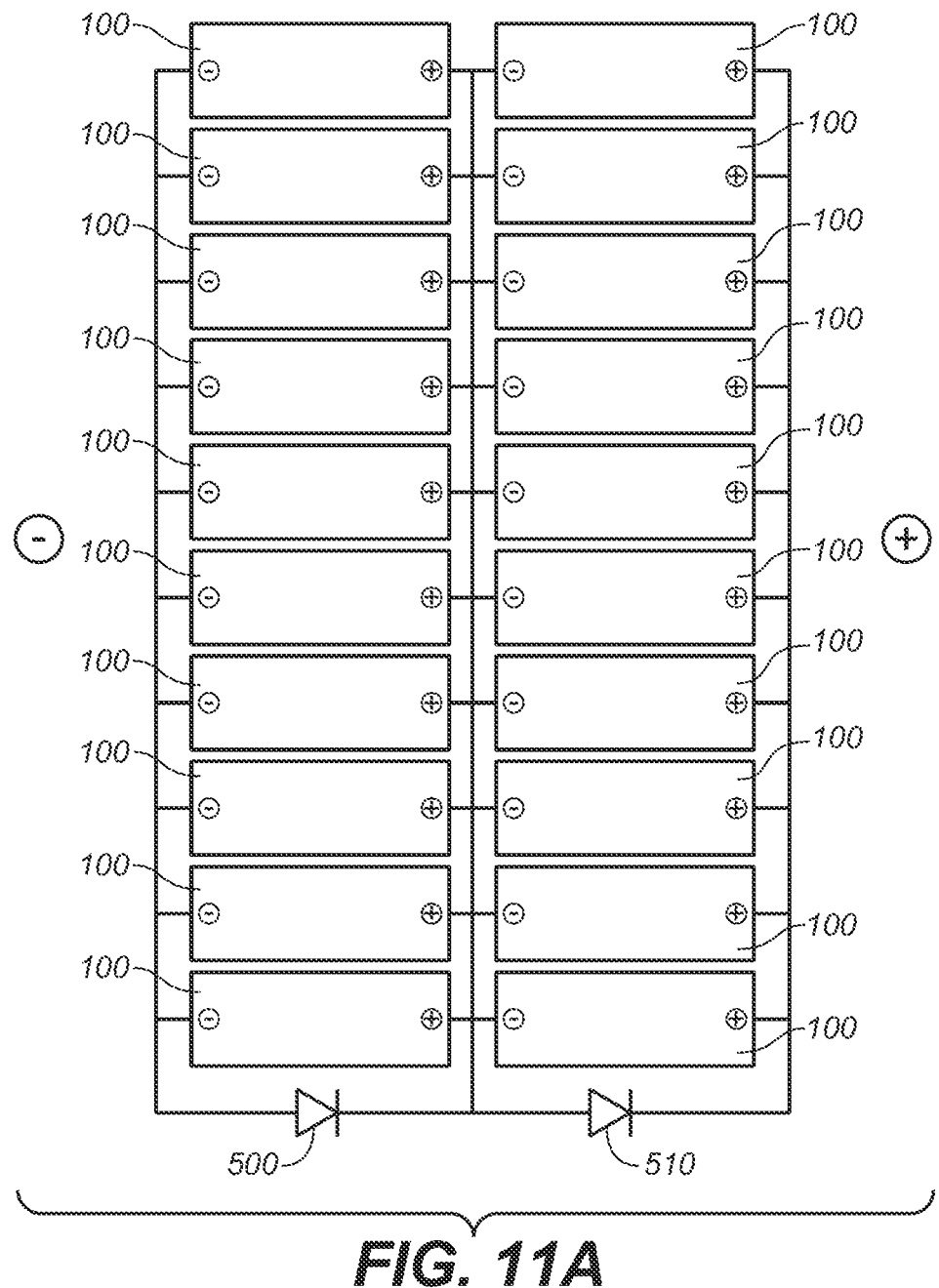
FIG. 11A shows an example schematic electrical circuit diagram for a solar module as illustrated in FIG. 5A.

FIG. 11A shows an example schematic electrical circuit for a solar module as illustrated in FIG. 5A, in which the solar module includes twenty rectangular super cells 100, each of which has a length approximately equal to one half the length of the short sides of the solar module, and the super cells are arranged end-to-end in pairs to form ten rows of super cells. The first super cell in each row is connected in parallel with the first super cells in the other rows and in parallel with a bypass diode 500. The second super cell in each row is connected in parallel with the second super cells in the other rows and in parallel with a bypass diode 510. The two groups of super cells are connected in series, as are the two bypass diodes.

Figures 1, 11B:
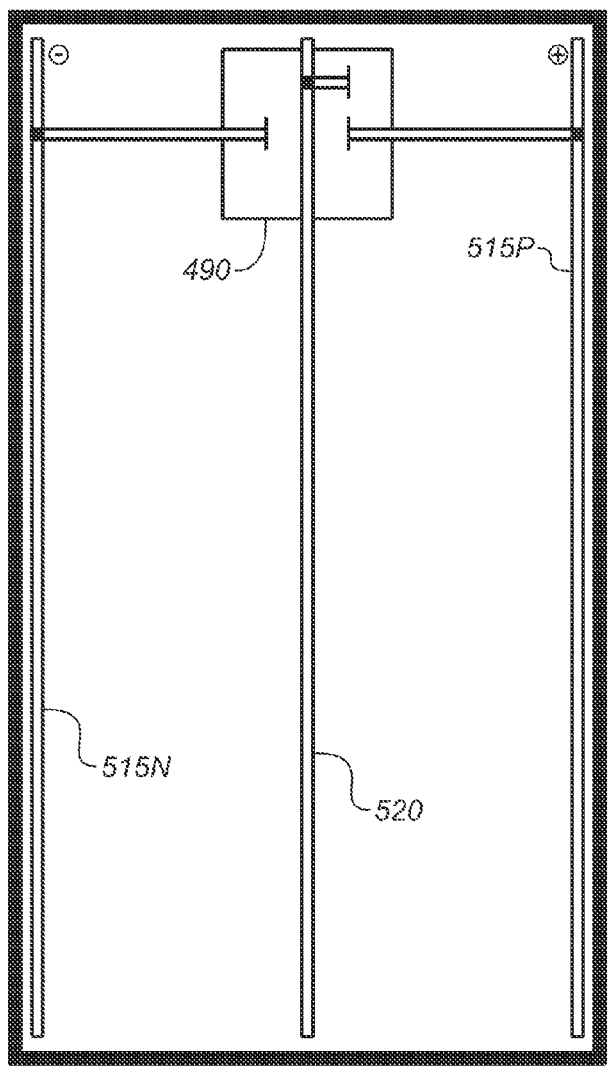
Figures 2, 11B:
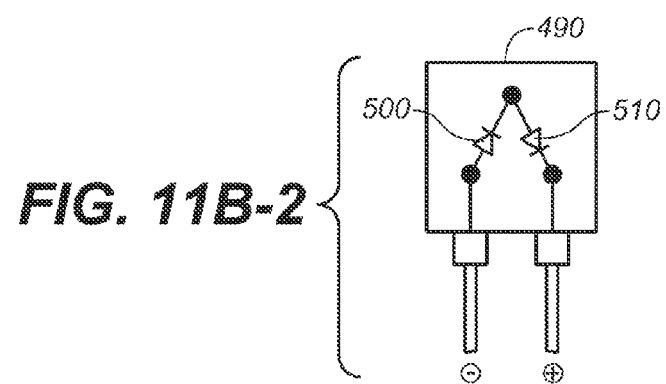
Figures 1, 11C:
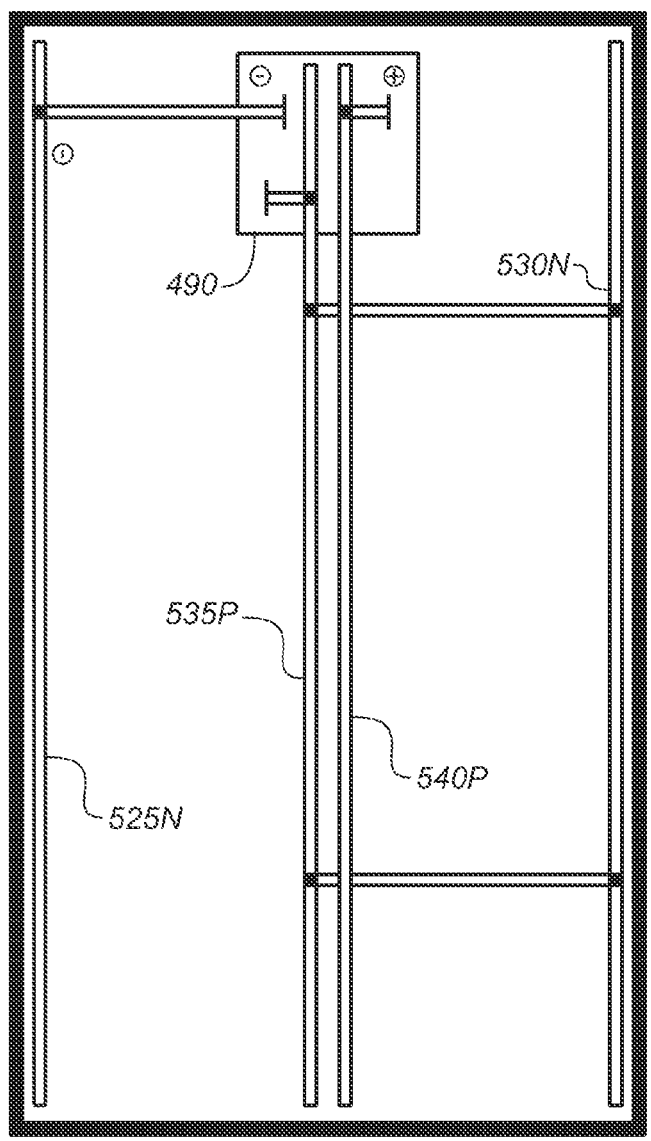
Figures 2, 11C:
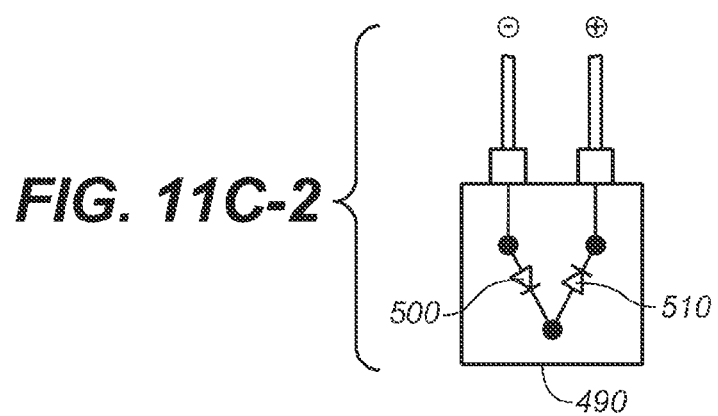

FIGS. 11B-1 and 11B-2 show an example physical layout for the solar module of FIG. 11A. In this layout the first super cell in each row has its front surface (negative) end contact along a first side of the module and its rear surface (positive) end contact along the center line of the module, and the second super cell in each row has its front surface (negative) end contact along the center line of the module and its rear surface (positive) end contact along a second side of the module opposite from the first side. Bus 515N connects the front surface (negative) end contact of the first super cell in each row to the positive terminal of bypass diode 500. Bus 515P connects the rear surface (positive) end contact of the second super cell in each row to the negative terminal of bypass diode 510. Bus 520 connects the rear surface (positive) end contact of the first super cell in each row and the front surface (negative) end contact of the second super cell in each row to the negative terminal of bypass diode 500 and to the positive terminal of bypass diode 510.

Bus 515P may lie entirely behind the super cells. Bus 515N and/or its interconnection to the super cells occupy a portion of the front surface of the module. Bus 520 may occupy a portion of the front surface of the module, requiring a gap 210 as shown in FIG. 5A. Alternatively, bus 520 may lie entirely behind the super cells and be electrically connected to the super cells with hidden interconnects sandwiched between overlapping ends of the super cells. In such a case little or no gap 210 is required.

FIGS. 11C-1, 11C-2, and 11C-3 show another example physical layout for the solar module of FIG. 11A. In this layout the first super cell in each row has its front surface (negative) end contact along a first side of the module and its rear surface (positive) end contact along the center line of the module, and the second super cell in each row has its rear surface (positive) end contact along the center line of the module and its front surface (negative) end contact along a second side of the module opposite from the first side. Bus 525N connects the front surface (negative) end contact of the first super cell in each row to the positive terminal of bypass diode 500. Bus 530N connects the front surface (negative) end contact of the second cell in each row to the negative terminal of bypass diode 500 and to the positive terminal of bypass diode 510. Bus 535P connects the rear surface (positive) end contact of the first cell in each row to the negative terminal of bypass diode 500 and to the positive terminal of bypass diode 510. Bus 540P connects the rear surface (positive) end contact of the second cell in each row to the negative terminal of bypass diode 510.

Bus 535P and bus 540P may lie entirely behind the super cells. Bus 525N and bus 530N and/or their interconnection to the super cells occupy a portion of the front surface of the module.

Figure 12A:
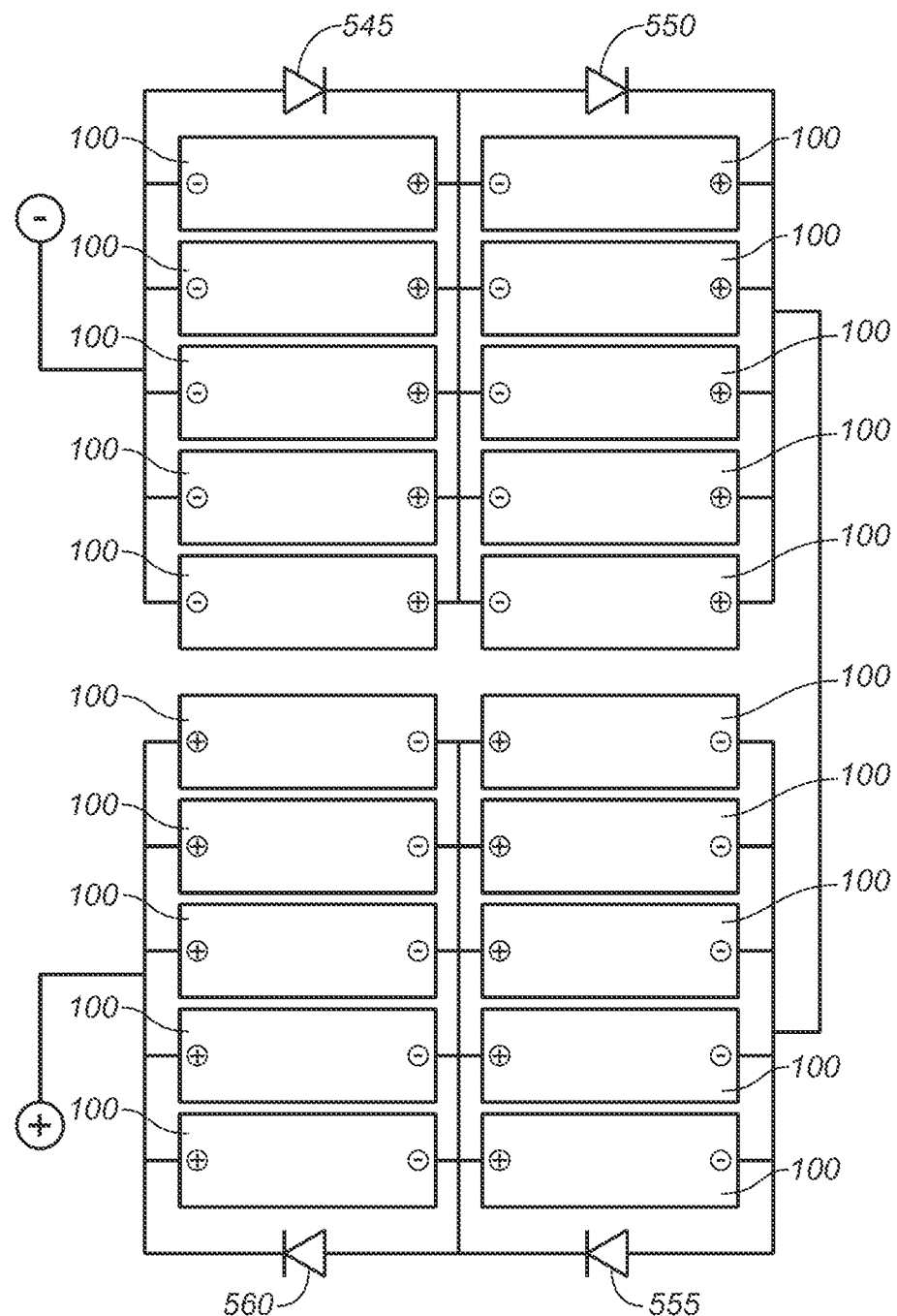
FIG. 12A shows another example schematic circuit diagram for a solar module as illustrated in FIG. 5A.

FIG. 12A shows another example schematic circuit diagram for a solar module as illustrated in FIG. 5A, in which the solar module includes twenty rectangular super cells 100, each of which has a length approximately equal to one half the length of the short sides of the solar module, and the super cells are arranged end-to-end in pairs to form ten rows of super cells. In the circuit shown in FIG. 12A, the super cells are arranged in four groups: in a first group the first super cells of the top five rows are connected in parallel with each other and with a bypass diode 545, in a second group the second super cells of the top five rows are connected in parallel with each other and with a bypass diode 505, in a third group the first super cells of the bottom five rows are connected in parallel with each other and with a bypass diode 560, and in a fourth group the second super cells of the bottom five rows are connected in parallel with each other and with a bypass diode 555. The four groups of super cells are connected in series with each other. The four bypass diodes are also in series.

Figures 1, 12B:
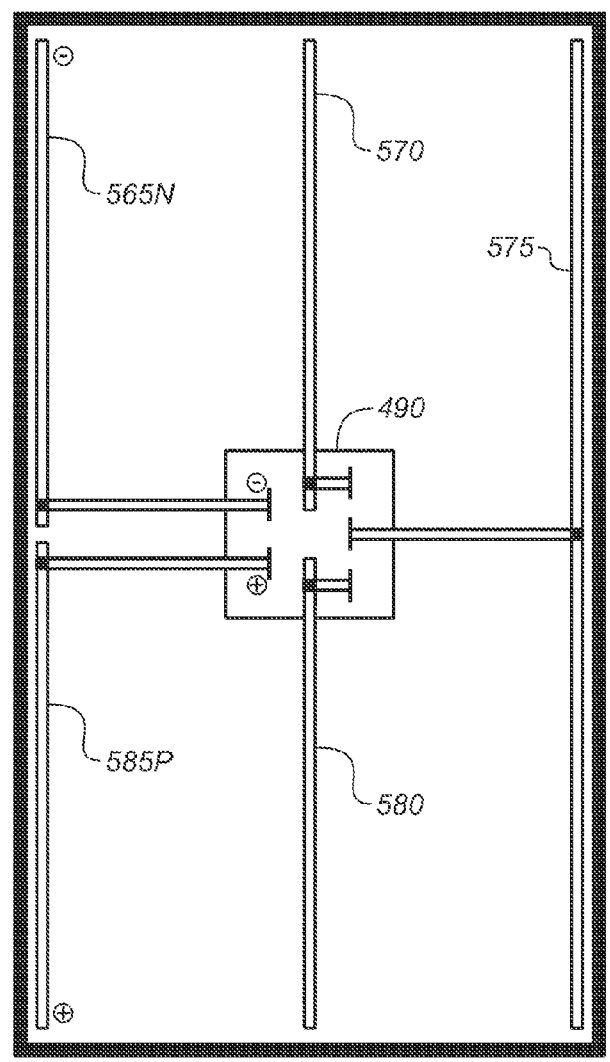
Figures 2, 12B:
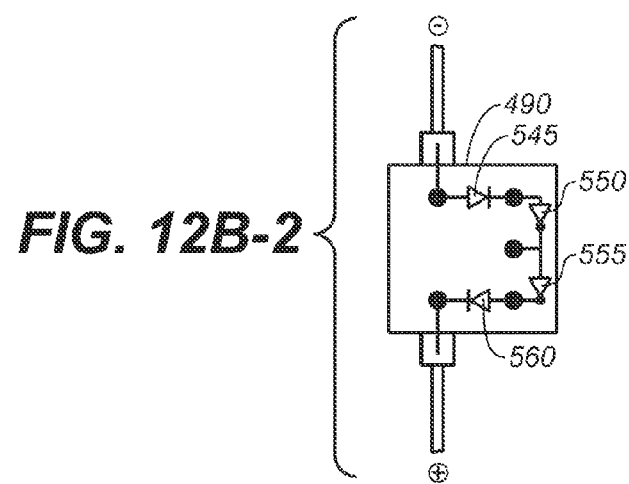
Figures 1, 12C:
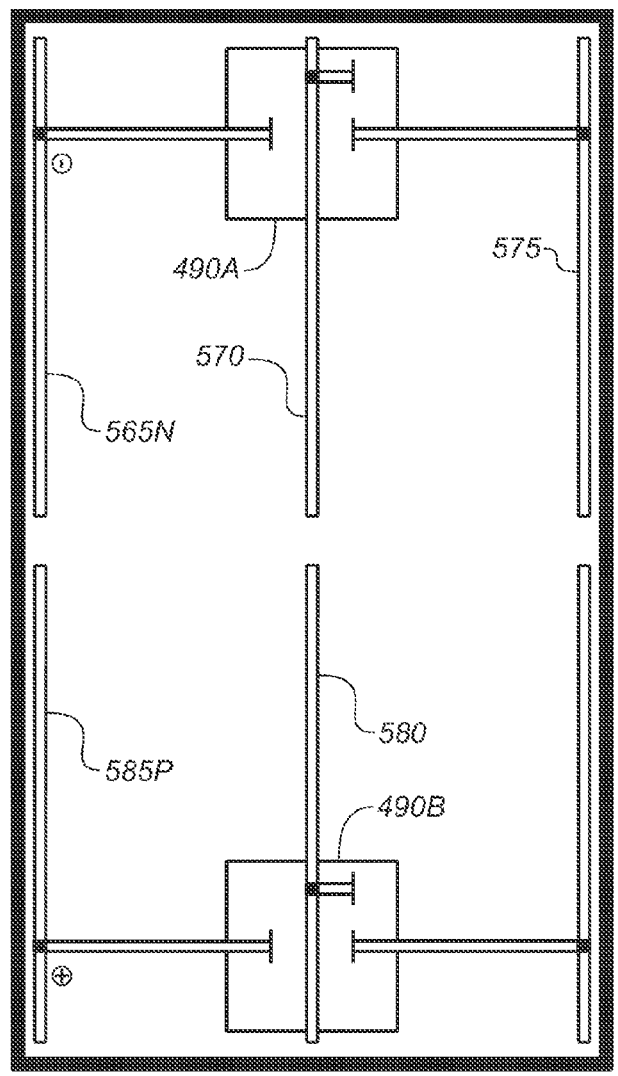
Figures 2, 12C:
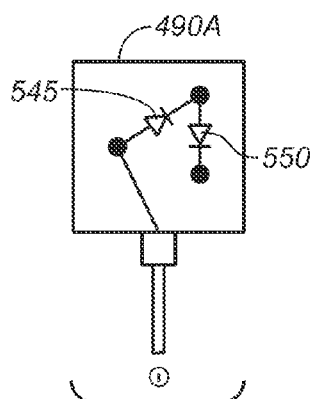
Figures 3, 12C:
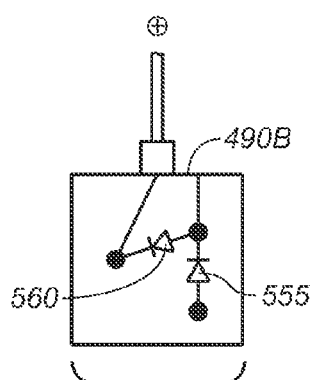

FIGS. 12B-1 and 12B-2 show an example physical layout for the solar module of FIG. 12A. In this layout the first group of super cells has its front surface (negative) end contacts along a first side of the module and its rear surface (positive) end contacts along the center line of the module, the second group of super cells has its front surface (negative) end contacts along the center line of the module and its rear surface (positive) end contacts along a second side of the module opposite from the first side, the third group of super cells has its rear surface (positive) end contacts along the first side of the module and its front surface (negative) end contacts along the center line of the module, and the fourth group of super cells has its rear surface (positive) end contact along the center line of the module and its front surface (negative) end contact along the second side of the module.

Bus 565N connects the front surface (negative) end contacts of the super cells in the first group of super cells to each other and to the positive terminal of bypass diode 545. Bus 570 connects the rear surface (positive) end contacts of the super cells in the first group of super cells and the front surface (negative) end contacts of the super cells in the second group of super cells to each other, to the negative terminal of bypass diode 545, and to the positive terminal of bypass diode 550. Bus 575 connects the rear surface (positive) end contacts of the super cells in the second group of super cells and the front surface (negative) end contacts of the super cells in the fourth group of super cells to each other, to the negative terminal of bypass diode 550, and to the positive terminal of bypass diode 555. Bus 580 connects the rear surface (positive) end contacts of the super cells in the fourth group of super cells and the front surface (negative) end contacts of the super cells in the third group of super cells to each other, to the negative terminal of bypass diode 555, and to the positive terminal of bypass diode 560. Bus 585P connects the rear surface (positive) end contacts of the super cells in the third group of super cells to each other and to the negative terminal of bypass diode 560.

Bus 585P and the portion of bus 575 connecting to the super cells of the second group of super cells may lie entirely behind the super cells. The remaining portion of bus 575 and bus 565N and/or their interconnection to the super cells occupy a portion of the front surface of the module.

Bus 570 and bus 580 may occupy a portion of the front surface of the module, requiring a gap 210 as shown in FIG. 5A. Alternatively, they may lie entirely behind the super cells and be electrically connected to the super cells with hidden interconnects sandwiched between overlapping ends of super cells. In such a case little or no gap 210 is required.

FIGS. 12C-1, 12C-2, and 12C-3 show an alternative physical layout for the solar module of FIG. 12A. This layout uses two junction boxes 490A and 490B in place of the single junction box 490 shown in FIGS. 12B-1 and 12B-2, but is otherwise equivalent to that of FIGS. 12B-1 and 12B-2.

Figure 13A:
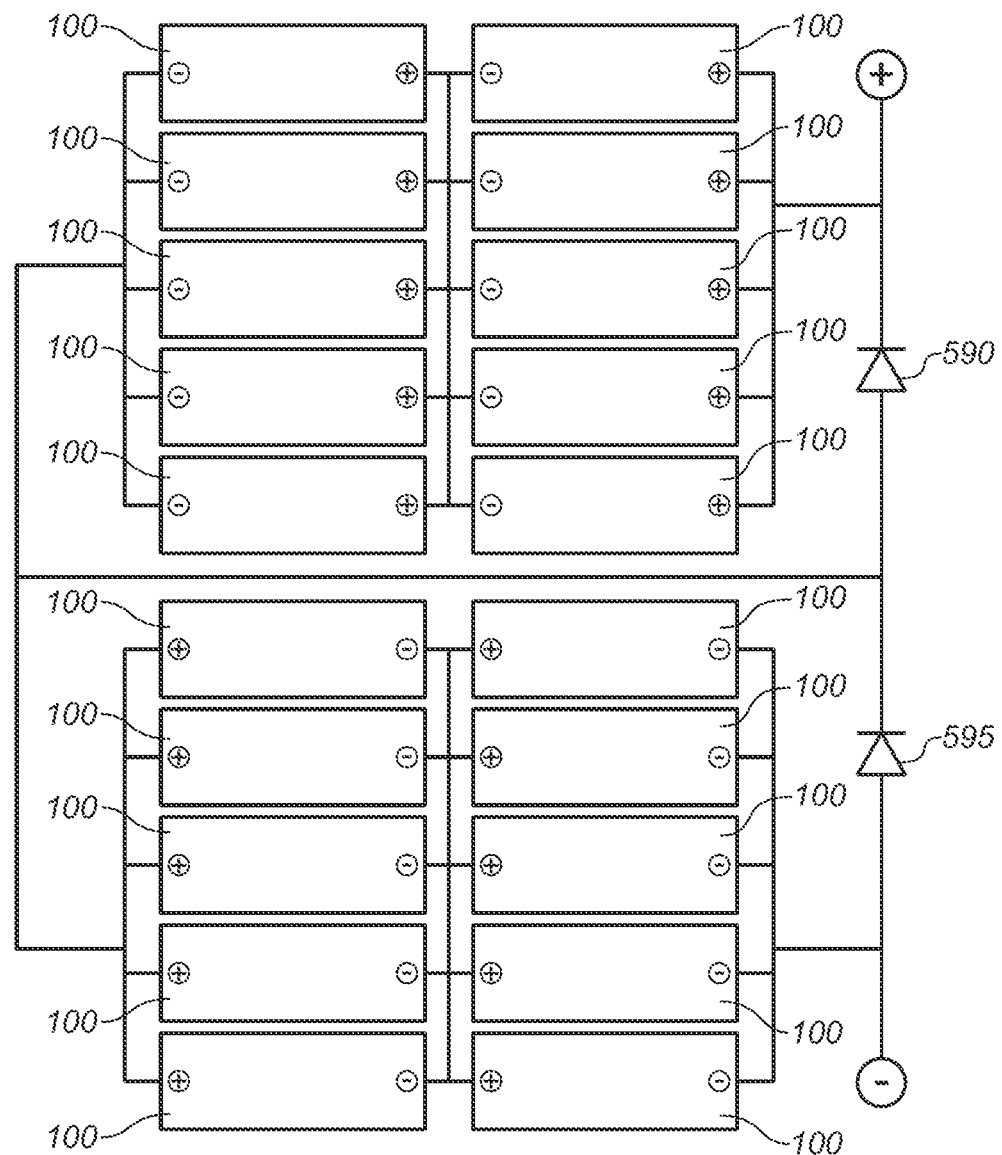
FIG. 13A shows another example schematic circuit diagram for a solar module as illustrated in FIG. 5A.

FIG. 13A shows another example schematic circuit diagram for a solar module as illustrated in FIG. 5A, in which the solar module includes twenty rectangular super cells 100, each of which has a length approximately equal to one half the length of the short sides of the solar module, and the super cells are arranged end-to-end in pairs to form ten rows of super cells. In the circuit shown in FIG. 13A, the super cells are arranged in four groups: in a first group the first super cells of the top five rows are connected in parallel with each other, in a second group the second super cells of the top five rows are connected in parallel with each other, in a third group the first super cells of the bottom five rows are connected in parallel with each other, and in a fourth group the second super cells of the bottom five rows are connected in parallel with each other. The first group and the second group are connected in series with each other and thus connected are in parallel with a bypass diode 590. The third group and the fourth group are connected in series with each other and thus connected in parallel with another bypass diode 595. The first and second groups are connected in series with the third and fourth groups, and the two bypass diodes are in series as well.

Figure 13B:
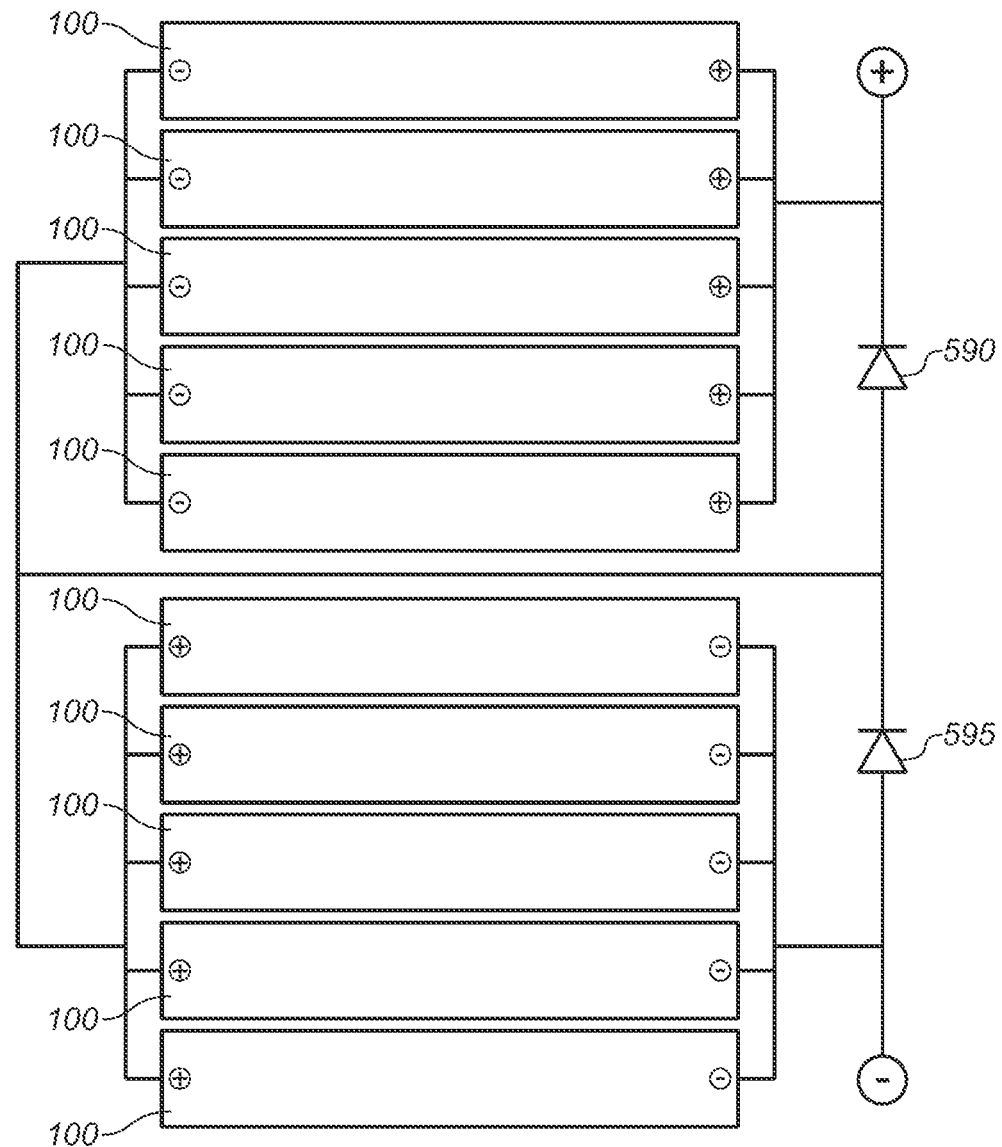
FIG. 13B shows another example schematic circuit diagram for a solar module as illustrated in FIG. 5B.
Figures 1, 13C:
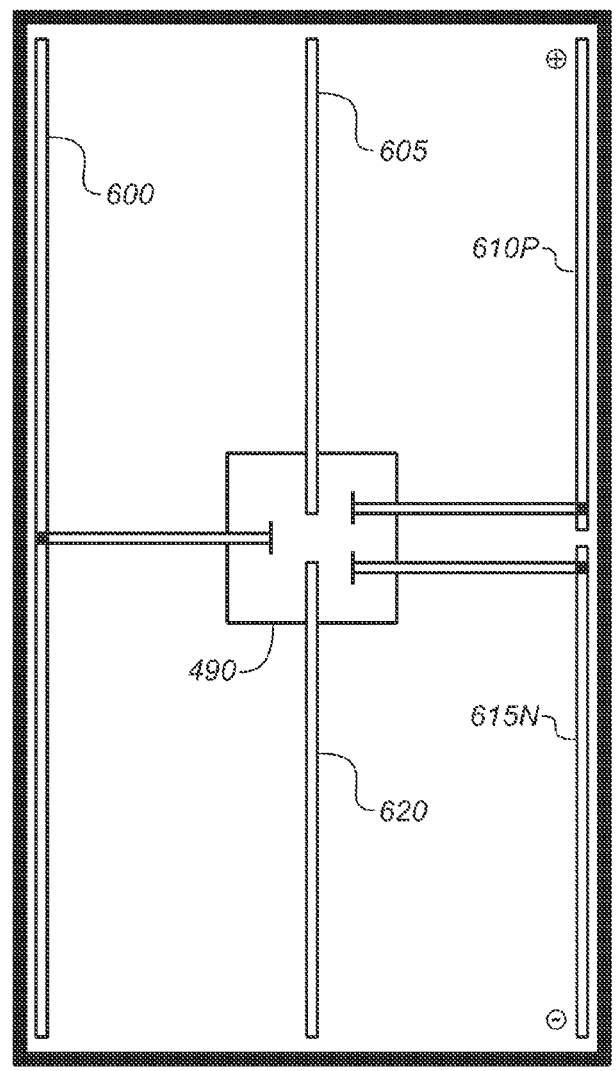
Figures 2, 13C:
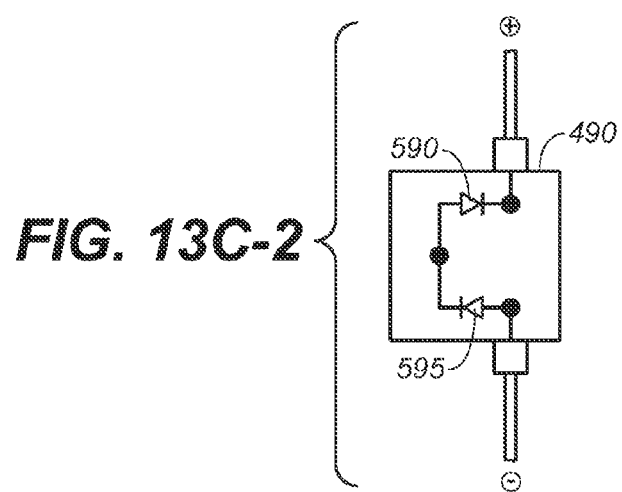

FIGS. 13C-1 and 13C-2 show an example physical layout for the solar module of FIG. 13A. In this layout the first group of super cells has its front surface (negative) end contact along a first side of the module and its rear surface (positive) end contact along the center line of the module, the second group of super cells has its front surface (negative) end contact along the center line of the module and its rear surface (positive) end contact along a second side of the module opposite from the first side, the third group of super cells has its rear surface (positive) end contact along the first side of the module and its front surface (negative) end contact along the center line of the module, and the fourth group of super cells has its rear surface (positive) end contact along the center line of the module and its front surface (negative) end contact along the second side of the module.

Bus 600 connects the front surface (negative) end contacts of the first group of super cells to each other, to the rear surface (positive) end contacts of the third group of super cells, to the positive terminal of bypass diode 590, and to the negative terminal of bypass diode 595. Bus 605 connects the rear surface (positive) end contacts of the first group of super cells to each other and to the front surface (negative) end contacts of the second group of super cells. Bus 610P connects the rear surface (positive) end contacts of the second group of super cells to each other and to the negative terminal of bypass diode 590. Bus 615N connects the front surface (negative) end contacts of the fourth group of super cells to each other and to the positive terminal of bypass diode 595. Bus 620 connects the front surface (negative) end contacts of the third group of super cells to each other and to the rear surface (positive) end contacts of the fourth group of super cells.

Bus 610P and the portion of bus 600 connecting to the super cells of the third group of super cells may lie entirely behind the super cells. The remaining portion of bus 600 and bus 615N and/or their interconnection to the super cells occupy a portion of the front surface of the module.

Bus 605 and bus 620 occupy a portion of the front surface of the module, requiring a gap 210 as shown in FIG. 5A. Alternatively, they may lie entirely behind the super cells and be electrically connected to the super cells with hidden interconnects sandwiched between overlapping ends of super cells. In such a case little or no gap 210 is required.

FIG. 13B shows an example schematic electrical circuit for a solar module as illustrated in FIG. 5B, in which the solar module includes ten rectangular super cells 100 each of which has a length approximately equal to the length of the short sides of the solar module. The super cells are arranged in the solar module with their long sides oriented parallel to the short sides of the module. In the circuit shown in FIG. 13B, the super cells are arranged in two groups: in a first group the top five super cells are connected in parallel with each other and with bypass diode 590, and in a second group the bottom five super cells are connected in parallel with each other and with bypass diode 595. The two groups are connected in series with each other. The bypass diodes are also connected in series.

The schematic circuit of FIG. 13B differs from that of FIG. 13A by replacing each row of two super cells in FIG.

13A with a single super cell. Consequently, the physical layout for the solar module of FIG. 13B may be as shown in FIGS. 13C-1, 13C-2, and 13C-3, with the omission of bus 605 and bus 620.

Figure 14A:
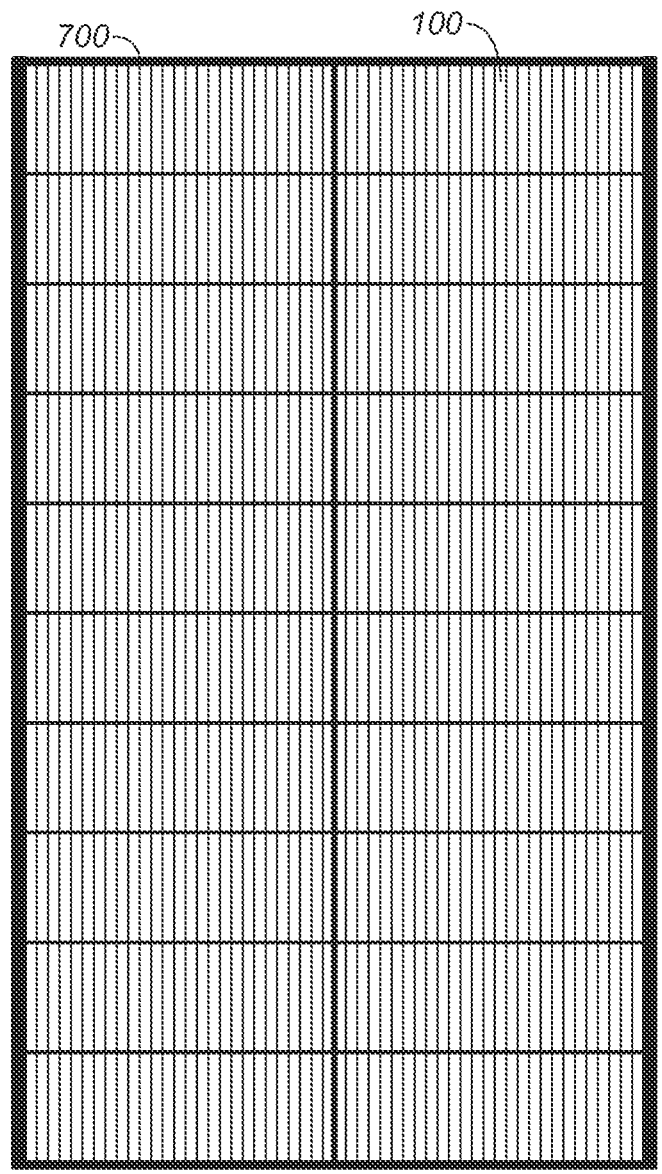
FIG. 14A shows a diagram of another example rectangular solar module comprising a plurality of rectangular shingled super cells, with the long side of each super cell having a length of approximately half the length of the short side of the module. Pairs of the super cells are arranged end-to-end to form rows with the long sides of the super cells parallel to the short side of the module.

FIG. 14A shows an example rectangular solar module 700 comprising twenty-four rectangular super cells 100, each of which has a length approximately equal to one half the length of the short sides of the solar module. Super cells are arranged end-to-end in pairs to form twelve rows of super cells, with the rows and the long sides of the super cells oriented parallel to the short sides of the solar module.

Figure 14B:
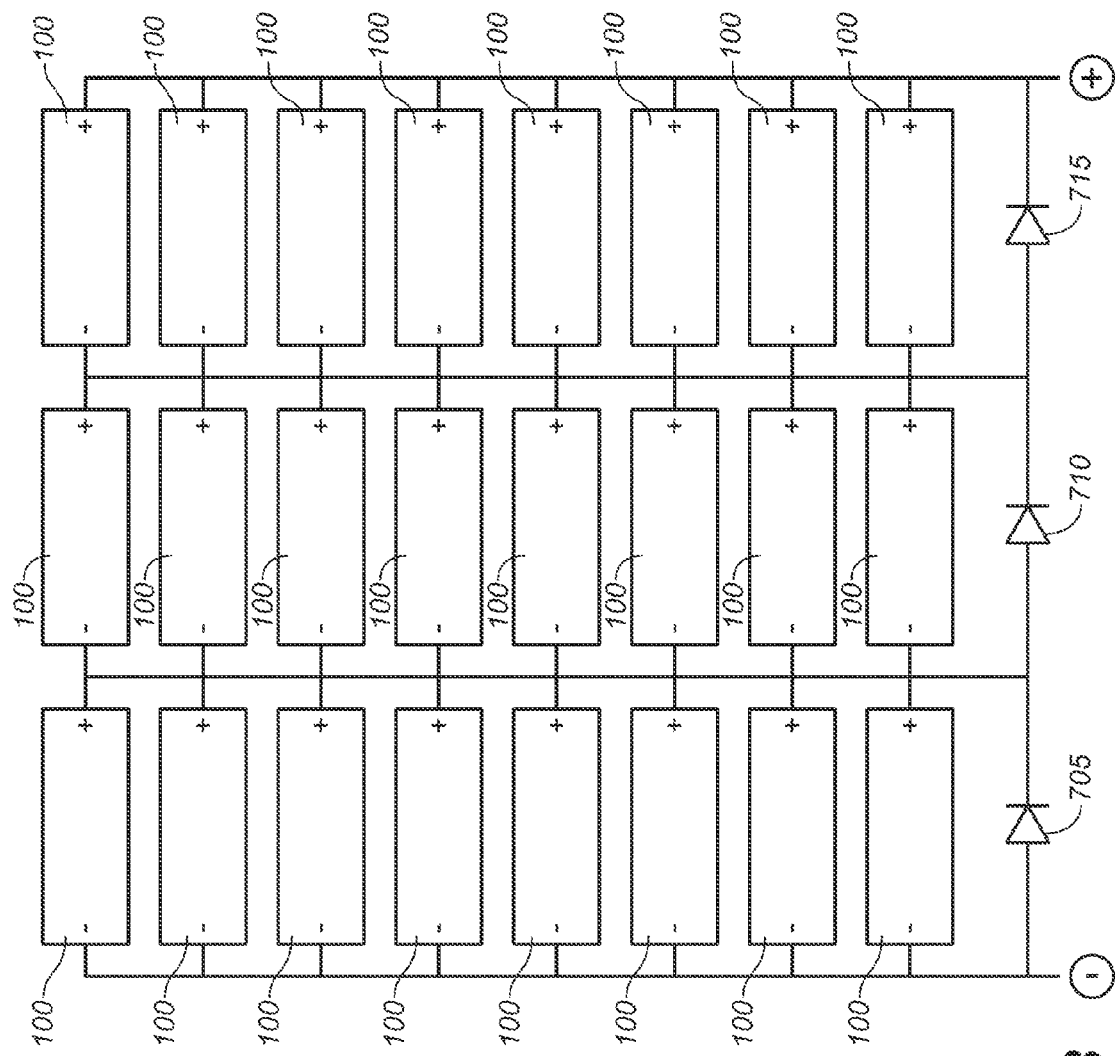
FIG. 14B shows an example schematic circuit diagram for a solar module as illustrated in FIG. 14A.

FIG. 14B shows an example schematic circuit diagram for a solar module as illustrated in FIG. 14A. In the circuit shown in FIG. 14B, the super cells are arranged in three groups: in a first group the first super cells of the top eight rows are connected in parallel with each other and with a bypass diode 705, in a second group the super cells of the bottom four rows are connected in parallel with each other and with a bypass diode 710, and in a third group the second super cells of the top eight rows are connected in parallel with each other and with a bypass diode 715. The three groups of super cells are connected in series. The three bypass diodes are also in series.

Figures 1, 14C:
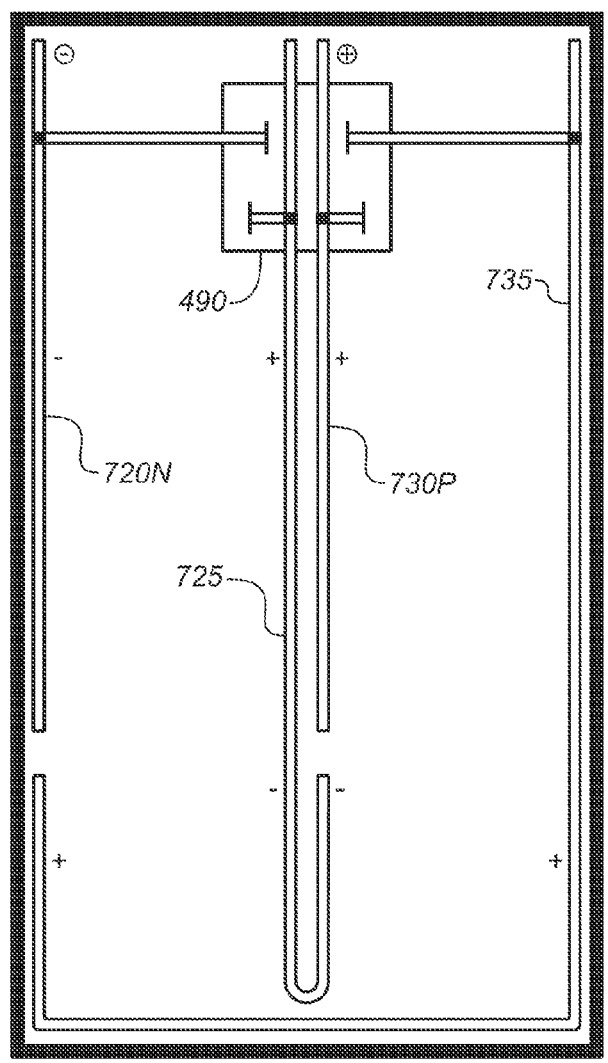
Figures 2, 14C:
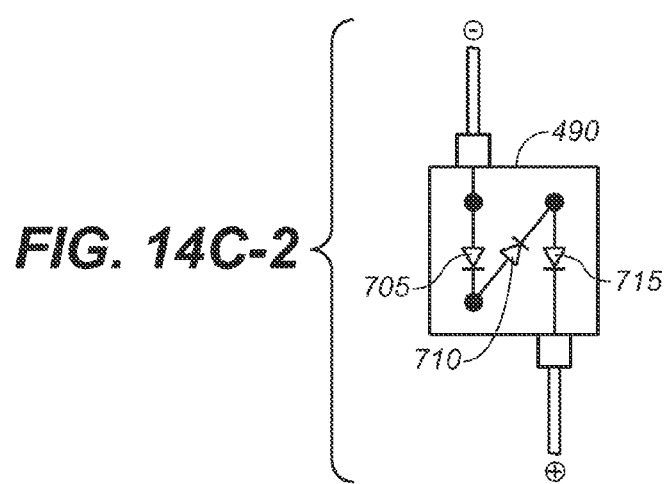

FIGS. 14C-1 and 14C-2 show an example physical layout for the solar module of FIG. 14B. In this layout the first group of super cells has its front surface (negative) end contacts along a first side of the module and its rear surface (positive) end contacts along the center line of the module. In the second group of super cells, the first super cell in each of the bottom four rows has its rear surface (positive) end contact along the first side of the module and its front surface (negative) end contact along the center line of the module, and the second super cell in each of the bottom four rows has its front surface (negative) end contact along the center line of the module and its rear surface (positive) end contact along a second side of the module opposite from the first side. The third group of solar cells has its rear surface (positive) end contacts along the center line of the module and its rear surface (negative) end contacts along the second side of the module.

Bus 720N connects the front surface (negative) end contacts of the first group of super cells to each other and to the positive terminal of bypass diode 705. Bus 725 connects the rear surface (positive) end contacts of the first group of super cells to the front surface (negative) end contacts of the second group of super cells, to the negative terminal of bypass diode 705, and to the positive terminal of bypass diode 710. Bus 730P connects the rear surface (positive) end contacts of the third group of super cells to each other and to the negative terminal of bypass diode 715. Bus 735 connects the front surface (negative) end contacts of the third group of super cells to each other, to the rear surface (positive) end contacts of the second group of super cells, to the negative terminal of bypass diode 710, and to the positive terminal of bypass diode 715.

The portion of bus 725 connecting to the super cells of the first group of super cells, bus 730P, and the portion of bus 735 connecting to the super cells of the second group of super cells may lie entirely behind the super cells. Bus 720N and the remaining portions of bus 725 and bus 735 and/or their interconnection to the super cells occupy a portion of the front surface of the module.

Some of the examples described above house the bypass diodes in one or more junction boxes on the rear surface of the solar module. This is not required, however. For example, some or all of the bypass diodes may be positioned in-plane with the super cells around the perimeter of the solar module or in gaps between super cells, or positioned behind the super cells. In such cases the bypass diodes may be disposed in a laminate structure in which the super cells are encapsulated, for example. The locations of the bypass diodes may thus be decentralized and removed from the junction boxes, facilitating replacement of a central junction box comprising both positive and negative module terminals with two separate single-terminal junction boxes which may be located on the rear surface of the solar module near to outer edges of the solar module, for example. This approach generally reduces the current path length in ribbon conductors in the solar module and in cabling between solar modules, which may both reduce material cost and increase module power (by reducing resistive power losses).

Figure 15:
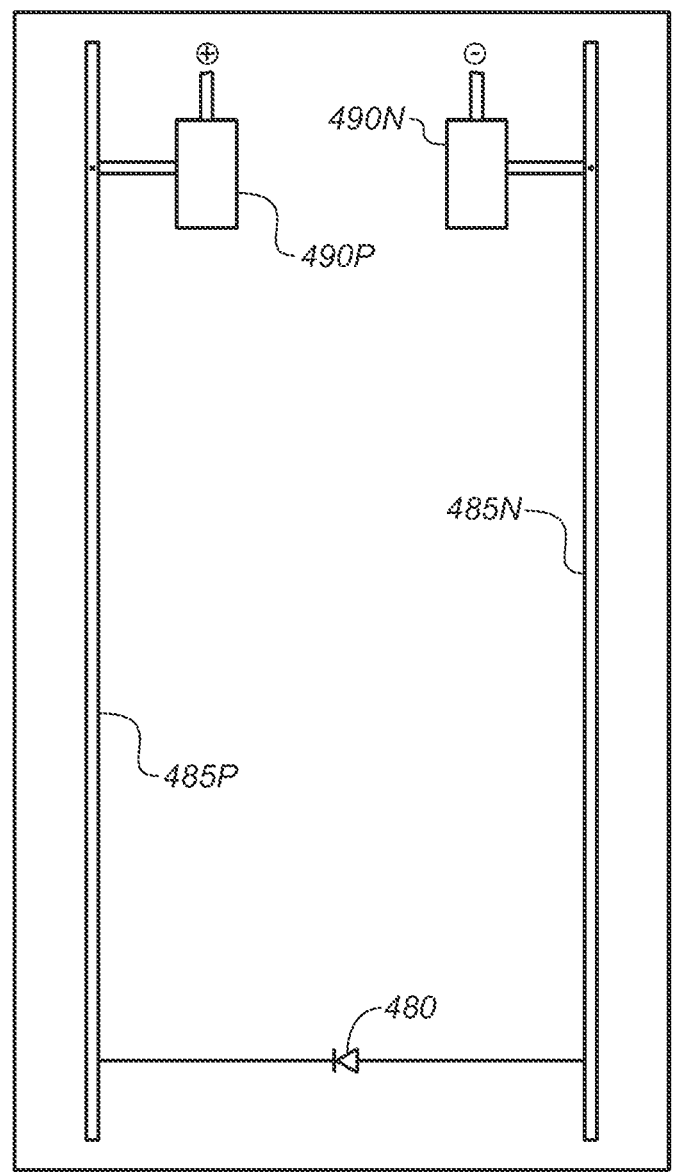
FIG. 15 shows another example physical layout for various electrical interconnections for a solar module as illustrated in FIG. 5B having the schematic circuit diagram of FIG. 10A.

Referring to FIG. 15, for example, the physical layout for various electrical interconnections for a solar module as illustrated in FIG. 5B having the schematic circuit diagram of FIG. 10A may employ a bypass diode 480 located in the super cell laminate structure and two single terminal junction boxes 490P and 490N. FIG. 15 may best be appreciated by comparison to FIGS. 10B-1 and 10B-2. The other module layouts described above may be similarly modified.

Use of in-laminate bypass diodes as just described may be facilitated by the use of reduced current (reduced area) rectangular solar cells as described above, because the power dissipated in a forward-biased bypass diode by the reduced current solar cells may be less than would be the case for conventionally sized solar cells. Bypass diodes in solar modules described in this specification may therefore require less heat-sinking than is conventional, and consequently may be moved out of a junction box on the rear surface of the module and into the laminate.

A single solar module may include interconnects, other conductors, and/or bypass diodes supporting two or more electrical configurations, for example supporting two or more of the electrical configurations described above. In such cases a particular configuration for operation of the solar module may be selected from the two or more alternatives with the use of switches and/or jumpers, for example. The different configurations may put different numbers of super cells in series and/or in parallel to provide different combinations of voltage and current outputs from the solar module. Such a solar module may therefore be factory or field configurable to select from two or more different voltage and current combinations, for example to select between a high voltage and low current configuration, and a low voltage and high current configuration.

Figure 16:
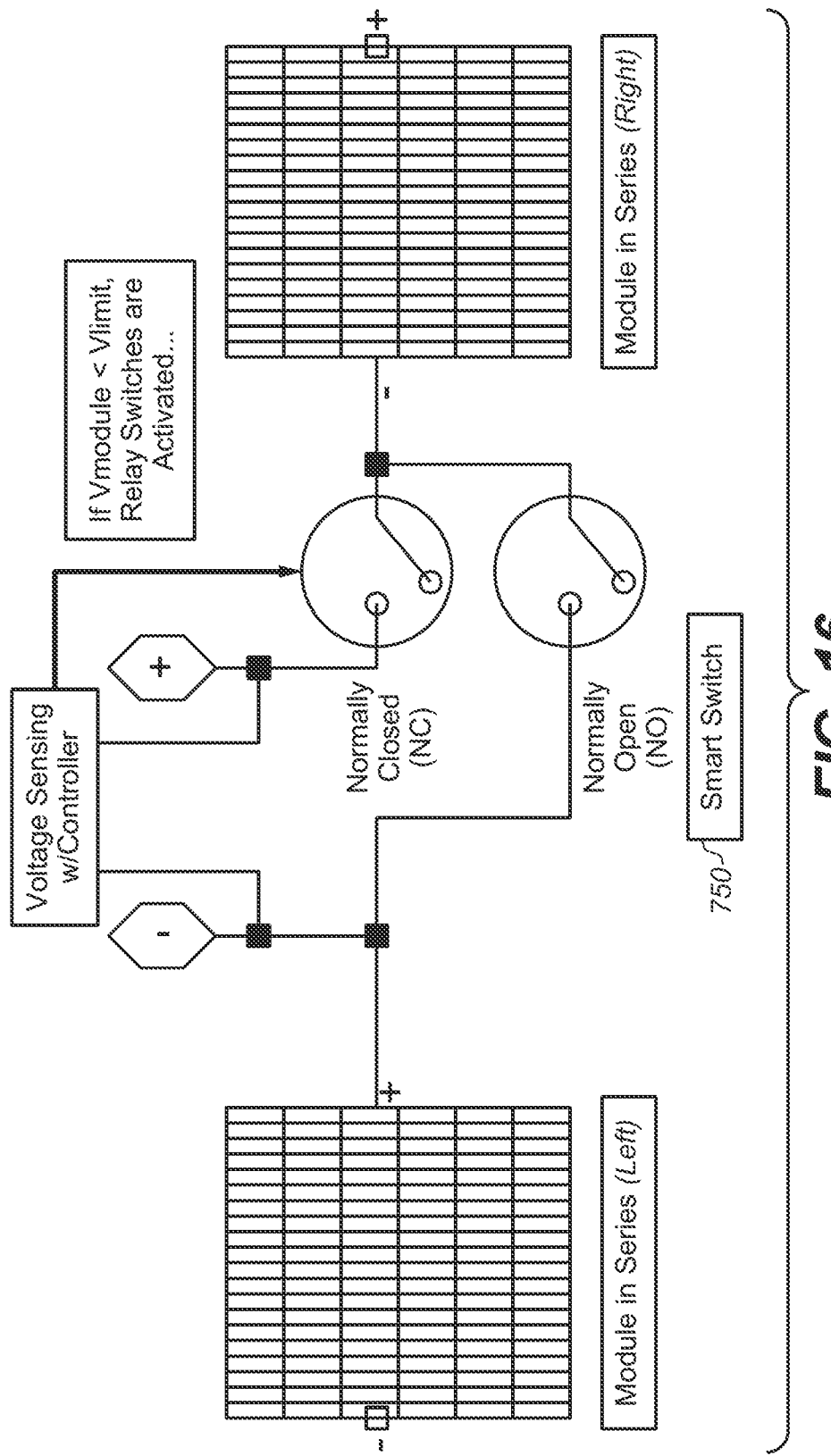
FIG. 16 shows an example arrangement of a smart switch interconnecting two solar modules in series.

FIG. 16 shows an example arrangement of a smart switch module level power management device 750, as described above, between two solar modules.

Figure 17:
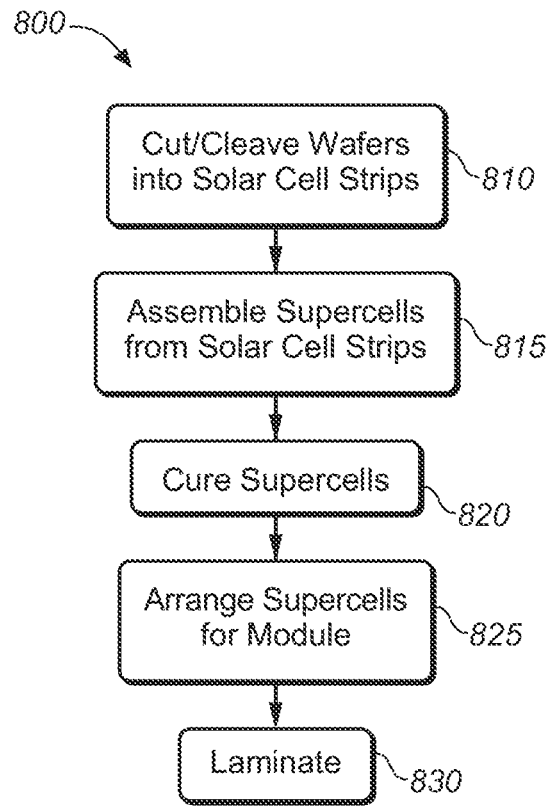
FIG. 17 shows a flow chart for an example method of making a solar module with super cells.

Referring now to FIG. 17, an example method 800 for making solar modules as disclosed in this specification comprises the following steps. In step 810, conventionally sized solar cells (e.g., 156 millimeters×156 millimeters or 125 millimeters×125 millimeters) are cut and/or cleaved to form narrow rectangular solar cell "strips". (See also FIGS. 3A-3E) and related description above, for example). The resulting solar cell strips may optionally be tested and sorted according to their current-voltage performance. Cells with matching or approximately matching current-voltage performance may advantageously be used in the same super cell or in the same row of series connected super cells. For example, it may be advantageous that cells connected in series within a super cell or within a row of super cells produce matching or approximately matching current under the same illumination.

In step 815 super cells are assembled from the strip solar cells, with a conductive adhesive bonding material disposed between overlapping portions of adjacent solar cells in the super cells. The conductive adhesive bonding material may be applied, for example, by ink jet printing or screen printing.

In step 820 heat and pressure are applied to cure or partially cure the conductive adhesive bonding material between the solar cells in the super cells. In one variation, as each additional solar cell is added to a super cell the conductive adhesive bonding material between the newly added solar cell and its adjacent overlapping solar cell (already part of the super cell) is cured or partially cured, before the next solar cell is added to the super cell. In another variation, more than two solar cells or all solar cells in a super cell may be positioned in the desired overlapping manner before the conductive adhesive bonding material is cured or partially cured. The super cells resulting from this step may optionally be tested and sorted according to their current-voltage performance. Super cells with matching or approximately matching current-voltage performance may advantageously be used in the same row of super cells or in the same solar module. For example, it may be advantageous that super cells or rows of super cells electrically connected in parallel produce matching or approximately matching voltages under the same illumination.

In step 825 the cured or partially cured super cells are arranged and interconnected in the desired module configuration in a layered structured including encapsulant material, a transparent front (sun side) sheet, and a (optionally transparent) back sheet. The layered structure may comprise, for example, a first layer of encapsulant on a glass substrate, the interconnected super cells arranged sun-side down on the first layer of encapsulant, a second layer of encapsulant on the layer of super cells, and a back sheet on the second layer of encapsulant. Any other suitable arrangement may also be used.

In lamination step 830 heat and pressure are applied to the layered structure to form a cured laminate structure.

In one variation of the method of FIG. 17, the conventionally sized solar cells are separated into solar cell strips, after which the conductive adhesive bonding material is applied to each individual solar cell strip. In an alternative variation, the conductive adhesive bonding material is applied to the conventionally sized solar cells prior to separation of the solar cells into solar cell strips.

At curing step 820 the conductive adhesive bonding material may be fully cured, or it may be only partially cured. In the latter case the conductive adhesive bonding material may be initially partially cured at step 820 sufficiently to ease handling and interconnection of the super cells, and fully cured during the subsequent lamination step 830.

In some variations a super cell 100 assembled as an intermediate product in method 800 comprises a plurality of rectangular solar cells 10 arranged with the long sides of adjacent solar cells overlapped and conductively bonded as described above, and interconnects bonded to terminal contacts at opposite ends of the super cell.

Figure 30A:
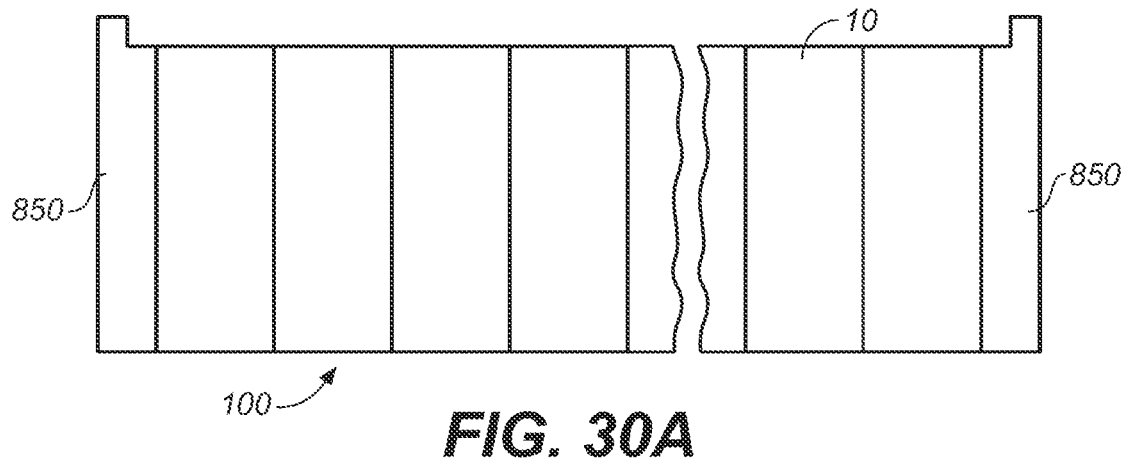
FIG. 30A shows an example super cell with electrical interconnects bonded to its front and rear surface terminal contacts.

FIG. 30A shows an example super cell with electrical interconnects bonded to its front and rear surface terminal contacts. The electrical interconnects run parallel to the terminal edges of the super cell and extend laterally beyond the super cell to facilitate electrical interconnection with an adjacent super cell.

Figure 30B:
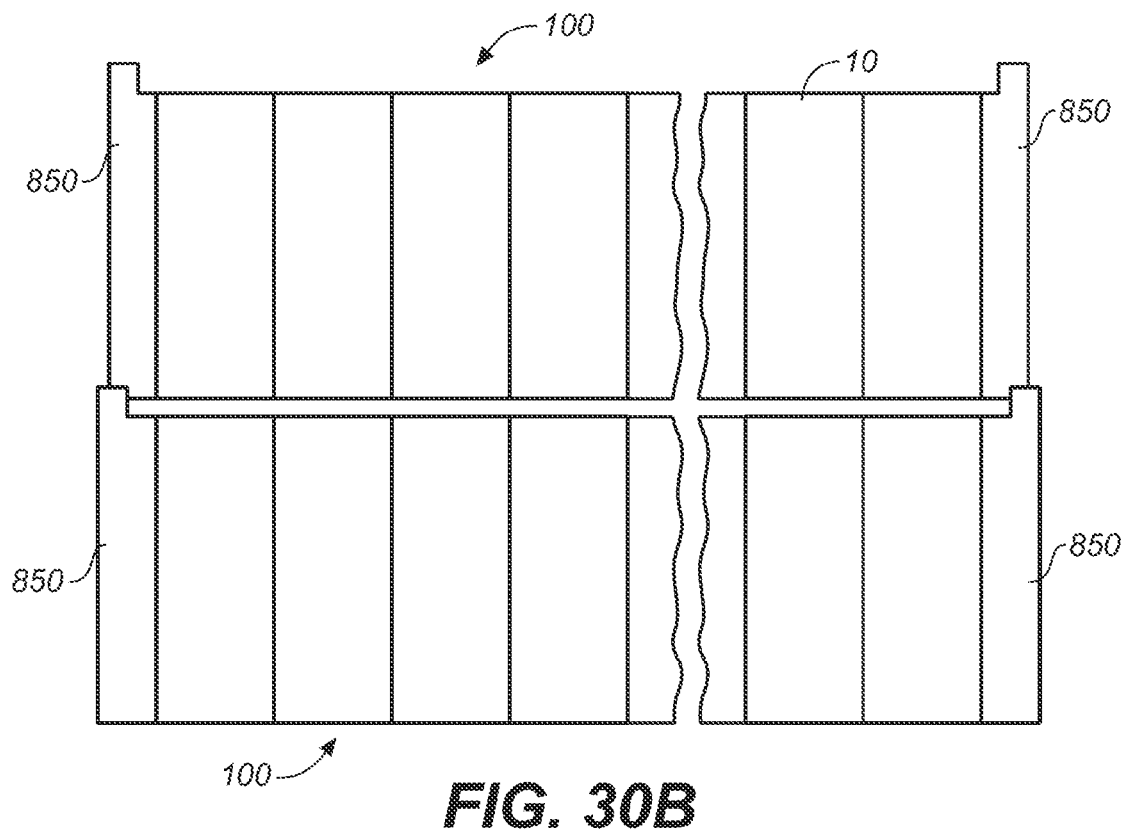
FIG. 30B shows two of the super cells of FIG. 30A interconnected in parallel.

FIG. 30B shows two of the super cells of FIG. 30A interconnected in parallel.

Portions of the interconnects that are otherwise visible from the front of the module may be covered or colored (e.g., darkened) to reduce visible contrast between the interconnect and the super cells, as perceived by a human having normal color vision. In the example illustrated in FIG. 30A, an interconnect 850 is conductively bonded to a front side terminal contact of a first polarity (e.g., + or −) at one end of the super cell (on the right side of the drawing), and another interconnect 850 is conductively bonded to a back side terminal contact of the opposite polarity at the other end of the super cell (on the left side of the drawing). Similarly to the other interconnects described above, interconnects 850 may be conductively bonded to the super cell with the same conductive adhesive bonding material used between solar cells, for example, but this is not required. In the illustrated example, a portion of each interconnect 850 extends beyond the edge of super cell 100 in a direction perpendicular to the long axis of the super cell (and parallel to the long axes of solar cells 10). As shown in FIG. 30B, this allows two or more super cells 100 to be positioned side by side, with the interconnects 850 of one super cell overlapping and conductively bonded to corresponding interconnects 850 on the adjacent super cell to electrically interconnect the two super cells in parallel. Several such interconnects 850 interconnected in series as just described may form a bus for the module. This arrangement may be suitable, for example, when the individual super cell extends the full width or full length of the module (e.g., FIG. 5B). In addition, interconnects 850 may also be used to electrically connect terminal contacts of two adjacent super cells within a row of super cells in series. Pairs or longer strings of such interconnected super cells within a row may be electrically connected in parallel with similarly interconnected super cells in an adjacent row by overlapping and conductively bonding interconnects 850 in one row with interconnects 850 in the adjacent row similarly to as shown in FIG. 30B.

Interconnect 850 may be die cut from a conducting sheet, for example, and may be optionally patterned to increase its mechanical compliance both perpendicular to and parallel to the edge of the super cell to reduce or accommodate stress perpendicular and parallel to the edge of the super cell arising from mismatch between the CTE of the interconnect and that of the super cell. Such patterning may include, for example, slits, slots, or holes (not shown). The mechanical compliance of interconnect 850, and its bond or bonds to the super cell, should be sufficient for the connections to the super cell to survive stress arising from CTE mismatch during the lamination process described in more detail below. Interconnect 850 may be bonded to the super cell with, for example, a mechanically compliant electrically conductive bonding material as described above for use in bonding overlapped solar cells. Optionally, the electrically conductive bonding material may be located only at discrete positions along the edges of the super cell rather than in a continuous line extending substantially the length of the edge of the super cell, to reduce or accommodate stress parallel to the edges of the super cell arising from mismatch between the coefficient of thermal expansion of the electrically conductive bonding material or the interconnects and that of the super cell.

Interconnect 850 may be cut from a thin copper sheet, for example, and may be thinner than conventional conductive interconnects when super cells 100 are formed from solar cells having areas smaller than standard silicon solar cells and therefore operate at lower currents than is conventional. For example, interconnects 850 may be formed from copper sheet having a thickness of about 50 microns to about 300 microns. Interconnects 850 may be sufficiently thin and flexible to fold around and behind the edge of the super cell to which they are bonded, similarly to the interconnects described above.

FIGS. 19A-19D show several example arrangements by which heat and pressure may be applied during method 800 to cure or partially cure the conductive adhesive bonding material between adjacent solar cells in the super cells. Any other suitable arrangement may also be employed.

Figure 19A:
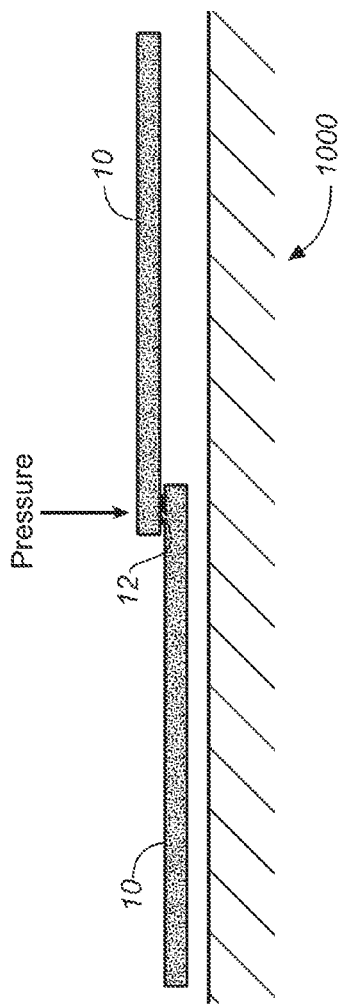

In FIG. 19A, heat and localized pressure are applied to cure or partially cure conductive adhesive bonding material 12 one joint (overlapping region) at a time. The super cell may be supported by a surface 1000 and pressure may be mechanically applied to the joint from above with a bar, pin, or other mechanical contact, for example. Heat may be applied to the joint with hot air (or other hot gas), with an infrared lamp, or by heating the mechanical contact that applies localized pressure to the joint, for example.

Figure 19B:
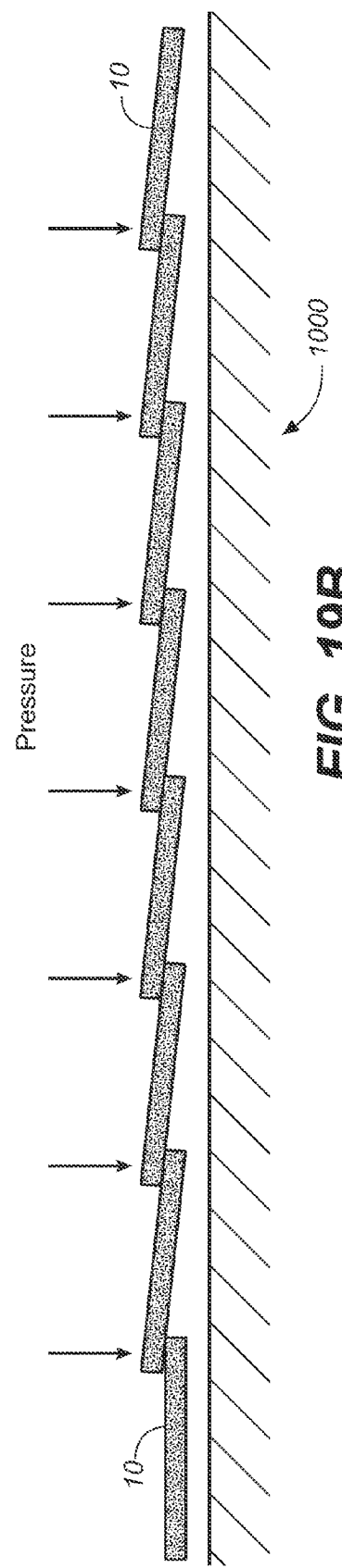

In FIG. 19B, the arrangement of FIG. 19A is extended to a batch process that simultaneously applies heat and localized pressure to multiple joints in a super cell.

In FIG. 19C, an uncured super cell is sandwiched between release liners 1015 and reusable thermoplastic sheets 1020 and positioned on a carrier plate 1010 supported by a surface 1000. The thermoplastic material of sheets 1020 is selected to melt at the temperature at which the super cells are cured. Release liners 1015 may be formed from fiberglass and PTFE, for example, and do not adhere to the super cell after the curing process. Preferably, release liners 1015 are formed from materials that have a coefficient of thermal expansion matching or substantially matching that of the solar cells (e.g., the CTE of silicon). This is because if the CTE of the release liners differs too much from that of the solar cells, then the solar cells and the release liners will lengthen by different amounts during the curing process, which would tend to pull the super cell apart lengthwise at the joints. A vacuum bladder 1005 overlies this arrangement. The uncured super cell is heated from below through surface 1000 and carrier plate 1010, for example, and a vacuum is pulled between bladder 1005 and support surface 1000. As a result bladder 1005 applies hydrostatic pressure to the super cell through the melted thermoplastic sheets 1020.

In FIG. 19D, an uncured super cell is carried by a perforated moving belt 1025 through an oven 1035 that heats the super cell. A vacuum applied through perforations in the belt pulls solar cells 10 toward the belt, thereby applying pressure to the joints between them. The conductive adhesive bonding material in those joints cures as the super cell passes through the oven. Preferably, perforated belt 1025 is formed from materials that have a CTE matching or substantially matching that of the solar cells (e.g., the CTE of silicon). This is because if the CTE of belt 1025 differs too much from that of the solar cells, then the solar cells and the belt will lengthen by different amounts in oven 1035, which will tend to pull the super cell apart lengthwise at the joints.

Figure 18:
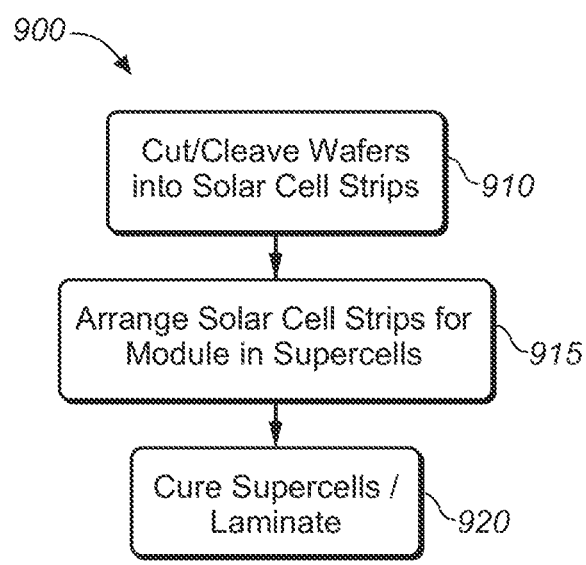
FIG. 18 shows a flow chart for another example method of making a solar module with super cells.

Method 800 of FIG. 17 includes distinct super cell curing and lamination steps, and produces an intermediate super cell product. In contrast, in method 900 shown in FIG. 18 the super cell curing and lamination steps are combined. In step 910, conventionally sized solar cells (e.g., 156 millimeters× 156 millimeters or 125 millimeters×125 millimeters) are cut and/or cleaved to form narrow rectangular solar cell strips. The resulting solar cell strips may optionally be tested and sorted.

In step 915, the solar cell strips are arranged in the desired module configuration in a layered structured including encapsulant material, a transparent front (sun side) sheet, and a back sheet. The solar cell strips are arranged as super cells, with an uncured conductive adhesive bonding material disposed between overlapping portions of adjacent solar cells in the super cells. (The conductive adhesive bonding material may be applied, for example, by ink jet printing or screen printing). Interconnects are arranged to electrically interconnect the uncured super cells in the desired configuration. The layered structure may comprise, for example, a first layer of encapsulant on a glass substrate, the interconnected super cells arranged sun-side down on the first layer of encapsulant, a second layer of encapsulant on the layer of super cells, and a back sheet on the second layer of encapsulant. Any other suitable arrangement may also be used.

In lamination step 920 heat and pressure are applied to the layered structure to cure the conductive adhesive bonding material in the super cells and to form a cured laminate structure. Conductive adhesive bonding material used to bond interconnects to the super cells may be cured in this step as well.

In one variation of method 900, the conventionally sized solar cells are separated into solar cell strips, after which the conductive adhesive bonding material is applied to each individual solar cell strips. In an alternative variation, the conductive adhesive bonding material is applied to the conventionally sized solar cells prior to separation of the solar cells into solar cell strips. For example, a plurality of conventionally sized solar cells may be placed on a large template, conductive adhesive bonding material then dispensed on the solar cells, and the solar cells then simultaneously separated into solar cell strips with a large fixture. The resulting solar cell strips may then be transported as a group and arranged in the desired module configuration as described above.

As noted above, in some variations of method 800 and of method 900 the conductive adhesive bonding material is applied to the conventionally sized solar cells prior to separating the solar cells into solar cell strips. The conductive adhesive bonding material is uncured (i.e., still "wet") when the conventionally sized solar cell is separated to form the solar cell strips. In some of these variations, the conductive adhesive bonding material is applied to a conventionally sized solar cell (e.g. by ink jet or screen printing), then a laser is used to scribe lines on the solar cell defining the locations at which the solar cell is to be cleaved to form the solar cell strips, then the solar cell is cleaved along the scribe lines. In these variations the laser power and/or the distance between the scribe lines and the adhesive bonding material may be selected to avoid incidentally curing or partially curing the conductive adhesive bonding material with heat from the laser. In other variations, a laser is used to scribe lines on a conventionally sized solar cell defining the locations at which the solar cell is to be cleaved to form the solar cell strips, then the conductive adhesive bonding material is applied to the solar cell (e.g. by ink jet or screen printing), then the solar cell is cleaved along the scribe lines. In the latter variations it may be preferable to accomplish the step of applying the conductive adhesive bonding material without incidentally cleaving or breaking the scribed solar cell during this step.

Figure 20A:
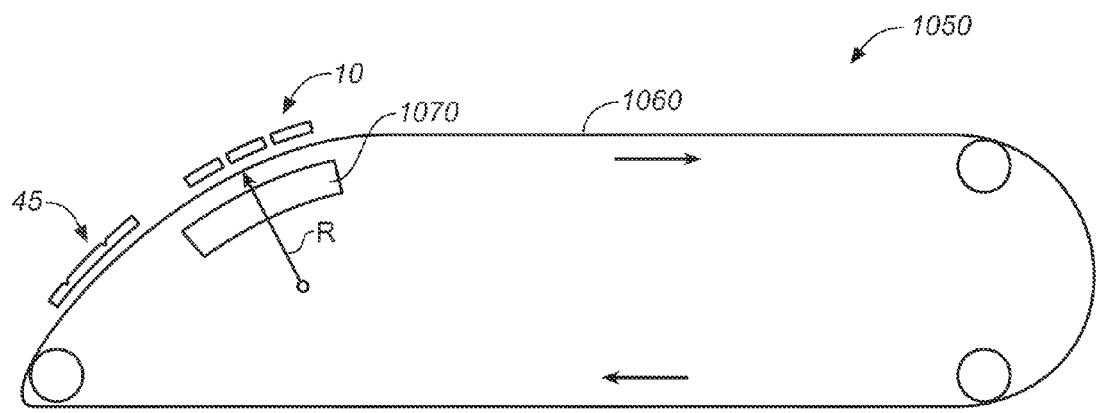
FIGS. 20A-20C schematically illustrate an example apparatus that may be used to cleave scribed solar cells. The apparatus may be particularly advantageous when used to cleave scribed super cells to which conductive adhesive bonding material has been applied.

FIG. 20A schematically illustrates a side view of an example apparatus 1050 that may be used to cleave scribed solar cells to which conductive adhesive bonding material has been applied. (Scribing and application of conductive adhesive bonding material may have occurred in either order). In this apparatus, a scribed conventionally sized solar cell 45 to which conductive adhesive bonding material has been applied is carried by a perforated moving belt 1060 over a curved portion of a vacuum manifold 1070. As solar cell 45 passes over the curved portion of the vacuum manifold, a vacuum applied through the perforations in the belt pulls the bottom surface of solar cell 45 against the vacuum manifold and thereby flexes the solar cell. The radius of curvature R of the curved portion of the vacuum manifold may be selected so that flexing solar cell 45 in this manner cleaves the solar cell along the scribe lines. Advantageously, solar cell 45 may be cleaved by this method without contacting the top surface of solar cell 45 to which the conductive adhesive bonding material has been applied.

Figure 20B:
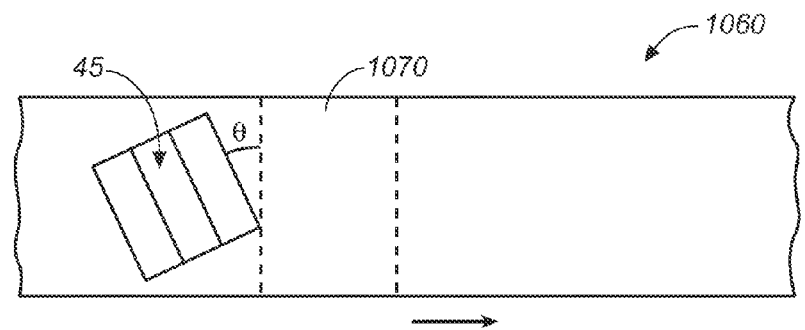
Figure 20C:
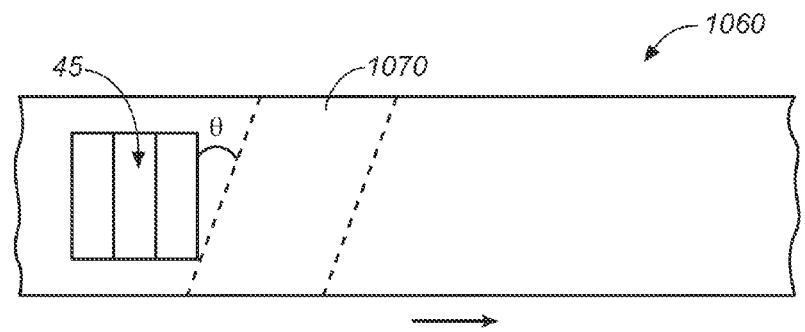

If it is preferred for cleaving to begin at one end of a scribe line (i.e., at one edge of solar cell 45), this may be accomplished with apparatus 1050 of FIG. 20A by for example arranging for the scribe lines to be oriented at an angle 0 to the vacuum manifold so that for each scribe line one end reaches the curved portion of the vacuum manifold before the other end. As shown in FIG. 20B, for example, the solar cells may be oriented with their scribe lines at an angle to the direction of travel of the belt and the manifold oriented perpendicularly to the direction of travel of the belt. As another example, FIG. 20C shows the cells oriented with their scribe lines perpendicular to the direction of travel of the belt, and the manifold oriented at an angle.

Any other suitable apparatus may also be used to cleave scribed solar cells to which conductive adhesive bonding material has been applied to form strip solar cells with pre-applied conductive adhesive bonding material. Such apparatus may, for example, use rollers to apply pressure to the top surface of the solar cell to which the conductive adhesive bonding material has been applied. In such cases it is preferable that the rollers touch the top surface of the solar cell only in regions to which conductive adhesive bonding material has not been applied.

In some variations, solar modules comprise super cells arranged in rows on a white or otherwise reflective back sheet, so that a portion of solar radiation initially unabsorbed by and passing through the solar cells may be reflected by the back sheet back into the solar cells to produce electricity. The reflective back sheet may be visible through the gaps between rows of super cells, which may result in a solar module that appears to have rows of parallel bright (e.g., white) lines running across its front surface. Referring to FIG. 5B, for example, the parallel dark lines running between the rows of super cells 100 may appear as white lines if super cells 100 are arranged on a white back sheet. This may be aesthetically displeasing for some uses of the solar modules, for example on roof tops.

Figure 21:
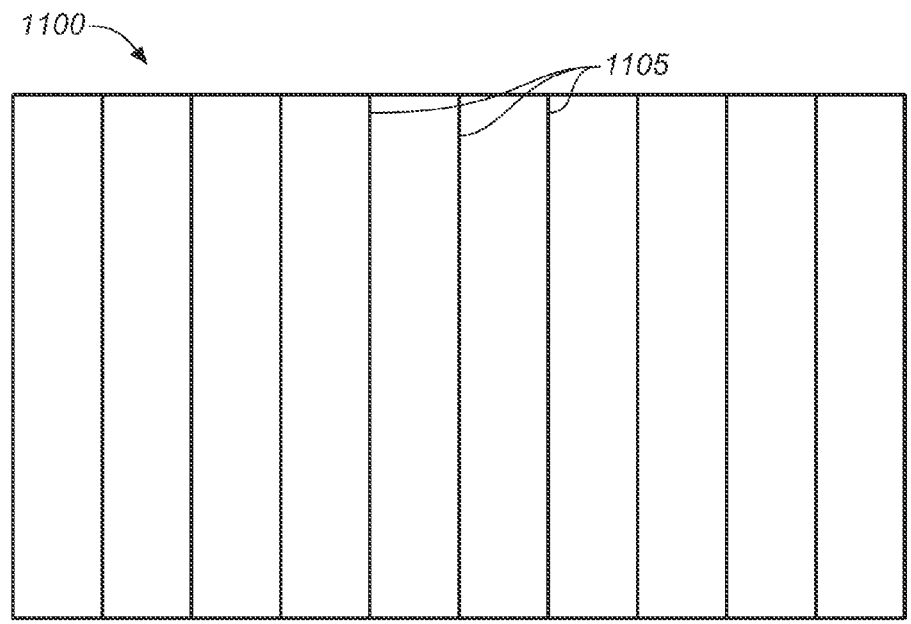
FIG. 21 shows an example white back sheet "zebra striped" with dark lines that may be used in solar modules comprising parallel rows of super cells to reduce visual contrast between the super cells and portions of the back sheet visible from the front of the module.

Referring to FIG. 21, to improve the aesthetic appearance of the solar module, some variations employ a white back sheet 1100 comprising dark stripes 1105 located in positions corresponding to the gaps between rows of the super cells to be arranged on the back sheet. Stripes 1105 are sufficiently wide that the white portions of the back sheet are not visible through gaps between the rows of super cells in the assembled module. This reduces the visual contrast between the super cells and the back sheet, as perceived by a human having normal color vision. The resulting module includes a white back sheet but may have a front surface similar in appearance to that of the modules illustrated in FIGS. 5A-5B, for example. Dark stripes 1105 may be produced with lengths of dark tape, for example, or in any other suitable manner As previously mentioned, shading of individual cells within solar modules can create 'hotspots', wherein power of the non-shaded cells is dissipated in the shaded cell. This dissipated power creates localized temperature spikes that can degrade the modules.

To minimize the potential severity of these hotspots, bypass diodes are conventionally inserted as part of the module. The maximal number of cells between bypass diodes is set to limit the max temperature of the module and prevent irreversible damage on the module. Standard layouts for silicon cells may utilize a bypass diode every 20 or 24 cells, a number that is determined by the typical break down voltage of silicon cells. In certain embodiments, the breakdown voltage may lie in range between about 10-50V. In certain embodiments, the breakdown voltage may be about 10V, about 15V, about 20V, about 25V, about 30V, or about 35V.

According to embodiments, the shingling of strips of cut solar cells with thin thermally conductive adhesives, improves the thermal contact between solar cells. This enhanced thermal contact allows higher degree of thermal spreading than traditional interconnection technologies. Such a thermal heat spreading design based on shingling allows longer strings of solar cells to be used than the twenty-four (or fewer) solar cells per bypass diode to which conventional designs are restricted. Such relaxation in the requirement for frequent bypass diodes according to the thermal spreading facilitated by shingling according to embodiments, may offer one or more benefits. For example, it allows for the creation of module layouts of a variety of solar cell string lengths, unhindered by a need to provide for a large number of bypass diodes.

According to embodiments, thermal spreading is achieved by maintaining a physical and thermal bond with the adjacent cell. This allows for adequate heat dissipation though the bonded joint.

In certain embodiments this joint is maintained at a thickness of about 200 micrometers or less, and runs the length of the solar cell in a segmented pattern. Depending upon the embodiment, the joint may have a thickness of about 200 micrometers or less, of about 150 micrometers or less, of about 125 micrometers or less, of about 100 micrometers or less, of about 90 micrometers or less, of about 80 micrometers or less, of about 70 micrometers or less, of about 50 micrometers, or less, or of about 25 micrometers or less.

An accurate adhesive cure processing may be important to ensuring that a reliable joint is maintained while a thickness is reduced in order to promote thermal spreading between bonded cells.

Being allowed to run longer strings (e.g., more than 24 cells) affords flexibility in the design of solar cells and modules. For example, certain embodiments may utilize strings of cut solar cells that are assembled in a shingled manner. Such configurations may utilize significantly more cells per module than a conventional module.

Absent the thermal spreading property, a bypass diode would be needed every 24 cells. Where the solar cells are cut by ⅙, the bypass diodes per module would be 6 times the conventional module (comprises of 3 uncut cells), adding up to a total of 18 diodes. Thus thermal spreading affords a significant reduction in the number of bypass diodes.

Moreover for every bypass diode, bypass circuitry is needed to complete the bypass electrical path. Each diode requires two interconnections points and conductor routing to connect them to such interconnection points. This creates a complicated circuit, contributing significant expense over standard layout costs associated with assembling a solar module.

By contrast, thermal spreading technology requires only one or even no bypass diodes per module. Such a configuration streamlines a module assembly process, allowing simple automation tools to perform the layout manufacturing steps.

Avoiding the need to bypass protect every 24 cells thus renders the cell module easier to manufacture. Complex tap-outs in the middle of the module and long parallel connections for bypass circuitry, are avoided. This thermal spreading is implemented by creating long shingled strips of cells runing a width and/or length of the module.

In addition to providing thermal heat spreading, shingling according to embodiments also allows improved hotspot performance by reducing a magnitude of current dissipated in a solar cell. Specifically, during a hot spot condition the amount of current dissipated in a solar cell is dependent upon cell area.

Since shingling may cut cells to smaller areas, an amount of current passing through one cell in a hot spot condition is a function of the cut dimensions. During a hot spot condition, the current passes through the lowest resistance path which is usually a cell level defect interface or grain boundary. Reducing this current is a benefit and minimizes reliability risk failure under hot spot conditions.

Figure 22A:
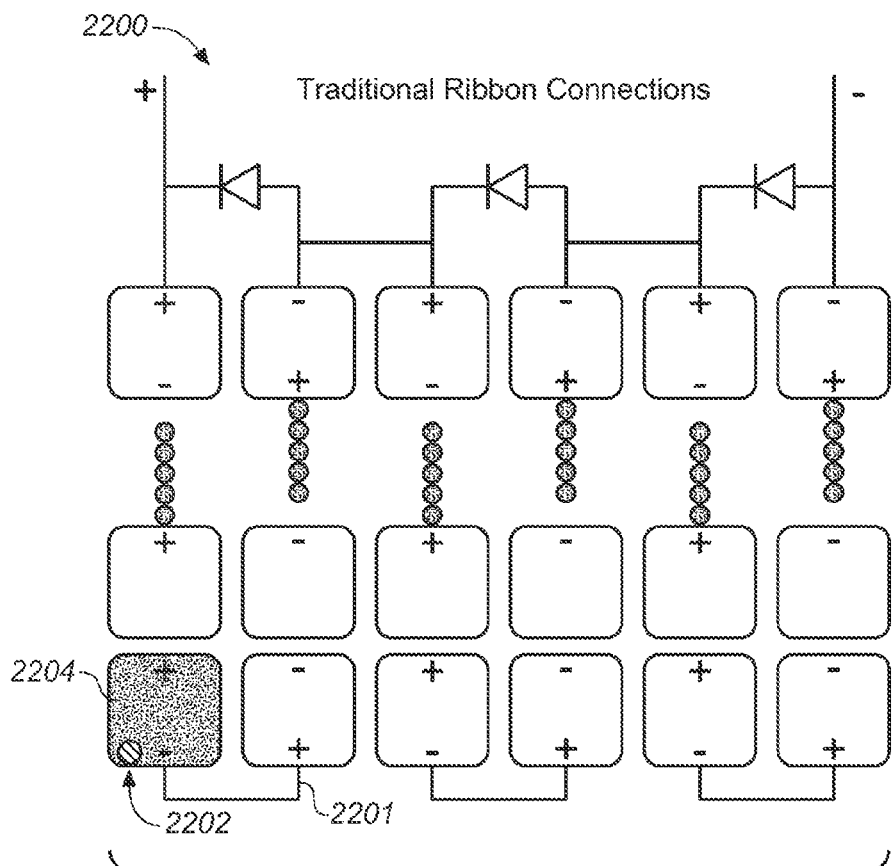
FIG. 22A shows a plan view of a conventional module utilizing traditional ribbon connections under hot spot conditions.

FIG. 22A shows a plan view of a conventional module 2200 utilizing traditional ribbon connections 2201, under hot spot conditions. Here, shading 2202 on one cell 2204 results in heat being localized to that single cell.

Figure 22B:
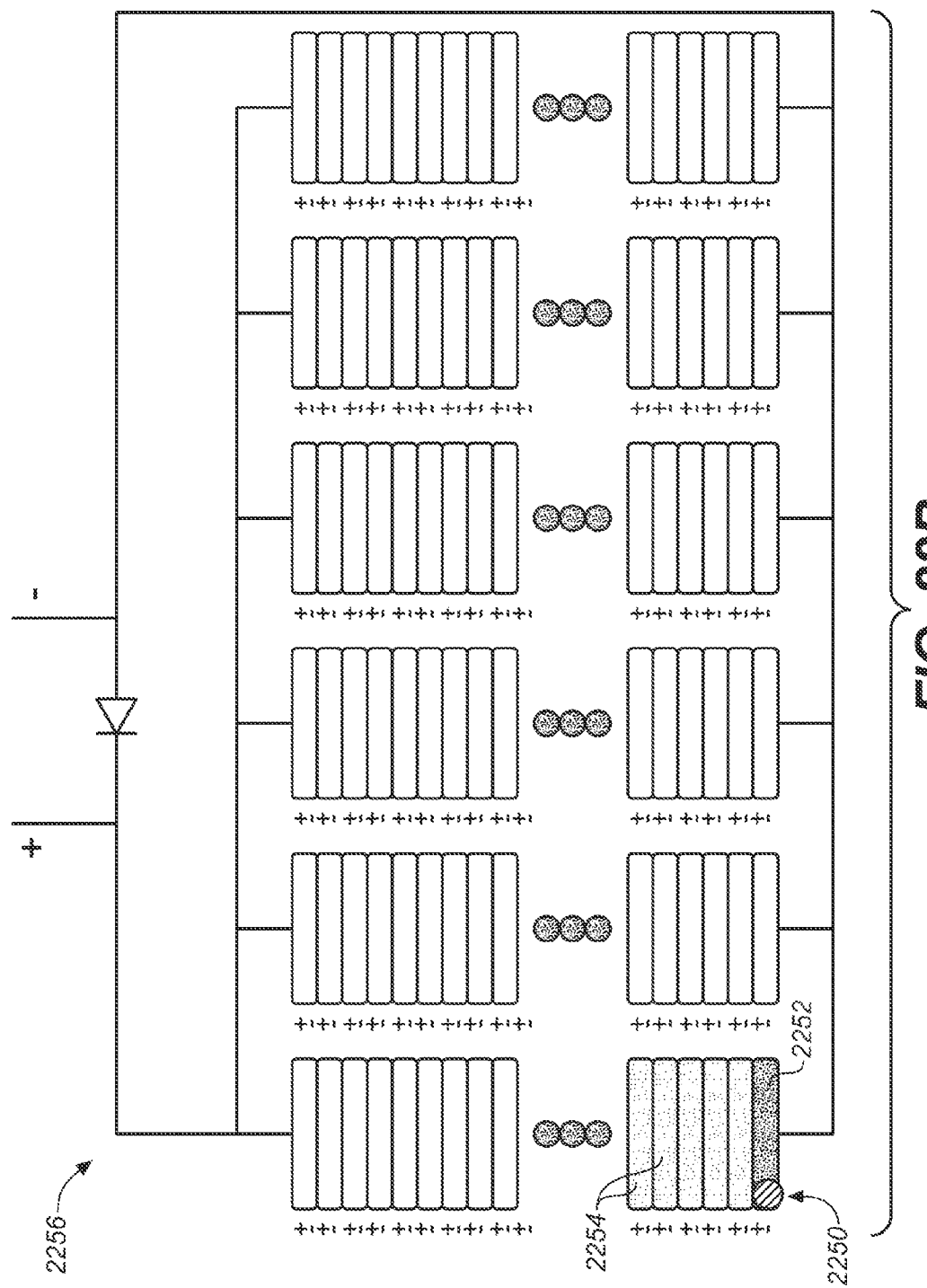
FIG. 22B shows a plan view of a module utilizing thermal spreading according to embodiments, also under hot spot conditions.

By contrast, FIG. 22B shows a plan view of a module utilizing thermal spreading, also under hot spot conditions. Here, shading 2250 on cell 2252 generates heat within that cell. This heat, however, is spread to other electrically and thermally bonded cells 2254 within the module 2256.

It is further noted that the benefit of reduction in dissipated current is multiplied for multi-crystalline solar cells. Such multi-crystalline cells are known to perform poorly under hot spot conditions owing to a high level of defect interfaces.

As indicated above, particular embodiments may employ shingling of chamfered cut cells. In such cases, there is a heat spreading advantage to mirror, along the bond line between each cell with the adjacent cell.

This maximizes the bond length of each overlapping joint. Since the bond joint is major interface for cell-to-cell heat spreading, maximizing this length may ensure the optimum heat spreading is obtained.

Figure 23A:
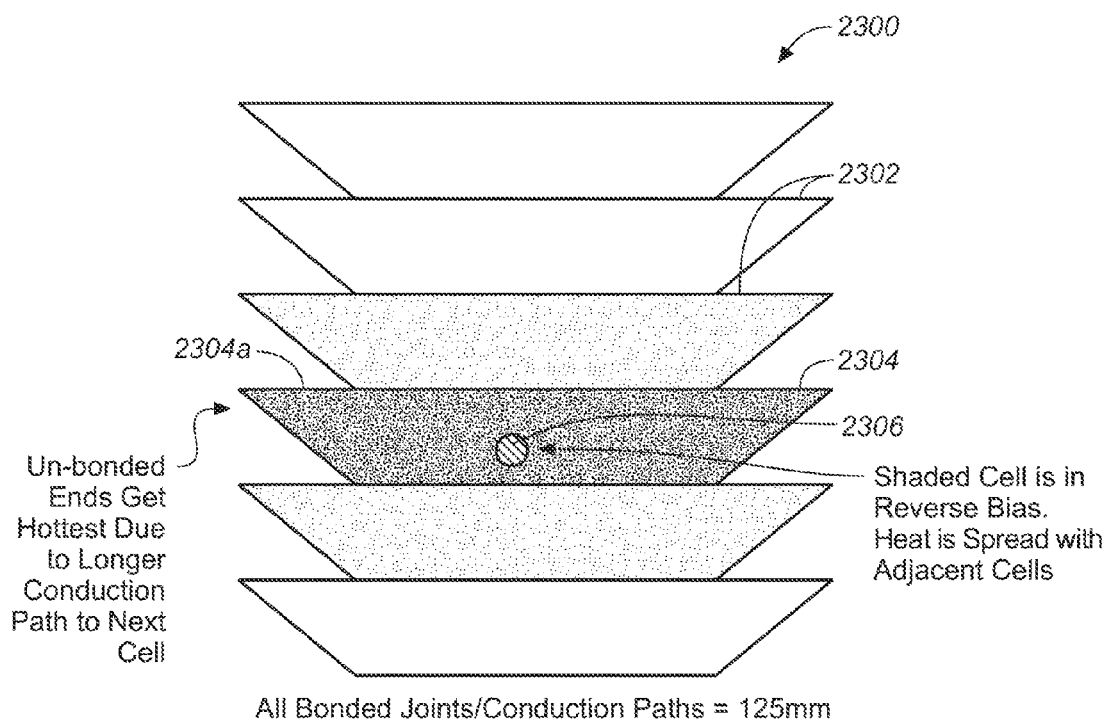
FIGS. 23A-B show examples of super cell string layouts with chamfered cells.

FIG. 23A shows one example of a super cell string layout 2300 with chamfered cells 2302. In this configuration, the chamfered cells are oriented in a same direction, and thus all the bonded joints conduction paths are the same (125 mm).

Shading 2306 on one cell 2304 results in reverse biasing of that cell. Heat is spread to with adjacent cells. Unbonded ends 2304a of the chamfered cell becomes hottest due to a longer conduction length to the next cell.

Figure 23B:
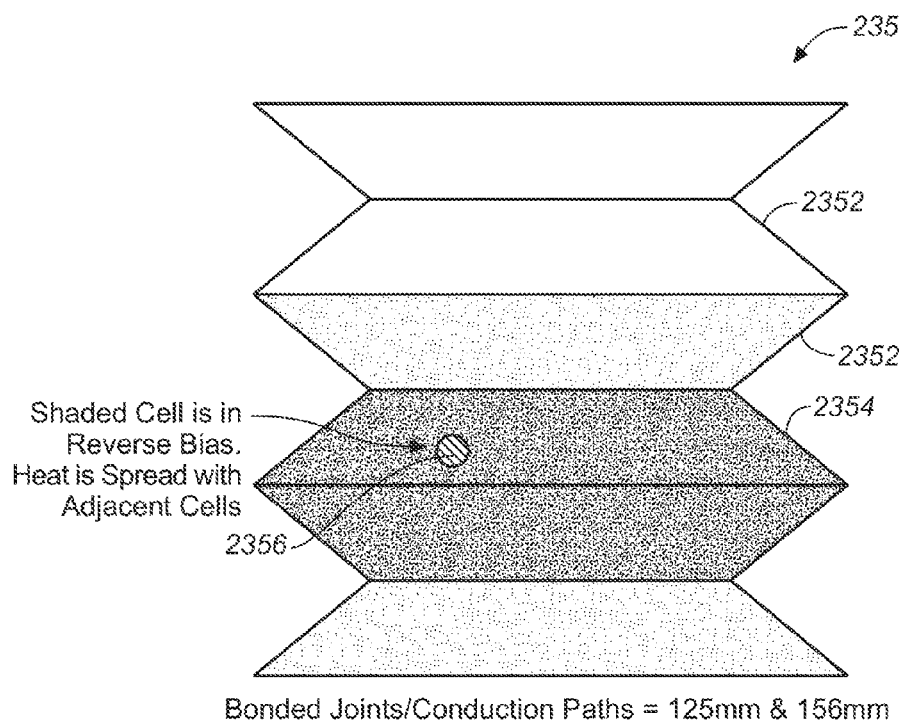

FIG. 23B shows another example of a super cell string layout 2350 with chamfered cells 2352. In this configuration, the chamfered cells are oriented in different directions, with some of the long edges of the chamfered cells facing each other. This results in bonded joint conduction paths of two lengths: 125 mm and 156 mm.

Where a cell 2354 experiences shading 2356, the configuration of FIG. 23B exhibits improved thermal spreading along the longer bond length. FIG. 23B thus shows that the thermal spreading in a super cell with chamfered cells facing each other.

The above discussion has focused upon assembling a plurality of solar cells (which may be cut solar cells) in a shingled manner on a common substrate. This results in the formation of a module having a single electrical interconnect-junction box (or j-box).

In order to gather a sufficient amount of solar energy to be useful, however, an installation typically comprises a number of such modules that are themselves assembled together. According to embodiments, a plurality of solar cell modules may also be assembled in a shingled manner to increase the area efficiency of an array.

In particular embodiments, a module may feature a top conductive ribbon facing a direction of solar energy, and a bottom conductive ribbon facing away from the direction of solar energy.

The bottom ribbon is buried beneath the cells. Thus, it does not block incoming light and adversely impact an area efficiency of the module. By contrast, the top ribbon is exposed and can block the incoming light and adversely impact efficiency.

According to embodiments the modules themselves can be shingled, such that the top ribbon is covered by the neighboring module. FIG. 24 shows a simplified cross-sectional view of such an arrangement 2400, where an end portion 2401 of an adjacent module 2402, serves to overlap the top ribbon 2404 of an instant module 2406. Each module itself comprises a plurality of shingled solar cells 2407.

The bottom ribbon 2408 of the instant module 2406 is buried. It is located on an elevated side of the instant shingled module in order to overlap the next adjacent shingled module.

This shingled module configuration could also provide for additional area on the module for other elements, without adversely impacting a final exposed area of the module array. Examples of module elements that may be positioned in overlapping regions can include but are not limited to, junction boxes (j-boxes) 2410 and/or bus ribbons.

FIG. 25 shows another embodiment of a shingled module configuration 2500. Here, j-boxes 2502, 2504 of the respective adjacent shingled modules 2506 and 2508 are in a mating arrangement 2510 in order to achieve electrical connection between them. This simplifies the configuration of the array of shingled modules by eliminating wiring.

In certain embodiments, the j-boxes could be reinforced and/or combined with additional structural standoffs. Such a configuration could create an integrated tilted module roof mount rack solution, wherein a dimension of the junction box determines a tilt. Such an implementation may be particularly useful where an array of shingled modules is mounted on a flat roof.

Where the modules comprise a glass substrate and a glass cover (glass-glass modules), the modules could be used without additional frame members by shortening an overall module length (and hence an exposed length L resulting from the shingling). Such shortening would allow the modules of the tiled array to survive expected physical loads (e.g., a 5400 Pa snow load limit), without fracturing under the strain.

It is emphasized that the use of super cell structures comprising a plurality of individual solar cells assembled in a shingled manner, readily accommodates changing the length of the module to meet a specific length dictated by physical load and other requirements.

1. A solar module comprising:
   a series connected string of N≥25 rectangular or substantially rectangular solar cells having on average a breakdown voltage greater than about 10 volts, the solar cells grouped into one or more super cells each of which comprises two or more of the solar cells arranged in line with long sides of adjacent solar cells overlapping and conductively bonded to each other with an electrically and thermally conductive adhesive;
  wherein no single solar cell or group of <N solar cells in the string of solar cells is individually electrically connected in parallel with a bypass diode.

2. The solar module of clause 1, wherein N is greater than or equal to 30.

3. The solar module of clause 1, wherein N is greater than or equal to 50.

4. The solar module of clause 1, wherein N is greater than or equal to 100.

5. The solar module of clause 1, wherein the adhesive forms bonds between adjacent solar cells having a thickness perpendicular to the solar cells less than or equal to about 0.1 mm and a thermal conductivity perpendicular to the solar cells greater than or equal to about 1.5 w/m/k.

6. The solar module of clause 1, wherein the N solar cells are grouped into a single super cell.

7. The solar module of clause 1, wherein the super cells are encapsulated in a polymer.

7A. The solar module of clause 7 wherein the polymer comprises a thermoplastic olefin polymer.

7B. The solar module of clause 7 wherein the polymer is sandwiched between a glass front and back sheets.

7C. The solar module of clause 7B wherein the back sheets comprise glass.

8. The solar module of clause 1, wherein the solar cells are silicon solar cells.

9. A solar module comprising:
  a super cell substantially spanning a full length or width of the solar module parallel to an edge of the solar module, the super cell comprising a series connected string of N rectangular or substantially rectangular solar cells having on average a breakdown voltage greater than about 10 volts arranged in line with long sides of adjacent solar cells overlapping and conductively bonded to each other with an electrically and thermally conductive adhesive;
  wherein no single solar cell or group of <N solar cells in the super cell is individually electrically connected in parallel with a bypass diode.

10. The solar module of clause 9, wherein N>24.

11. The solar module of clause 9, wherein the super cell has a length in the direction of current flow of at least about 500 mm.

12. The solar module of clause 9, wherein the super cells are encapsulated in a thermoplastic olefin polymer sandwiched between glass front and back sheets.

13. A super cell comprising:
  a plurality of silicon solar cells each comprising:
    rectangular or substantially rectangular front and back surfaces with shapes defined by first and second oppositely positioned parallel long sides and two oppositely positioned short sides, at least portions of the front surfaces to be exposed to solar radiation during operation of the string of solar cells;
    an electrically conductive front surface metallization pattern disposed on the front surface and comprising at least one front surface contact pad positioned adjacent to the first long side; and
    an electrically conductive back surface metallization pattern disposed on the back surface and comprising at least one back surface contact pad positioned adjacent the second long side;
  wherein the silicon solar cells are arranged in line with first and second long sides of adjacent silicon solar cells overlapping and with front surface and back surface contact pads on adjacent silicon solar cells overlapping and conductively bonded to each other with a conductive adhesive bonding material to electrically connect the silicon solar cells in series; and
  wherein the front surface metallization pattern of each silicon solar cell comprises a barrier configured to substantially confine the conductive adhesive bonding material to at least one front surface contact pad prior to curing of the conductive adhesive bonding material during manufacturing of the super cell.

14. The super cell of clause 13, wherein for each pair of adjacent and overlapping silicon solar cells, the barrier on the front surface of one of the silicon solar cells is overlapped and hidden by a portion of the other silicon solar cell, thereby substantially confining the conductive adhesive bonding material to overlapped regions of the front surface of the silicon solar cell prior to curing of the conductive adhesive bonding material during manufacturing of the super cell.

15. The super cell of clause 13, wherein the barrier comprises a continuous conductive line running parallel to and for substantially the full length of the first long side, with at least one front surface contact pad located between the continuous conductive line and the first long side of the solar cell.

16. The super cell of clause 15, wherein the front surface metallization pattern comprises fingers electrically connected to the at least one front surface contact pads and running perpendicularly to the first long side, and the continuous conductive line electrically interconnects the fingers to provide multiple conductive paths from each finger to at least one front surface contact pad.

17. The super cell of clause 13, wherein the front surface metallization pattern comprises a plurality of discrete contact pads arranged in a row adjacent to and parallel to the first long side, and the barrier comprises a plurality of features forming separate barriers for each discrete contact pad that substantially confine the conductive adhesive bonding material to the discrete contact pads prior to curing of the conductive adhesive bonding material during manufacturing of the super cell.

18. The super cell of clause 17, wherein the separate barriers abut and are taller than their corresponding discrete contact pads.

19. A super cell comprising:
  a plurality of silicon solar cells each comprising:
    rectangular or substantially rectangular front and back surfaces with shapes defined by first and second oppositely positioned parallel long sides and two oppositely positioned short sides, at least portions of the front surfaces to be exposed to solar radiation during operation of the string of solar cells;
    an electrically conductive front surface metallization pattern disposed on the front surface and comprising at least one front surface contact pad positioned adjacent to the first long side; and
    an electrically conductive back surface metallization pattern disposed on the back surface and comprising at least one back surface contact pad positioned adjacent the second long side;
  wherein the silicon solar cells are arranged in line with first and second long sides of adjacent silicon solar cells overlapping and with front surface and back surface contact pads on adjacent silicon solar cells overlapping and conductively bonded to each other with a conductive adhesive bonding material to electrically connect the silicon solar cells in series; and wherein the back surface metallization pattern of each silicon solar cell comprises a barrier configured to substantially confine the conducive adhesive bonding material to the at least one back surface contact pads prior to curing of the conductive adhesive bonding material during manufacturing of the super cell.

20. The super cell of clause 19, wherein the back surface metallization pattern comprises one or more discrete contact pads arranged in a row adjacent to and parallel to the second long side, and the barrier comprises a plurality of features forming separate barriers for each discrete contact pad that substantially confine the conductive adhesive bonding material to the discrete contact pads prior to curing of the conductive adhesive bonding material during manufacturing of the super cell.

21. The super cell of clause 20, wherein the separate barriers abut and are taller than their corresponding discrete contact pads.

22. A method of making a string of solar cells, the method comprising:
dicing one or more pseudo square silicon wafers along a plurality of lines parallel to a long edge of each wafer to form a plurality of rectangular silicon solar cells each having substantially the same length along its long axis; and
arranging the rectangular silicon solar cells in line with long sides of adjacent solar cells overlapping and conductively bonded to each other to electrically connect the solar cells in series;
wherein the plurality of rectangular silicon solar cells comprises at least one rectangular solar cell having two chamfered corners corresponding to corners or to portions of corners of the pseudo square wafer, and one or more rectangular silicon solar cells each lacking chamfered corners; and
wherein the spacing between parallel lines along which the pseudo square wafer is diced is selected to compensate for the chamfered corners by making the width perpendicular to the long axis of the rectangular silicon solar cells that comprise chamfered corners greater than the width perpendicular to the long axis of the rectangular silicon solar cells that lack chamfered corners, so that each of the plurality of rectangular silicon solar cells in the string of solar cells has a front surface of substantially the same area exposed to light in operation of the string of solar cells.

23. A string of solar cells comprising:
a plurality of silicon solar cells arranged in line with end portions of adjacent solar cells overlapping and conductively bonded to each other to electrically connect the solar cells in series;
wherein at least one of the silicon solar cells has chamfered corners that correspond to corners or portions of corners of a pseudo square silicon wafer from which it was diced, at least one of the silicon solar cells lacks chamfered corners, and each of the silicon solar cells has a front surface of substantially the same area exposed to light during operation of the string of solar cells.

24. A method of making two or more strings of solar cells, the method comprising:
dicing one or more pseudo square silicon wafers along a plurality of lines parallel to a long edge of each wafer to form a first plurality of rectangular silicon solar cells comprising chamfered corners corresponding to corners or portions of corners of the pseudo square silicon wafers and a second plurality of rectangular silicon solar cells each of a first length spanning a full width of the pseudo square silicon wafers and lacking chamfered corners;
removing the chamfered corners from each of the first plurality of rectangular silicon solar cells to form a third plurality of rectangular silicon solar cells each of a second length shorter than the first length and lacking chamfered corners;
arranging the second plurality of rectangular silicon solar cells in line with long sides of adjacent rectangular silicon solar cells overlapping and conductively bonded to each other to electrically connect the second plurality of rectangular silicon solar cells in series to form a solar cell string having a width equal to the first length; and
arranging the third plurality of rectangular silicon solar cells in line with long sides of adjacent rectangular silicon solar cells overlapping and conductively bonded to each other to electrically connect the third plurality of rectangular silicon solar cells in series to form a solar cell string having a width equal to the second length.

25. A method of making two or more strings of solar cells, the method comprising:
dicing one or more pseudo square silicon wafers along a plurality of lines parallel to a long edge of each wafer to form a first plurality of rectangular silicon solar cells comprising chamfered corners corresponding to corners or portions of corners of the pseudo square silicon wafers and a second plurality of rectangular silicon solar cells lacking chamfered corners;
arranging the first plurality of rectangular silicon solar cells in line with long sides of adjacent rectangular silicon solar cells overlapping and conductively bonded to each other to electrically connect the first plurality of rectangular silicon solar cells in series; and
arranging the second plurality of rectangular silicon solar cells in line with long sides of adjacent rectangular silicon solar cells overlapping and conductively bonded to each other to electrically connect the second plurality of rectangular silicon solar cells in series.

26. A method of making a solar module, the method comprising:
dicing each of a plurality of pseudo square silicon wafers along a plurality of lines parallel to a long edge of the wafer to form from the plurality of pseudo square silicon wafers a plurality of rectangular silicon solar cells comprising chamfered corners corresponding to corners of the pseudo square silicon wafers and a plurality of rectangular silicon solar cells lacking chamfered corners;
arranging at least some of the rectangular silicon solar cells lacking chamfered corners to form a first plurality of super cells each of which comprises only rectangular silicon solar cells lacking chamfered corners arranged in line with long sides of the silicon solar cells overlapping and conductively bonded to each other to electrically connect the silicon solar cells in series;
arranging at least some of the rectangular silicon solar cells comprising chamfered corners to form a second plurality of super cells each of which comprises only rectangular silicon solar cells comprising chamfered corners arranged in line with long sides of the silicon solar cells overlapping and conductively bonded to each other to electrically connect the silicon solar cells in series; and
arranging the super cells in parallel rows of super cells of substantially equal length to form a front surface of the solar module, with each row comprising only super cells from the first plurality of super cells or only super cells from the second plurality of super cells.

27. The solar module of clause 26, wherein two of the rows of super cells adjacent to parallel opposite edges of the solar module comprise only super cells from the second plurality of super cells, and all other rows of super cells comprise only super cells from the first plurality of super cells.

28. The solar module of clause 27, wherein the solar module comprises a total of six rows of super cells.

29. A super cell comprising:
a plurality of silicon solar cells arranged in line in a first direction with end portions of adjacent silicon solar cells overlapping and conductively bonded to each other to electrically connect the silicon solar cells in series; and
an elongated flexible electrical interconnect with its long axis oriented parallel to a second direction perpendicular to the first direction, conductively bonded to a front or back surface of an end one of the silicon solar cells at three or more discrete locations arranged along the second direction, running at least the full width of the end solar cell in the second direction, having a conductor thickness less than or equal to about 100 microns measured perpendicularly to the front or rear surface of the end silicon solar cell, providing a resistance to current flow in the second direction of less than or equal to about 0.012 Ohms, and configured to provide flexibility accommodating differential expansion in the second direction between the end silicon solar cell and the interconnect for a temperature range of about −40° C. to about 85° C.

30. The super cell of clause 29, wherein the flexible electrical interconnect has a conductor thickness less than or equal to about 30 microns measured perpendicularly to the front and rear surfaces of the end silicon solar cell.

31. The super cell of clause 29, wherein the flexible electrical interconnect extends beyond the super cell in the second direction to provide for electrical interconnection to at least a second super cell positioned parallel to and adjacent the super cell in a solar module.

32. The super cell of clause 29, wherein the flexible electrical interconnect extends beyond the super cell in the first direction to provide for electrical interconnection to a second super cell positioned parallel to and in line with the super cell in a solar module.

33. A solar module comprising:
a plurality of super cells arranged in two or more parallel rows spanning a width of the module to form a front surface of the module, each super cell comprising a plurality of silicon solar cells arranged in line with end portions of adjacent silicon solar cells overlapping and conductively bonded to each other to electrically connect the silicon solar cells in series;
wherein at least an end of a first super cell adjacent an edge of the module in a first row is electrically connected to an end of a second super cell adjacent the same edge of the module in a second row via a flexible electrical interconnect that is bonded to the front surface of the first super cell at a plurality of discrete locations with an electrically conductive adhesive bonding material, runs parallel to the edge of the module, and at least a portion of which folds around the end of the first super cell and is hidden from view from the front of the module.

34. The solar module of clause 33, wherein surfaces of the flexible electrical interconnect on the front surface of the module are covered or colored to reduce visible contrast with the super cells.

35. The solar module of clause 33, wherein the two or more parallel rows of super cells are arranged on a white back sheet to form a front surface of the solar module to be illuminated by solar radiation during operation of the solar module, the white back sheet comprises parallel darkened stripes having locations and widths corresponding to locations and widths of gaps between the parallel rows of super cells, and white portions of the back sheets are not visible through the gaps between the rows.

36. A method of making a string of solar cells, the method comprising:
laser scribing one or more scribe lines on each of one or more silicon solar cells to define a plurality of rectangular regions on the silicon solar cells,
applying an electrically conductive adhesive bonding material to the one or more scribed silicon solar cells at one or more locations adjacent a long side of each rectangular region;
separating the silicon solar cells along the scribe lines to provide a plurality of rectangular silicon solar cells each comprising a portion of the electrically conductive adhesive bonding material disposed on its front surface adjacent a long side;
arranging the plurality of rectangular silicon solar cells in line with long sides of adjacent rectangular silicon solar cells overlapping in a shingled manner with a portion of the electrically conductive adhesive bonding material disposed in between; and
curing the electrically conductive bonding material, thereby bonding adjacent overlapping rectangular silicon solar cells to each other and electrically connecting them in series.

37. A method of making a string of solar cells, the method comprising:
laser scribing one or more scribe lines on each of one or more silicon solar cells to define a plurality of rectangular regions on the silicon solar cells, each solar cell comprising a top surface and an oppositely positioned bottom surface;
applying an electrically conductive adhesive bonding material to portions of the top surfaces of the one or more silicon solar cells;
applying a vacuum between the bottom surfaces of the one or more silicon solar cells and a curved supporting surface to flex the one or more silicon solar cells against the curved supporting surface and thereby cleave the one or more silicon solar cells along the scribe lines to provide a plurality of rectangular silicon solar cells each comprising a portion of the electrically conductive adhesive bonding material disposed on its front surface adjacent a long side;
arranging the plurality of rectangular silicon solar cells in line with long sides of adjacent rectangular silicon solar cells overlapping in a shingled manner with a portion of the electrically conductive adhesive bonding material disposed in between; and
curing the electrically conductive bonding material, thereby bonding adjacent overlapping rectangular silicon solar cells to each other and electrically connecting them in series.

38. The method of clause 37, comprising applying the electrically conductive adhesive bonding material to the one or more silicon solar cells, then laser scribing the one or more scribe lines on each of the one or more silicon solar cells.

39. The method of clause 37, comprising laser scribing the one or more scribe lines on each of the one or more silicon solar cells, then applying the electrically conductive adhesive bonding material to the one or more silicon solar cells.

40. A solar module comprising:
a plurality of super cells arranged in two or more parallel rows to form a front surface of the solar module, each super cell comprising a plurality of silicon solar cells arranged in line with end portions of adjacent silicon solar cells overlapping and conductively bonded to each other to electrically connect the silicon solar cells in series, each super cell comprising a front surface end contact at one end of the super cell and a back surface end contact of opposite polarity at an opposite end of the super cell;
wherein a first row of super cells comprises a first super cell arranged with its front surface end contact adjacent and parallel to a first edge of the solar module, and the solar module comprises a first flexible electrical interconnect that is elongated and runs parallel to the first edge of the solar module, is conductively bonded to the front surface end contact of the first super cell, and occupies only a narrow portion of the front surface of the solar module adjacent to the first edge of the solar module and no wider than about 1 centimeter measured perpendicularly to the first edge of the solar module.

41. The solar module of clause 40, wherein a portion of the first flexible electrical interconnect extends around the end of the first super cell nearest to the first edge of the solar module, and behind the first super cell.

42. The solar module of clause 40, wherein the first flexible interconnect comprises a thin ribbon portion conductively bonded to the front surface end contact of the first super cell and a thicker portion running parallel to the first edge of the solar module.

43. The solar module of clause 40, wherein the first flexible interconnect comprises a thin ribbon portion conductively bonded to the front surface end contact of the first super cell and a coiled ribbon portion running parallel to the first edge of the solar module.

44. The solar module of clause 40, wherein a second row of super cells comprises a second super cell arranged with its front surface end contact adjacent to and parallel to the first edge of the solar module, and the front surface end contact of the first super cell is electrically connected to the front surface end contact of the second super cell via the first flexible electrical interconnect.

45. The solar module of clause 40, wherein the back surface end contact of the first super cell is located adjacent to and parallel to a second edge of the solar module opposite from the first edge of the solar module, comprising a second flexible electrical interconnect that is elongated and runs parallel to the second edge of the solar module, is conductively bonded to the back surface end contact of the first super cell, and lies entirely behind the super cells.

46. The solar module of clause 45, wherein:
a second row of super cells comprises a second super cell arranged with its front surface end contact adjacent to and parallel to the first edge of the solar module and its back surface end contact located adjacent to and parallel to the second edge of the solar module;
the front surface end contact of the first super cell is electrically connected to the front surface end contact of the second super cell via the first flexible electrical interconnect; and
the back surface end contact of the first super cell is electrically connected to the back surface end contact of the second super cell via the second flexible electrical interconnect.

47. The solar module of clause 40, comprising:
a second super cell arranged in the first row of super cells in series with the first super cell and with its back surface end contact adjacent a second edge of the solar module opposite from the first edge of the solar module; and
a second flexible electrical interconnect that is elongated and runs parallel to the second edge of the solar module, is conductively bonded to the back surface end contact of the first super cell, and lies entirely behind the super cells.

48. The solar module of clause 47, wherein:
a second row of super cells comprises a third super cell and a fourth super cell arranged in series with a front surface end contact of the third super cell adjacent the first edge of the solar module and the back surface end contact of the fourth super cell adjacent the second edge of the solar module; and
the front surface end contact of the first super cell is electrically connected to the front surface end contact of the third super cell via the first flexible electrical interconnect and the back surface end contact of the second super cell is electrically connected to the back surface end contact of the fourth super cell via the second flexible electrical interconnect.

49. The solar module of clause 40, wherein the super cells are arranged on a white back sheet that comprises parallel darkened stripes having locations and widths corresponding to locations and widths of gaps between the parallel rows of super cells, and white portions of the back sheets are not visible through the gaps between the rows.

50. The solar module of clause 40, wherein all portions of the first flexible electrical interconnect located on the front surface of the solar module are covered or colored to reduce visible contrast with the super cells.

51. The solar module of clause 40, wherein:
each silicon solar cell comprises:
rectangular or substantially rectangular front and back surfaces with shapes defined by first and second oppositely positioned parallel long sides and two oppositely positioned short sides, at least portions of the front surfaces to be exposed to solar radiation during operation of the string of solar cells;
an electrically conductive front surface metallization pattern disposed on the front surface and comprising a plurality of fingers running perpendicular to the long sides and a plurality of discrete front surface contact pads positioned in a row adjacent to the first long side, each front surface contact pad electrically connected to at least one of the fingers; and
an electrically conductive back surface metallization pattern disposed on the back surface and comprising a plurality of discrete back surface contact pads positioned in a row adjacent the second long side; and
within each super cell the silicon solar cells are arranged in line with first and second long sides of adjacent silicon solar cells overlapping and with corresponding discrete front surface contact pads and discrete back surface contact pads on adjacent silicon solar cells aligned, overlapping, and conductively bonded to each other with a conductive adhesive bonding material to electrically connect the silicon solar cells in series.

52. The solar module of clause 51, wherein the front surface metallization pattern of each silicon solar cell comprises a plurality of thin conductors electrically interconnecting adjacent discrete front surface contact pads, and each thin conductor is thinner than the width of the discrete contact pads measured perpendicularly to the long sides of the solar cells.

53. The solar module of clause 51, wherein the conductive adhesive bonding material is substantially confined to the locations of the discrete front surface contact pads by features of the front surface metallization pattern that form one or more barriers adjacent to the discrete front surface contact pads.

54. The solar module of clause 51, wherein the conductive adhesive bonding material is substantially confined to the locations of the discrete back surface contact pads by features of the back surface metallization pattern that form one or more barriers adjacent to the discrete back surface contact pad.

55. A method of making a solar module, the method comprising:
assembling a plurality of super cells, each super cell comprising a plurality of rectangular silicon solar cells arranged in line with end portions on long sides of adjacent rectangular silicon solar cells overlapping in a shingled manner;
curing an electrically conductive bonding material disposed between the overlapping end portions of adjacent rectangular silicon solar cells by applying heat and pressure to the super cells, thereby bonding adjacent overlapping rectangular silicon solar cells to each other and electrically connecting them in series;
arranging and interconnecting the super cells in a desired solar module configuration in a stack of layers comprising an encapsulant; and
applying heat and pressure to the stack of layers to form a laminated structure.

56. The method of clause 55, comprising curing or partially curing the electrically conductive bonding material by applying heat and pressure to the super cells prior to applying heat and pressure to the stack of layers to form the laminated structure, thereby forming cured or partially cured super cells as an intermediate product before forming the laminated structure.

57. The method of clause 56, wherein as each additional rectangular silicon solar cell is added to a super cell during assembly of the super cell, the electrically conductive adhesive bonding material between the newly added solar cell and its adjacent overlapping solar cell is cured or partially cured before another rectangular silicon solar cell is added to the super cell.

58. The method of clause 56, comprising curing or partially curing all of the electrically conductive bonding material in a super cell in the same step.

59. The method of clause 56, comprising:
partially curing the electrically conductive bonding material by applying heat and pressure to the super cells prior to applying heat and pressure to the stack of layers to form a laminated structure, thereby forming partially cured super cells as an intermediate product before forming the laminated structure; and
completing curing of the electrically conductive bonding material while applying heat and pressure to the stack of layers to form the laminated structure.

60. The method of clause 55, comprising curing the electrically conductive bonding material while applying heat and pressure to the stack of layers to form a laminated structure, without forming cured or partially cured super cells as an intermediate product before forming the laminated structure.

61. The method of clause 55, comprising dicing one or more silicon solar cells into rectangular shapes to provide the rectangular silicon solar cells.

62. The method of clause 61, comprising applying the electrically conductive adhesive bonding material to the one or more silicon solar cells before dicing the one or more silicon solar cells to provide rectangular silicon solar cells with pre-applied electrically conductive adhesive bonding material.

63. The method of clause 62, comprising applying the electrically conductive adhesive bonding material to the one or more silicon solar cells, then using a laser to scribe one or more lines on each of the one or more silicon solar cells, then cleaving the one or more silicon solar cells along the scribed lines.

64. The method of clause 62, comprising using a laser to scribe one or more lines on each of the one or more silicon solar cells, then applying the electrically conductive adhesive bonding material to the one or more silicon solar cells, then cleaving the one or more silicon solar cells along the scribed lines.

65. The method of clause 62, wherein the electrically conductive adhesive bonding material is applied to a top surface of each of the one or more silicon solar cells and not to an oppositely positioned bottom surface of each of the one or more silicon solar cells, comprising applying a vacuum between the bottom surfaces of the one or more silicon solar cells and a curved supporting surface to flex the one or more silicon solar cells against the curved supporting surface and thereby cleave the one or more silicon solar cells along scribe lines.

66. The method of clause 61, comprising applying the electrically conductive adhesive bonding material to the rectangular silicon solar cells after dicing the one or more silicon solar cells to provide the rectangular silicon solar cells.

67. The method of clause 55, wherein the conductive adhesive bonding material has a glass transition temperature of less than or equal to about 0° C.

Figure 26:
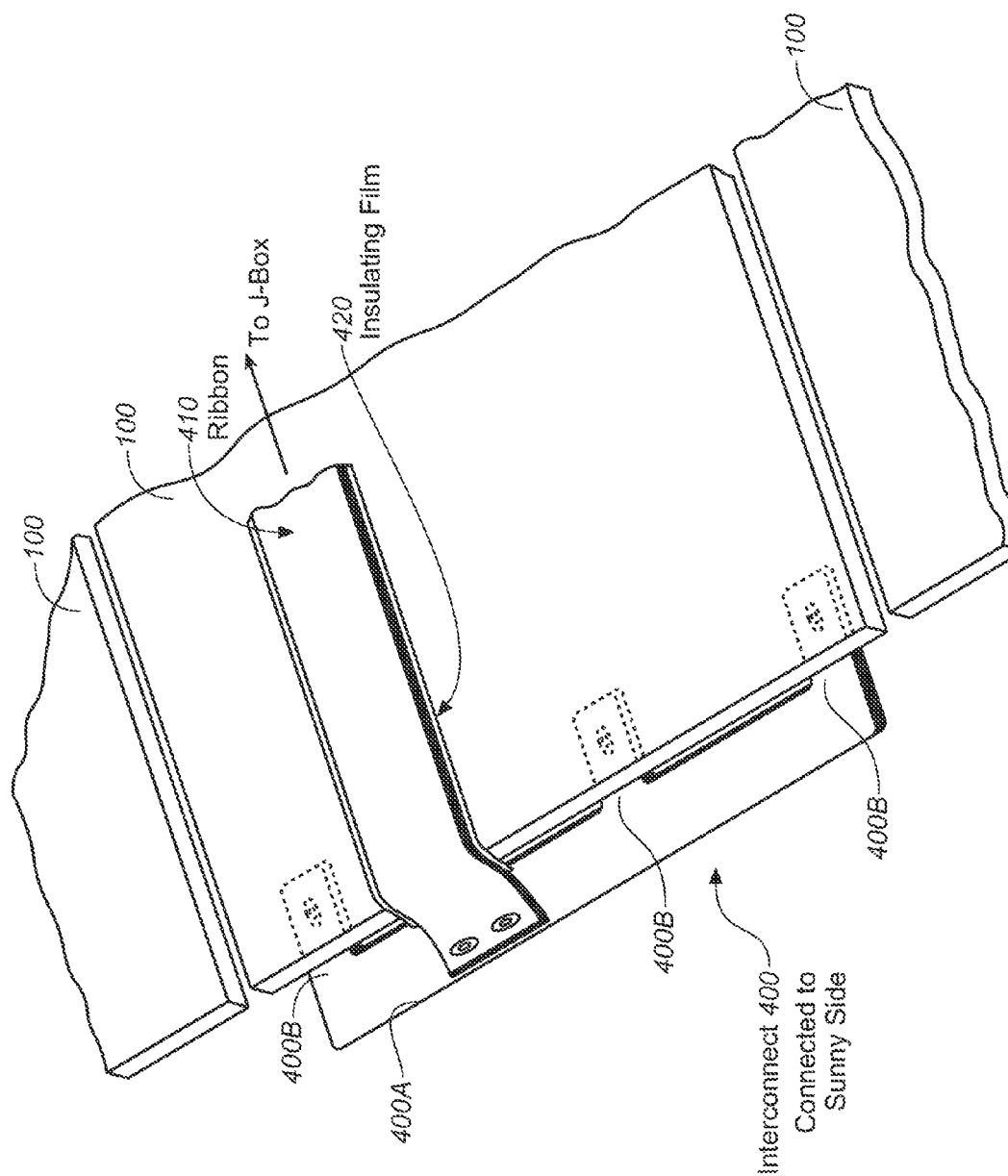
FIG. 26 shows a diagram of the rear (shaded) surface of a solar module illustrating an example electrical interconnection of the front (sun side) surface terminal electrical contacts of a shingled super cell to a junction box on the rear side of the module.

FIG. 26 shows a diagram of the rear (shaded) surface of a solar module illustrating an example electrical interconnection of the front (sun side) surface terminal electrical contacts of a shingled super cell to a junction box on the rear side of the module. The front surface terminal contacts of the shingled super cell may be located adjacent to an edge of the module.

Figure 27:
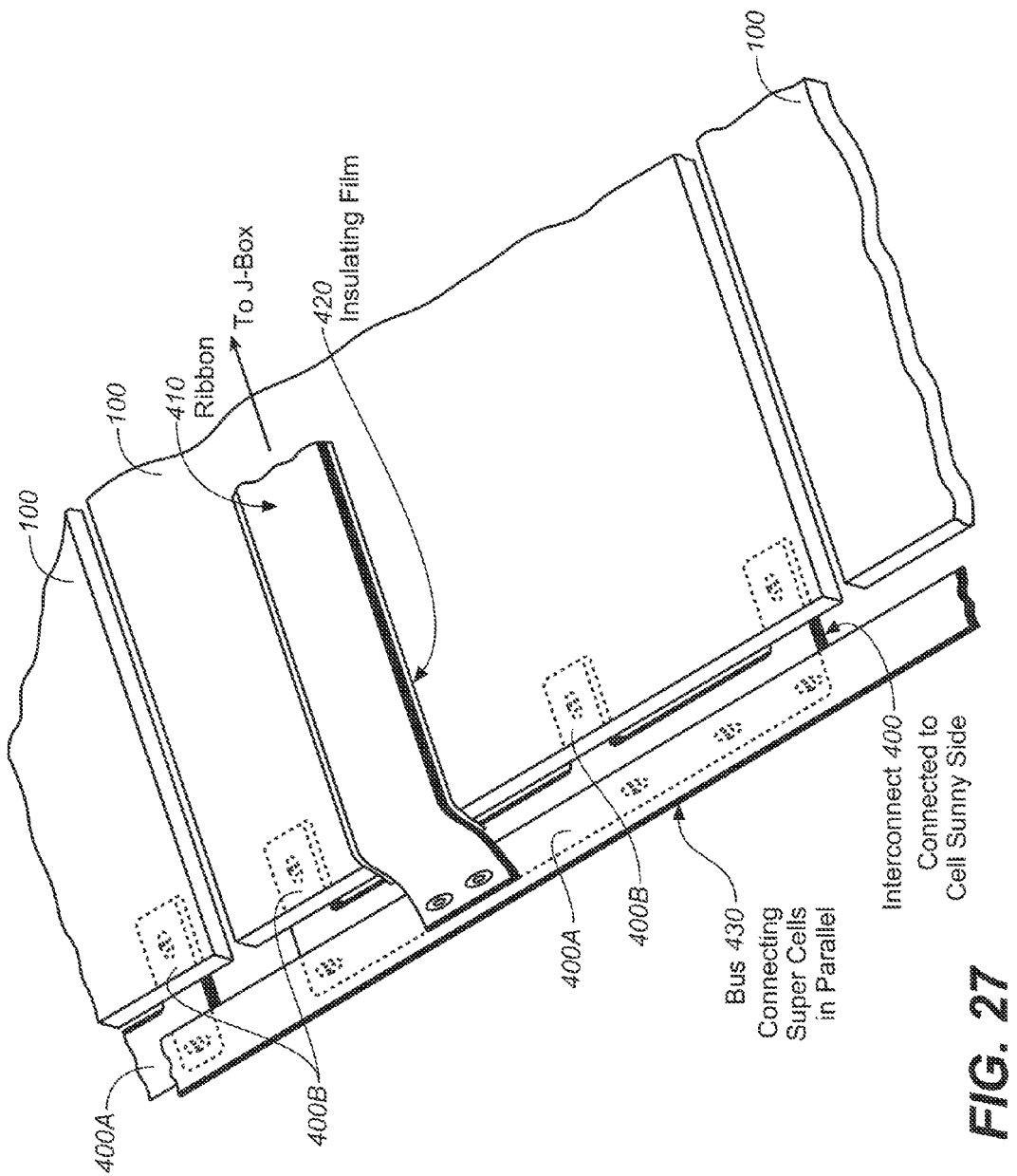
FIG. 27 shows a diagram of the rear (shaded) surface of a solar module illustrating an example electrical interconnection of two or more shingled super cells in parallel, with the front (sun side) surface terminal electrical contacts of the super cells connected to each other and to a junction box on the rear side of the module.

FIG. 27 shows a diagram of the rear (shaded) surface of a solar module illustrating an example electrical interconnection of two or more shingled super cells in parallel, with the front (sun side) surface terminal electrical contacts of the super cells connected to each other and to a junction box on the rear side of the module. The front surface terminal contacts of the shingled super cells may be located adjacent to an edge of the module.

Figure 28:
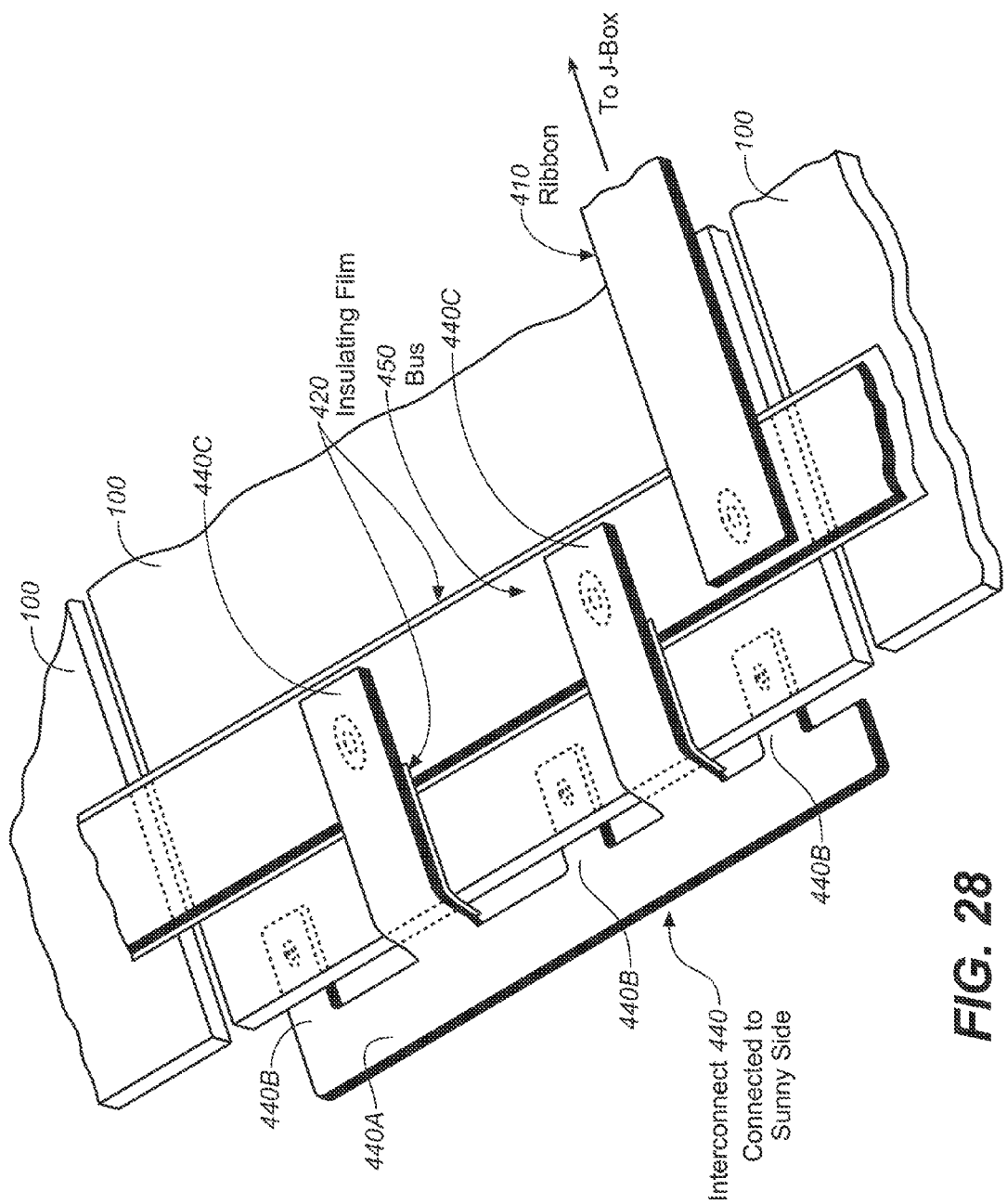
FIG. 28 shows a diagram of the rear (shaded) surface of a solar module illustrating another example electrical interconnection of two or more shingled super cells in parallel, with the front (sun side) surface terminal electrical contacts of the super cells connected to each other and to a junction box on the rear side of the module.

FIG. 28 shows a diagram of the rear (shaded) surface of a solar module illustrating another example electrical interconnection of two or more shingled super cells in parallel, with the front (sun side) surface terminal electrical contacts of the super cells connected to each other and to a junction box on the rear side of the module. The front surface terminal contacts of the shingled super cells may be located adjacent to an edge of the module.

Figure 29:
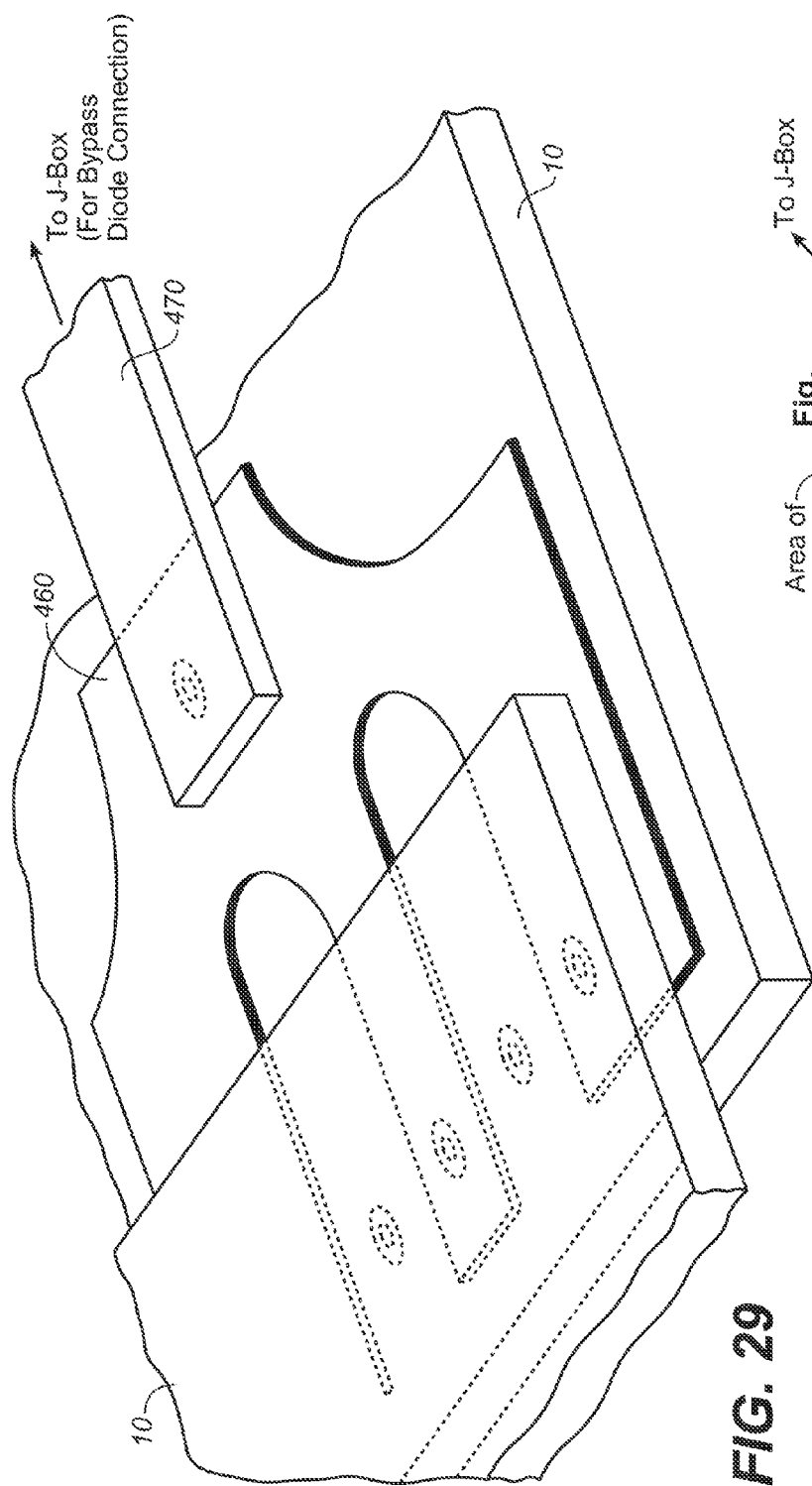
FIG. 29 shows fragmentary cross-sectional and perspective diagrams of two super cells illustrating the use of a flexible interconnect sandwiched between overlapping ends of adjacent super cells to electrically connect the super cells in series and to provide an electrical connection to a junction box.
Figure 29A:
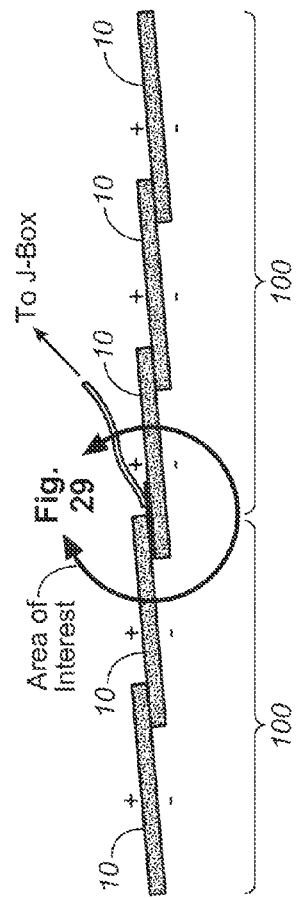
FIG. 29A shows an enlarged view of an area of interest in FIG. 29.

FIG. 29 shows fragmentary cross-sectional and perspective diagrams of two super cells illustrating the use of a flexible interconnect sandwiched between overlapping ends of adjacent super cells to electrically connect the super cells in series and to provide an electrical connection to a junction box. FIG. 29A shows an enlarged view of an area of interest in FIG. 29.

1A. A solar module comprising:
a plurality of super cells arranged in two or more parallel rows to form a front surface of the solar module, each super cell comprising a plurality of silicon solar cells arranged in line with end portions of adjacent silicon solar cells overlapping and conductively bonded to each other to electrically connect the silicon solar cells in series, each super cell comprising a front surface end contact at one end of the super cell and a back surface end contact of opposite polarity at an opposite end of the super cell;
wherein a first row of super cells comprises a first super cell arranged with its front surface end contact adjacent and parallel to a first edge of the solar module, and the solar module comprises a first flexible electrical interconnect that is elongated and runs parallel to the first edge of the solar module, is conductively bonded to the front surface end contact of the first super cell, and occupies only a narrow portion of the front surface of the solar module adjacent to the first edge of the solar module and no wider than about 1 centimeter measured perpendicularly to the first edge of the solar module.

2A. The solar module of clause 1A, wherein a portion of the first flexible electrical interconnect extends around the end of the first super cell nearest to the first edge of the solar module, and behind the first super cell.

3A. The solar module of clause 1A, wherein the first flexible interconnect comprises a thin ribbon portion conductively bonded to the front surface end contact of the first super cell and a thicker portion running parallel to the first edge of the solar module.

4A. The solar module of clause 1A, wherein the first flexible interconnect comprises a thin ribbon portion conductively bonded to the front surface end contact of the first super cell and a coiled ribbon portion running parallel to the first edge of the solar module.

5A. The solar module of clause 1A, wherein a second row of super cells comprises a second super cell arranged with its front surface end contact adjacent to and parallel to the first edge of the solar module, and the front surface end contact of the first super cell is electrically connected to the front surface end contact of the second super cell via the first flexible electrical interconnect.

6A. The solar module of clause 1A, wherein the back surface end contact of the first super cell is located adjacent to and parallel to a second edge of the solar module opposite from the first edge of the solar module, comprising a second flexible electrical interconnect that is elongated and runs parallel to the second edge of the solar module, is conductively bonded to the back surface end contact of the first super cell, and lies entirely behind the super cells.

7A. The solar module of clause 6A, wherein:
a second row of super cells comprises a second super cell arranged with its front surface end contact adjacent to and parallel to the first edge of the solar module and its back surface end contact located adjacent to and parallel to the second edge of the solar module;
the front surface end contact of the first super cell is electrically connected to the front surface end contact of the second super cell via the first flexible electrical interconnect; and
the back surface end contact of the first super cell is electrically connected to the back surface end contact of the second super cell via the second flexible electrical interconnect.

8A. The solar module of clause 1A, comprising:
a second super cell arranged in the first row of super cells in series with the first super cell and with its back surface end contact adjacent a second edge of the solar module opposite from the first edge of the solar module; and
a second flexible electrical interconnect that is elongated and runs parallel to the second edge of the solar module, is conductively bonded to the back surface end contact of the first super cell, and lies entirely behind the super cells.

9A. The solar module of clause 8A, wherein:
a second row of super cells comprises a third super cell and a fourth super cell arranged in series with a front surface end contact of the third super cell adjacent the first edge of the solar module and the back surface end contact of the fourth super cell adjacent the second edge of the solar module; and
the front surface end contact of the first super cell is electrically connected to the front surface end contact of the third super cell via the first flexible electrical interconnect and the back surface end contact of the second super cell is electrically connected to the back surface end contact of the fourth super cell via the second flexible electrical interconnect.

10A. The solar module of clause 1A, wherein away from outer edges of the solar module there are no electrical interconnections between the super cells that reduce the active area of the front surface of the module.

11A. The solar module of clause 1A wherein at least one pair of super cells is arranged in line in a row with the rear surface contact end of one of the pair of super cells adjacent to the rear surface contact end of the other of the pair of super cells.

12A. The solar module of clause 1A wherein:
at least one pair of super cells is arranged in line in a row with adjacent ends of the two super cells having end contacts of opposite polarity;
the adjacent ends of the pair of super cells overlap; and
the super cells in the pair of super cells are electrically connected in series by a flexible interconnect that is sandwiched between their overlapping ends and that does not shade the front surface.

13A. The solar module of clause 1A, wherein the super cells are arranged on a white backing sheet that comprises parallel darkened stripes having locations and widths corresponding to locations and widths of gaps between the parallel rows of super cells, and white portions of the backing sheets are not visible through the gaps between the rows.

14A. The solar module of clause 1A, wherein all portions of the first flexible electrical interconnect located on the front surface of the solar module are covered or colored to reduce visible contrast with the super cells.

15A. The solar module of clause 1A, wherein:
each silicon solar cell comprises:

rectangular or substantially rectangular front and back surfaces with shapes defined by first and second oppositely positioned parallel long sides and two oppositely positioned short sides, at least portions of the front surfaces to be exposed to solar radiation during operation of the string of solar cells;

an electrically conductive front surface metallization pattern disposed on the front surface and comprising a plurality of fingers running perpendicular to the long sides and a plurality of discrete front surface contact pads positioned in a row adjacent to the first long side, each front surface contact pad electrically connected to at least one of the fingers; and an electrically conductive back surface metallization pattern disposed on the back surface and comprising a plurality of discrete back surface contact pads positioned in a row adjacent the second long side; and within each super cell the silicon solar cells are arranged in line with first and second long sides of adjacent silicon solar cells overlapping and with corresponding discrete front surface contact pads and discrete back surface contact pads on adjacent silicon solar cells aligned, overlapping, and conductively bonded to each other with a conductive adhesive bonding material to electrically connect the silicon solar cells in series.

16A. The solar module of clause 15A, wherein the front surface metallization pattern of each silicon solar cell comprises a plurality of thin conductors electrically interconnecting adjacent discrete front surface contact pads, and each thin conductor is thinner than the width of the discrete contact pads measured perpendicularly to the long sides of the solar cells.

17A. The solar module of clause 15A, wherein the conductive adhesive bonding material is substantially confined to the locations of the discrete front surface contact pads by features of the front surface metallization pattern that form barriers around each discrete front surface contact pad.

18A. The solar module of clause 15A, wherein the conductive adhesive bonding material is substantially confined to the locations of the discrete back surface contact pads by features of the back surface metallization pattern that form barriers around each discrete back surface contact pad.

19A. The solar module of clause 15A, wherein the discrete back surface contact pads are discrete silver back surface contact pads, and except for the discrete silver back surface contact pads the back surface metallization pattern of each silicon solar cell does not comprise a silver contact at any location that underlies a portion of the front surface of the solar cell that is not overlapped by an adjacent silicon solar cell.

20A. A solar module comprising:
a plurality of super cells, each super cell comprising a plurality of silicon solar cells arranged in line with end portions of adjacent silicon solar cells overlapping and conductively bonded to each other to electrically connect the silicon solar cells in series;
wherein each silicon solar cell comprises:
rectangular or substantially rectangular front and back surfaces with shapes defined by first and second oppositely positioned parallel long sides and two oppositely positioned short sides, at least portions of the front surfaces to be exposed to solar radiation during operation of the string of solar cells;
an electrically conductive front surface metallization pattern disposed on the front surface and comprising a plurality of fingers running perpendicular to the long sides and a plurality of discrete front surface contact pads positioned in a row adjacent to the first long side,
each front surface contact pad electrically connected to at least one of the fingers; and
an electrically conductive back surface metallization pattern disposed on the back surface and comprising a plurality of discrete back surface contact pads positioned in a row adjacent the second long side;
wherein within each super cell the silicon solar cells are arranged in line with first and second long sides of adjacent silicon solar cells overlapping and with corresponding discrete front surface contact pads and discrete back surface contact pads on adjacent silicon solar cells aligned, overlapping, and conductively bonded to each other with a conductive adhesive bonding material to electrically connect the silicon solar cells in series; and
wherein the super cells are arranged in a single row or in two or more parallel rows substantially spanning a length or width of the solar module to form a front surface of the solar module to be illuminated by solar radiation during operation of the solar module.

21A. The solar module of clause 20A, wherein the discrete back surface contact pads are discrete silver back surface contact pads, and except for the discrete silver back surface contact pads the back surface metallization pattern of each silicon solar cell does not comprise a silver contact at any location that underlies a portion of the front surface of the solar cell that is not overlapped by an adjacent silicon solar cell.

22A. The solar module of clause 20A, wherein the front surface metallization pattern of each silicon solar cell comprises a plurality of thin conductors electrically interconnecting adjacent discrete front surface contact pads, and each thin conductor is thinner than the width of the discrete contact pads measured perpendicularly to the long sides of the solar cells.

23A. The solar module of clause 20A, wherein the conductive adhesive bonding material is substantially confined to the locations of the discrete front surface contact pads by features of the front surface metallization pattern that form barriers around each discrete front surface contact pad.

24A. The solar module of clause 20A, wherein the conductive adhesive bonding material is substantially confined to the locations of the discrete back surface contact pads by features of the back surface metallization pattern that form barriers around each discrete back surface contact pad.

25A. A super cell comprising:
a plurality of silicon solar cells each comprising:
rectangular or substantially rectangular front and back surfaces with shapes defined by first and second oppositely positioned parallel long sides and two oppositely positioned short sides, at least portions of the front surfaces to be exposed to solar radiation during operation of the string of solar cells;
an electrically conductive front surface metallization pattern disposed on the front surface and comprising a plurality of fingers running perpendicular to the long sides and a plurality of discrete front surface contact pads positioned in a row adjacent to the first long side, each front surface contact pad electrically connected to at least one of the fingers; and
an electrically conductive back surface metallization pattern disposed on the back surface and comprising a plurality of discrete silver back surface contact pads positioned in a row adjacent the second long side;

wherein the silicon solar cells are arranged in line with first and second long sides of adjacent silicon solar cells overlapping and with corresponding discrete front surface contact pads and discrete back surface contact pads on adjacent silicon solar cells aligned, overlapping, and conductively bonded to each other with a conductive adhesive bonding material to electrically connect the silicon solar cells in series.

26A. The solar module of clause 25A, wherein the discrete back surface contact pads are discrete silver back surface contact pads, and except for the discrete silver back surface contact pads the back surface metallization pattern of each silicon solar cell does not comprise a silver contact at any location that underlies a portion of the front surface of the solar cell that is not overlapped by an adjacent silicon solar cell.

27A. The string of solar cells of clause 25A, wherein the front surface metallization pattern comprises a plurality of thin conductors electrically interconnecting adjacent discrete front surface contact pads, and each thin conductor is thinner than the width of the discrete contact pads measured perpendicularly to the long sides of the solar cells.

28A. The string of solar cells of clause 25A, wherein the conductive adhesive bonding material is substantially confined to the locations of the discrete front surface contact pads by features of the front surface metallization pattern that form barriers around each discrete front surface contact pad.

29A. The string of solar cells of clause 25A, wherein the conductive adhesive bonding material is substantially confined to the locations of the discrete back surface contact pads by features of the back surface metallization pattern that form barriers around each discrete back surface contact pad.

30A. The string of solar cells of clause 25A, wherein the conductive adhesive bonding material has a glass transition less than or equal to about 0° C.

31. A method of making a solar module, the method comprising:

assembling a plurality of super cells, each super cell comprising a plurality of rectangular silicon solar cells arranged in line with end portions on long sides of adjacent rectangular silicon solar cells overlapping in a shingled manner;

curing an electrically conductive bonding material disposed between the overlapping end portions of adjacent rectangular silicon solar cells by applying heat and pressure to the super cells, thereby bonding adjacent overlapping rectangular silicon solar cells to each other and electrically connecting them in series;

arranging and interconnecting the super cells in a desired solar module configuration in a stack of layers comprising an encapsulant; and applying heat and pressure to the stack of layers to form a laminated structure.

32A. The method of clause 31A, comprising curing or partially curing the electrically conductive bonding material by applying heat and pressure to the super cells prior to applying heat and pressure to the stack of layers to form the laminated structure, thereby forming cured or partially cured super cells as an intermediate product before forming the laminated structure.

33A. The method of clause 32A, wherein as each additional rectangular silicon solar cell is added to a super cell during assembly of the super cell, the electrically conductive adhesive bonding material between the newly added solar cell and its adjacent overlapping solar cell is cured or partially cured before another rectangular silicon solar cell is added to the super cell.

34A. The method of clause 32A, comprising curing or partially curing all of the electrically conductive bonding material in a super cell in the same step.

35A. The method of clause 32A, comprising:

partially curing the electrically conductive bonding material by applying heat and pressure to the super cells prior to applying heat and pressure to the stack of layers to form a laminated structure, thereby forming partially cured super cells as an intermediate product before forming the laminated structure; and completing curing of the electrically conductive bonding material while applying heat and pressure to the stack of layers to form the laminated structure.

36A. The method of clause 31A, comprising curing the electrically conductive bonding material while applying heat and pressure to the stack of layers to form a laminated structure, without forming cured or partially cured super cells as an intermediate product before forming the laminated structure.

37A. The method of clause 31A, comprising dicing one or more silicon solar cells into rectangular shapes to provide the rectangular silicon solar cells.

38A. The method of clause 37A, comprising applying the electrically conductive adhesive bonding material to the one or more silicon solar cells before dicing the one or more silicon solar cells to provide rectangular silicon solar cells with pre-applied electrically conductive adhesive bonding material.

39A. The method of clause 38A, comprising applying the electrically conductive adhesive bonding material to the one or more silicon solar cells, then using a laser to scribe one or more lines on each of the one or more silicon solar cells, then cleaving the one or more silicon solar cells along the scribed lines.

40A. The method of clause 38A, comprising using a laser to scribe one or more lines on each of the one or more silicon solar cells, then applying the electrically conductive adhesive bonding material to the one or more silicon solar cells, then cleaving the one or more silicon solar cells along the scribed lines.

41A. The method of clause 38A, wherein the electrically conductive adhesive bonding material is applied to a top surface of each of the one or more silicon solar cells and not to an oppositely positioned bottom surface of each of the one or more silicon solar cells, comprising applying a vacuum between the bottom surfaces of the one or more silicon solar cells and a curved supporting surface to flex the one or more silicon solar cells against the curved supporting surface and thereby cleave the one or more silicon solar cells along scribe lines.

42A. The method of clause 37A, comprising applying the electrically conductive adhesive bonding material to the rectangular silicon solar cells after dicing the one or more silicon solar cells to provide the rectangular silicon solar cells.

43A. The method of clause 31A, wherein the conductive adhesive bonding material has a glass transition temperature of less than or equal to about 0° C.

44A. A method of making a super cell, the method comprising:

laser scribing one or more scribe lines on each of one or more silicon solar cells to define a plurality of rectangular regions on the silicon solar cells, applying an electrically conductive adhesive bonding material to the one or more scribed silicon solar cells at one or more locations adjacent a long side of each rectangular region;

separating the silicon solar cells along the scribe lines to provide a plurality of rectangular silicon solar cells each comprising a portion of the electrically conductive adhesive bonding material disposed on its front surface adjacent a long side;

arranging the plurality of rectangular silicon solar cells in line with long sides of adjacent rectangular silicon solar cells overlapping in a shingled manner with a portion of the electrically conductive adhesive bonding material disposed in between; and curing the electrically conductive bonding material, thereby bonding adjacent overlapping rectangular silicon solar cells to each other and electrically connecting them in series.

45A. A method of making a super cell, the method comprising:

laser scribing one or more scribe lines on each of one or more silicon solar cells to define a plurality of rectangular regions on the silicon solar cells, each solar cell comprising a top surface and an oppositely positioned bottom surface;

applying an electrically conductive adhesive bonding material to portions of the top surfaces of the one or more silicon solar cells;

applying a vacuum between the bottom surfaces of the one or more silicon solar cells and a curved supporting surface to flex the one or more silicon solar cells against the curved supporting surface and thereby cleave the one or more silicon solar cells along the scribe lines to provide a plurality of rectangular silicon solar cells each comprising a portion of the electrically conductive adhesive bonding material disposed on its front surface adjacent a long side;

arranging the plurality of rectangular silicon solar cells in line with long sides of adjacent rectangular silicon solar cells overlapping in a shingled manner with a portion of the electrically conductive adhesive bonding material disposed in between; and curing the electrically conductive bonding material, thereby bonding adjacent overlapping rectangular silicon solar cells to each other and electrically connecting them in series.

46A. A method of making a super cell, the method comprising:

dicing one or more pseudo square silicon wafers along a plurality of lines parallel to a long edge of each wafer to form a plurality of rectangular silicon solar cells each having substantially the same length along its long axis; and arranging the rectangular silicon solar cells in line with long sides of adjacent solar cells overlapping and conductively bonded to each other to electrically connect the solar cells in series;

wherein the plurality of rectangular silicon solar cells comprises at least one rectangular solar cell having two chamfered corners corresponding to corners or to portions of corners of the pseudo square wafer, and one or more rectangular silicon solar cells each lacking chamfered corners; and wherein the spacing between parallel lines along which the pseudo square wafer is diced is selected to compensate for the chamfered corners by making the width perpendicular to the long axis of the rectangular silicon solar cells that comprise chamfered corners greater than the width perpendicular to the long axis of the rectangular silicon solar cells that lack chamfered corners, so that each of the plurality of rectangular silicon solar cells in the string of solar cells has a front surface of substantially the same area exposed to light in operation of the string of solar cells.

47A. A super cell comprising:

a plurality of silicon solar cells arranged in line with end portions of adjacent solar cells overlapping and conductively bonded to each other to electrically connect the solar cells in series;

wherein at least one of the silicon solar cells has chamfered corners that correspond to corners or portions of corners of a pseudo square silicon wafer from which it was diced, at least one of the silicon solar cells lacks chamfered corners, and each of the silicon solar cells has a front surface of substantially the same area exposed to light during operation of the string of solar cells.

48A. A method of making two or more super cells, the method comprising:

dicing one or more pseudo square silicon wafers along a plurality of lines parallel to a long edge of each wafer to form a first plurality of rectangular silicon solar cells comprising chamfered corners corresponding to corners or portions of corners of the pseudo square silicon wafers and a second plurality of rectangular silicon solar cells each of a first length spanning a full width of the pseudo square silicon wafers and lacking chamfered corners;

removing the chamfered corners from each of the first plurality of rectangular silicon solar cells to form a third plurality of rectangular silicon solar cells each of a second length shorter than the first length and lacking chamfered corners;

arranging the second plurality of rectangular silicon solar cells in line with long sides of adjacent rectangular silicon solar cells overlapping and conductively bonded to each other to electrically connect the second plurality of rectangular silicon solar cells in series to form a solar cell string having a width equal to the first length; and arranging the third plurality of rectangular silicon solar cells in line with long sides of adjacent rectangular silicon solar cells overlapping and conductively bonded to each other to electrically connect the third plurality of rectangular silicon solar cells in series to form a solar cell string having a width equal to the second length.

49A. A method of making two or more super cells, the method comprising:

dicing one or more pseudo square silicon wafers along a plurality of lines parallel to a long edge of each wafer to form a first plurality of rectangular silicon solar cells comprising chamfered corners corresponding to corners or portions of corners of the pseudo square silicon wafers and a second plurality of rectangular silicon solar cells lacking chamfered corners;

arranging the first plurality of rectangular silicon solar cells in line with long sides of adjacent rectangular silicon solar cells overlapping and conductively bonded to each other to electrically connect the first plurality of rectangular silicon solar cells in series; and arranging the second plurality of rectangular silicon solar cells in line with long sides of adjacent rectangular silicon solar cells overlapping and conductively bonded to each other to electrically connect the second plurality of rectangular silicon solar cells in series.

50A. A solar module comprising:
  a series connected string of N≥than 25 rectangular or substantially rectangular solar cells having on average a breakdown voltage greater than about 10 volts, the solar cells grouped into one or more super cells each of which comprises two or more of the solar cells arranged in line with long sides of adjacent solar cells overlapping and conductively bonded to each other with an electrically and thermally conductive adhesive;
  wherein no single solar cell or group of <N solar cells in the string of solar cells is individually electrically connected in parallel with a bypass diode.

51A. The solar module of clause 50A, wherein N is greater than or equal to 30.

52A. The solar module of clause 50A, wherein N is greater than or equal to 50.

53A. The solar module of clause 50A, wherein N is greater than or equal to 100.

54A. The solar module of clause 50A, wherein the adhesive forms bonds between adjacent solar cells having a thickness perpendicular to the solar cells less than or equal to about 0.1 mm and a thermal conductivity perpendicular to the solar cells greater than or equal to about 1.5 w/m/k.

55A. The solar module of clause 50A, wherein the N solar cells are grouped into a single super cell.

56A. The solar module of clause 50A, wherein the solar cells are silicon solar cells.

57A. A solar module comprising:
  a super cell substantially spanning a full length or width of the solar module parallel to an edge of the solar module, the super cell comprising a series connected string of N rectangular or substantially rectangular solar cells having on average a breakdown voltage greater than about 10 volts arranged in line with long sides of adjacent solar cells overlapping and conductively bonded to each other with an electrically and thermally conductive adhesive;
  wherein no single solar cell or group of <N solar cells in the super cell is individually electrically connected in parallel with a bypass diode.

58A. The solar module of clause 57A, wherein N>24.

59A. The solar module of clause 57A, wherein the super cell has a length in the direction of current flow of at least about 500 mm.

60. A super cell comprising:
  a plurality of silicon solar cells each comprising:
    rectangular or substantially rectangular front and back surfaces with shapes defined by first and second oppositely positioned parallel long sides and two oppositely positioned short sides, at least portions of the front surfaces to be exposed to solar radiation during operation of the string of solar cells;
    an electrically conductive front surface metallization pattern disposed on the front surface and comprising at least one front surface contact pad positioned adjacent to the first long side; and
    an electrically conductive back surface metallization pattern disposed on the back surface and comprising at least one back surface contact pad positioned adjacent the second long side;
  wherein the silicon solar cells are arranged in line with first and second long sides of adjacent silicon solar cells overlapping and with front surface and back surface contact pads on adjacent silicon solar cells overlapping and conductively bonded to each other with a conductive adhesive bonding material to electrically connect the silicon solar cells in series; and
  wherein the front surface metallization pattern of each silicon solar cell comprises a barrier configured to substantially confine the conducive adhesive bonding material to the at least one front surface contact pads prior to curing of the conductive adhesive bonding material during manufacturing of the super cell.

61A. The super cell of clause 60A, wherein for each pair of adjacent and overlapping silicon solar cells, the barrier on the front surface of one of the silicon solar cells is overlapped and hidden by a portion of the other silicon solar cell, thereby substantially confining the conductive adhesive bonding material to overlapped regions of the front surface of the silicon solar cell prior to curing of the conductive adhesive bonding material during manufacturing of the super cell.

62A. The super cell of clause 60A, wherein the barrier comprises a continuous conductive line running parallel to and for substantially the full length of the first long side, with the at least one front surface contact pads located between the continuous conductive line and the first long side of the solar cell.

63A. The super cell of clause 62A, wherein the front surface metallization pattern comprises fingers electrically connected to the at least one front surface contact pads and running perpendicularly to the first long side, and the continuous conductive line electrically interconnects the fingers to provide multiple conductive paths from each finger to the at least one front surface contact pads.

64A. The super cell of clause 60A, wherein the front surface metallization pattern comprises a plurality of discrete contact pads arranged in a row adjacent to and parallel to the first long side, and the barrier comprises a plurality of features forming separate barriers for each discrete contact pad that substantially confine the conductive adhesive bonding material to the discrete contact pads prior to curing of the conductive adhesive bonding material during manufacturing of the super cell.

65A. The super cell of clause 64A, wherein the separate barriers abut and are taller than their corresponding discrete contact pads.

66A. A super cell comprising:
  a plurality of silicon solar cells each comprising:
    rectangular or substantially rectangular front and back surfaces with shapes defined by first and second oppositely positioned parallel long sides and two oppositely positioned short sides, at least portions of the front surfaces to be exposed to solar radiation during operation of the string of solar cells;
    an electrically conductive front surface metallization pattern disposed on the front surface and comprising at least one front surface contact pad positioned adjacent to the first long side; and
    an electrically conductive back surface metallization pattern disposed on the back surface and comprising at least one back surface contact pad positioned adjacent the second long side;
  wherein the silicon solar cells are arranged in line with first and second long sides of adjacent silicon solar cells overlapping and with front surface and back surface contact pads on adjacent silicon solar cells overlapping and conductively bonded to each other with a conductive adhesive bonding material to electrically connect the silicon solar cells in series; and
  wherein the back surface metallization pattern of each silicon solar cell comprises a barrier configured to substantially confine the conducive adhesive bonding material to the at least one back surface contact pads prior to curing of the conductive adhesive bonding material during manufacturing of the super cell.

67A. The super cell of clause 66A, wherein the back surface metallization pattern comprises one or more discrete contact pads arranged in a row adjacent to and parallel to the second long side, and the barrier comprises a plurality of features forming separate barriers for each discrete contact pad that substantially confine the conductive adhesive bonding material to the discrete contact pads prior to curing of the conductive adhesive bonding material during manufacturing of the super cell.

68A. The super cell of clause 67A, wherein the separate barriers abut and are taller than their corresponding discrete contact pads.

69A. A method of making a string of solar cells, the method comprising:
  dicing one or more pseudo square silicon wafers along a plurality of lines parallel to a long edge of each wafer to form a plurality of rectangular silicon solar cells each having substantially the same length along its long axis; and
  arranging the rectangular silicon solar cells in line with long sides of adjacent solar cells overlapping and conductively bonded to each other to electrically connect the solar cells in series;
  wherein the plurality of rectangular silicon solar cells comprises at least one rectangular solar cell having two chamfered corners corresponding to corners or to portions of corners of the pseudo square wafer, and one or more rectangular silicon solar cells each lacking chamfered corners; and
  wherein the spacing between parallel lines along which the pseudo square wafer is diced is selected to compensate for the chamfered corners by making the width perpendicular to the long axis of the rectangular silicon solar cells that comprise chamfered corners greater than the width perpendicular to the long axis of the rectangular silicon solar cells that lack chamfered corners, so that each of the plurality of rectangular silicon solar cells in the string of solar cells has a front surface of substantially the same area exposed to light in operation of the string of solar cells.

70A. A string of solar cells comprising:
  a plurality of silicon solar cells arranged in line with end portions of adjacent solar cells overlapping and conductively bonded to each other to electrically connect the solar cells in series;
  wherein at least one of the silicon solar cells has chamfered corners that correspond to corners or portions of corners of a pseudo square silicon wafer from which it was diced, at least one of the silicon solar cells lacks chamfered corners, and each of the silicon solar cells has a front surface of substantially the same area exposed to light during operation of the string of solar cells.

71A. A method of making two or more strings of solar cells, the method comprising:
  dicing one or more pseudo square silicon wafers along a plurality of lines parallel to a long edge of each wafer to form a first plurality of rectangular silicon solar cells comprising chamfered corners corresponding to corners or portions of corners of the pseudo square silicon wafers and a second plurality of rectangular silicon solar cells each of a first length spanning a full width of the pseudo square silicon wafers and lacking chamfered corners;
  removing the chamfered corners from each of the first plurality of rectangular silicon solar cells to form a third plurality of rectangular silicon solar cells each of a second length shorter than the first length and lacking chamfered corners;
  arranging the second plurality of rectangular silicon solar cells in line with long sides of adjacent rectangular silicon solar cells overlapping and conductively bonded to each other to electrically connect the second plurality of rectangular silicon solar cells in series to form a solar cell string having a width equal to the first length; and
  arranging the third plurality of rectangular silicon solar cells in line with long sides of adjacent rectangular silicon solar cells overlapping and conductively bonded to each other to electrically connect the third plurality of rectangular silicon solar cells in series to form a solar cell string having a width equal to the second length.

72A. A method of making two or more strings of solar cells, the method comprising:
  dicing one or more pseudo square silicon wafers along a plurality of lines parallel to a long edge of each wafer to form a first plurality of rectangular silicon solar cells comprising chamfered corners corresponding to corners or portions of corners of the pseudo square silicon wafers and a second plurality of rectangular silicon solar cells lacking chamfered corners;
  arranging the first plurality of rectangular silicon solar cells in line with long sides of adjacent rectangular silicon solar cells overlapping and conductively bonded to each other to electrically connect the first plurality of rectangular silicon solar cells in series; and arranging the second plurality of rectangular silicon solar cells in line with long sides of
  adjacent rectangular silicon solar cells overlapping and conductively bonded to each other to electrically connect the second plurality of rectangular silicon solar cells in series.

73A. A method of making a solar module, the method comprising:
  dicing each of a plurality of pseudo square silicon wafers along a plurality of lines parallel to a long edge of the wafer to form from the plurality of pseudo square silicon wafers a plurality of rectangular silicon solar cells comprising chamfered corners corresponding to corners of the pseudo square silicon wafers and a plurality of rectangular silicon solar cells lacking chamfered corners;
  arranging at least some of the rectangular silicon solar cells lacking chamfered corners to form a first plurality of super cells each of which comprises only rectangular silicon solar cells lacking chamfered corners arranged in line with long sides of the silicon solar cells overlapping and conductively bonded to each other to electrically connect the silicon solar cells in series;
  arranging at least some of the rectangular silicon solar cells comprising chamfered corners to form a second plurality of super cells each of which comprises only rectangular silicon solar cells comprising chamfered corners arranged in line with long sides of the silicon solar cells overlapping and conductively bonded to each other to electrically connect the silicon solar cells in series; and
  arranging the super cells in parallel rows of super cells of substantially equal length to form a front surface of the solar module, with each row comprising only super cells from the first plurality of super cells or only super cells from the second plurality of super cells.

74A. The solar module of clause 73A, wherein two of the rows of super cells adjacent to parallel opposite edges of the solar module comprise only super cells from the second plurality of super cells, and all other rows of super cells comprise only super cells from the first plurality of super cells.

75A. The solar module of clause 74A, wherein the solar module comprises a total of six rows of super cells.

76A. A super cell comprising:
a plurality of silicon solar cells arranged in line in a first direction with end portions of adjacent silicon solar cells overlapping and conductively bonded to each other to electrically connect the silicon solar cells in series; and
an elongated flexible electrical interconnect with its long axis oriented parallel to a second direction perpendicular to the first direction, conductively bonded to a front or back surface of an end one of the silicon solar cells at three or more discrete locations arranged along the second direction, running at least the full width of the end solar cell in the second direction, having a conductor thickness less than or equal to about 100 microns measured perpendicularly to the front or rear surface of the end silicon solar cell, providing a resistance to current flow in the second direction of less than or equal to about 0.012 Ohms, and configured to provide flexibility accommodating differential expansion in the second direction between the end silicon solar cell and the interconnect for a temperature range of about −40° C. to about 85° C.

77A. The super cell of clause 76A, wherein the flexible electrical interconnect has a conductor thickness less than or equal to about 30 microns measured perpendicularly to the front and rear surfaces of the end silicon solar cell.

78A. The super cell of clause 76A, wherein the flexible electrical interconnect extends beyond the super cell in the second direction to provide for electrical interconnection to at least a second super cell positioned parallel to and adjacent the super cell in a solar module.

79A. The super cell of clause 76A, wherein the flexible electrical interconnect extends beyond the super cell in the first direction to provide for electrical interconnection to a second super cell positioned parallel to and in line with the super cell in a solar module.

80A. A solar module comprising:
a plurality of super cells arranged in two or more parallel rows spanning a width of the module to form a front surface of the module, each super cell comprising a plurality of silicon solar cells arranged in line with end portions of adjacent silicon solar cells overlapping and conductively bonded to each other to electrically connect the silicon solar cells in series;
wherein at least an end of a first super cell adjacent an edge of the module in a first row is electrically connected to an end of a second super cell adjacent the same edge of the module in a second row via a flexible electrical interconnect that is bonded to the front surface of the first super cell at a plurality of discrete locations with an electrically conductive adhesive bonding material, runs parallel to the edge of the module, and at least a portion of which folds around the end of the first super cell and is hidden from view from the front of the module.

81A. The solar module of clause 80A, wherein surfaces of the flexible electrical interconnect on the front surface of the module are covered or colored to reduce visible contrast with the super cells.

82A. The solar module of clause 80A, wherein the two or more parallel rows of super cells are arranged on a white backing sheet to form a front surface of the solar module to be illuminated by solar radiation during operation of the solar module, the white backing sheet comprises parallel darkened stripes having locations and widths corresponding to locations and widths of gaps between the parallel rows of super cells, and white portions of the backing sheets are not visible through the gaps between the rows.

83A. A method of making a string of solar cells, the method comprising:
laser scribing one or more scribe lines on each of one or more silicon solar cells to define a plurality of rectangular regions on the silicon solar cells,
applying an electrically conductive adhesive bonding material to the one or more scribed silicon solar cells at one or more locations adjacent a long side of each rectangular region; separating the silicon solar cells along the scribe lines to provide a plurality of rectangular silicon solar cells each comprising a portion of the electrically conductive adhesive bonding material disposed on its front surface adjacent a long side;
arranging the plurality of rectangular silicon solar cells in line with long sides of adjacent rectangular silicon solar cells overlapping in a shingled manner with a portion of the electrically conductive adhesive bonding material disposed in between; and
curing the electrically conductive bonding material, thereby bonding adjacent overlapping rectangular silicon solar cells to each other and electrically connecting them in series.

84A. A method of making a string of solar cells, the method comprising:
laser scribing one or more scribe lines on each of one or more silicon solar cells to define a plurality of rectangular regions on the silicon solar cells, each solar cell comprising a top surface and an oppositely positioned bottom surface;
applying an electrically conductive adhesive bonding material to portions of the top surfaces of the one or more silicon solar cells;
applying a vacuum between the bottom surfaces of the one or more silicon solar cells and a curved supporting surface to flex the one or more silicon solar cells against the curved supporting surface and thereby cleave the one or more silicon solar cells along the scribe lines to provide a plurality of rectangular silicon solar cells each comprising a portion of the electrically conductive adhesive bonding material disposed on its front surface adjacent a long side;
arranging the plurality of rectangular silicon solar cells in line with long sides of adjacent rectangular silicon solar cells overlapping in a shingled manner with a portion of the electrically conductive adhesive bonding material disposed in between; and
curing the electrically conductive bonding material, thereby bonding adjacent overlapping rectangular silicon solar cells to each other and electrically connecting them in series.

85A. The method of clause 84A, comprising applying the electrically conductive adhesive bonding material to the one or more silicon solar cells, then laser scribing the one or more scribe lines on each of the one or more silicon solar cells.

86A. The method of clause 84A, comprising laser scribing the one or more scribe lines on each of the one or more silicon solar cells, then applying the electrically conductive adhesive bonding material to the one or more silicon solar cells.

Embodiments may include one or more features described in the following U.S. Patent Publication documents: U.S. Patent Publication No. 2014/0124013; and U.S. Patent Publication No. 2014/0124014, both of which are incorporated by reference in their entireties herein for all purposes.

This disclosure is illustrative and not limiting. Further modifications will be apparent to one skilled in the art in light of this disclosure and are intended to fall within the scope of the appended claims.

What is claimed is:

1. An apparatus comprising:
   a series connected string of N greater than or equal to 25 rectangular silicon solar cells having on average a breakdown voltage greater than about 10 volts arranged in line with long sides of adjacent solar cells overlapping and conductively bonded to each other with an electrically and thermally conductive adhesive to form a super cell; and
   a first bypass diode electrically connected between opposite ends of the string of solar cells in parallel with the string of solar cells;
   wherein no single solar cell or group of <N solar cells in the string of solar cells is individually electrically and directly connected in parallel with a bypass diode.

2. An apparatus as in claim 1 wherein N is greater than or equal to 30.

3. An apparatus as in claim 1 wherein N is greater than or equal to 50.

4. An apparatus as in claim 1 wherein N is greater than or equal to 100.

5. An apparatus as in claim 1 wherein the adhesive has a thickness less than or equal to about 0.1 mm, and has a thermal conductivity greater than or equal to about 1.5 w/m/k.

6. An apparatus as in claim 1 wherein the super cell has a length in a direction of current flow of at least about 500 mm.

7. An apparatus as in claim 1 wherein each solar cell comprises a feature configured to confine spreading of the adhesive.

8. An apparatus as in claim 7 wherein the feature comprises a raised feature.

9. An apparatus as in claim 7 wherein the feature comprises metallization.

10. An apparatus as in claim 9 wherein the metallization comprises a line running a full length of a first long side of the solar cell, the solar cell further comprising at least one contact pad located between the line and the first long side.

11. An apparatus as in claim 10 wherein:
    the metallization further comprises fingers electrically connected to the at least one contact pad and running perpendicularly to the first long side; and
    the conductive line interconnects the fingers.

12. An apparatus as in claim 7 wherein the feature is on a front side of the solar cell.

13. An apparatus as in claim 7 wherein the feature is on a back side of the solar cell.

14. An apparatus as in claim 7 wherein the feature comprises a recessed feature.

15. An apparatus as in claim 7 wherein the feature is hidden by an adjacent overlapping solar cell.

16. An apparatus as in claim 1 wherein a first solar cell has chamfered corners and a second solar cell lacks chamfered corners, and the first solar cell and the second solar cell have a same area exposed to light.

17. An apparatus as in claim 1 further comprising a flexible electrical interconnect bonded to a surface of one of the solar cells and accommodating thermal expansion of the solar cell in two dimensions, the flexible electrical interconnect having a long axis perpendicular to the direction of current flow in the super cell.

18. An apparatus as in claim 17 wherein the flexible electrical interconnect has a thickness less than or equal to about 100 microns and provides a resistance of less than or equal to about 0.012 Ohms.

19. An apparatus as in claim 17 wherein the surface comprises a back surface.

20. An apparatus as in claim 17 wherein the flexible electrical interconnect contacts another super cell.

21. An apparatus as in claim 20 wherein the super cells connected by the flexible electrical interconnect are in line with each other.

22. An apparatus as in claim 20 wherein the super cells connected by the flexible interconnect are in adjacent parallel rows.

23. An apparatus as in claim 17 wherein a first portion of the interconnect folds around an edge of the super cell such that a remaining second interconnect portion is on a backside of the super cell.

24. An apparatus as in claim 17 wherein the flexible electrical interconnect is electrically connected to the first bypass diode.

25. An apparatus as in claim 1 wherein a plurality of super cells are arranged in two or more parallel rows on a backing sheet to form a solar module front surface, wherein the backing sheet is white and comprises darkened stripes of location and width corresponding to gaps between super cells.

26. An apparatus as in claim 1 further comprising a power management device in electrical communication with the super cell and configured to,
    receive a voltage output of the super cell;
    based upon the voltage, determine if the solar cell is in reverse bias; and
    disconnect the solar cell in reverse bias from a super cell module circuit.

27. An apparatus as in claim 1 wherein the super cell is disposed on a first backing to form a first module having a top conductive ribbon on a first side facing a direction of solar energy, the apparatus further comprising:
    another super cell disposed on a second backing to form a second module having a bottom ribbon on a second side facing a direction away from the direction of the solar energy,
    wherein the second module overlaps and is bonded to a portion of the first module including the top ribbon.

28. An apparatus as in claim 27 wherein the second module is bonded to the first module by adhesive.

29. An apparatus as in claim 27 wherein the second module is bonded to the first module by a mating arrangement.

30. An apparatus as in claim 27 further comprising a junction box overlapped by the second module.

31. An apparatus as in claim 30 wherein the second module is bonded to the first module by a mating arrangement.

32. An apparatus as in claim 31 wherein the mating arrangement is between the junction box and another junction box on the second module.

33. An apparatus as in claim 27 wherein the first backing comprises glass.

34. An apparatus as in claim 1 wherein the super cell comprises a first solar cell having a chamfered corner.

35. An apparatus as in claim 34 wherein the super cell further comprises a second solar cell having a chamfered corner, wherein a longest side of the first solar cell having a chamfered corner overlaps and is conductively bonded to a longest side of the second solar cell having a chamfered corner, and the chamfered corners of the first and second solar cells face away from each other.

* * * * *

(12) EX PARTE REEXAMINATION CERTIFICATE (11351st)
United States Patent
Morad et al.

(10) Number: US 9,780,253 C1
(45) Certificate Issued: Jul. 20, 2018

(54) SHINGLED SOLAR CELL MODULE

(71) Applicant: SunPower Corporation, San Jose, CA (US)

(72) Inventors: Ratson Morad, Palo Alto, CA (US); Gilad Almogy, Palo Alto, CA (US); Itai Suez, Santa Cruz, CA (US); Jean Hummel, San Carlos, CA (US); Nathan Beckett, Oakland, CA (US); Yafu Lin, Santa Clara, CA (US); Dan Maydan, Los Altos Hills, CA (US); John Gannon, Oakland, CA (US)

(73) Assignee: SUNPOWER CORPORATION, San Jose, CA (US)

Reexamination Request:
No. 90/014,077, Jan. 30, 2018

Reexamination Certificate for:
Patent No.: 9,780,253
Issued: Oct. 3, 2017
Appl. No.: 14/530,405
Filed: Oct. 31, 2014

Related U.S. Application Data

(63) Continuation-in-part of application No. 29/506,415, filed on Oct. 15, 2014, now abandoned.
(Continued)

(51) Int. Cl.
*H01L 31/042* (2014.01)
*H01L 31/0203* (2014.01)
(Continued)

(52) U.S. Cl.
CPC .......... *H01L 31/05* (2013.01); *H01L 27/1421* (2013.01); *H01L 31/0201* (2013.01); *H01L 31/0203* (2013.01); *H01L 31/02008* (2013.01); *H01L 31/028* (2013.01); *H01L 31/022425* (2013.01); *H01L 31/022433* (2013.01); *H01L 31/042* (2013.01); *H01L 31/043* (2014.12); *H01L 31/044* (2014.12); *H01L 31/048* (2013.01); *H01L 31/049* (2014.12); *H01L 31/0481* (2013.01); *H01L 31/0488* (2013.01); *H01L 31/0504* (2013.01); *H01L 31/0508* (2013.01); *H01L 31/0516* (2013.01); *H01L 31/068* (2013.01); *H01L 31/18* (2013.01); *H01L 31/1804* (2013.01); *H01L 31/186* (2013.01); *H01L 31/1876* (2013.01); *H02S 20/25* (2014.12); *H02S 30/00* (2013.01); *H02S 30/10* (2014.12); *H02S 40/30* (2014.12); *H02S 40/32* (2014.12); *H02S 40/34* (2014.12); *H02S 40/36* (2014.12); *H02S 50/00* (2013.01);
(Continued)

(58) Field of Classification Search
None
See application file for complete search history.

(56) References Cited

To view the complete listing of prior art documents cited during the proceeding for Reexamination Control Number 90/014,077, please refer to the USPTO's public Patent Application Information Retrieval (PAIR) system under the Display References tab.

*Primary Examiner* — Alan Diamond

(57) ABSTRACT

A high efficiency configuration for a solar cell module comprises solar cells arranged in a shingled manner to form super cells, which may be arranged to efficiently use the area of the solar module, reduce series resistance, and increase module efficiency. The solar cell module may comprise for example a series connected string of N greater than or equal to 25 rectangular or substantially rectangular solar cells having on average a breakdown voltage greater than about 10 volts, with the solar cells grouped into one or more super cells each of which comprises two or more of the solar cells arranged in line with long sides of adjacent solar cells overlapping and conductively bonded to each other, and with no single solar cell or group of <N solar cells in the string of solar cells individually electrically connected parallel with a bypass diode.

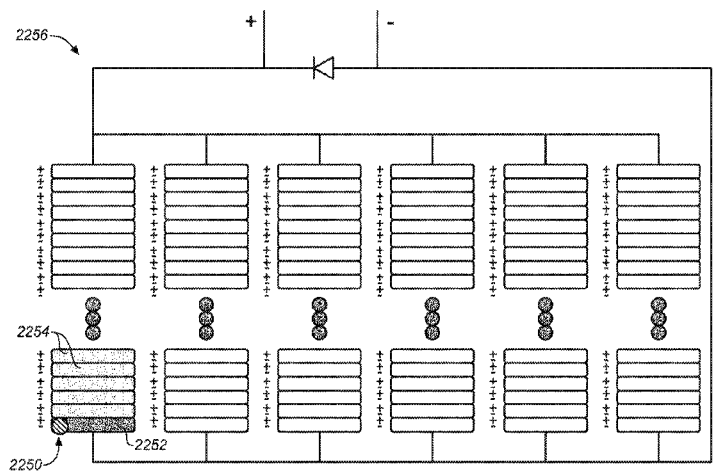

Related U.S. Application Data

(60) Provisional application No. 62/003,223, filed on May 27, 2014, provisional application No. 62/036,215, filed on Aug. 12, 2014, provisional application No. 62/042,615, filed on Aug. 27, 2014, provisional application No. 62/048,858, filed on Sep. 11, 2014, provisional application No. 62/064,260, filed on Oct. 15, 2014, provisional application No. 62/064,834, filed on Oct. 16, 2014.

(51) Int. Cl.
| | | |
|---|---|---|
| *H01L 31/028* | (2006.01) | |
| *H01L 31/02* | (2006.01) | |
| *H01L 27/142* | (2014.01) | |
| *H01L 31/068* | (2012.01) | |
| *H02S 30/10* | (2014.01) | |
| *H01L 31/049* | (2014.01) | |
| *H01L 31/048* | (2014.01) | |
| *H01L 31/043* | (2014.01) | |
| *H02S 50/10* | (2014.01) | |
| *H02S 50/00* | (2014.01) | |
| *H02S 40/32* | (2014.01) | |
| *H02S 20/25* | (2014.01) | |
| *H01L 31/0224* | (2006.01) | |
| *H01L 31/18* | (2006.01) | |
| *H02S 40/30* | (2014.01) | |
| *H02S 40/36* | (2014.01) | |
| *H01L 31/044* | (2014.01) | |
| *H02S 40/34* | (2014.01) | |
| *H02S 30/00* | (2014.01) | |
| *H01L 31/05* | (2014.01) | |

(52) U.S. Cl.
CPC ............... *H02S 50/10* (2014.12); *Y02B 10/12* (2013.01); *Y02E 10/50* (2013.01); *Y02P 70/521* (2015.11)

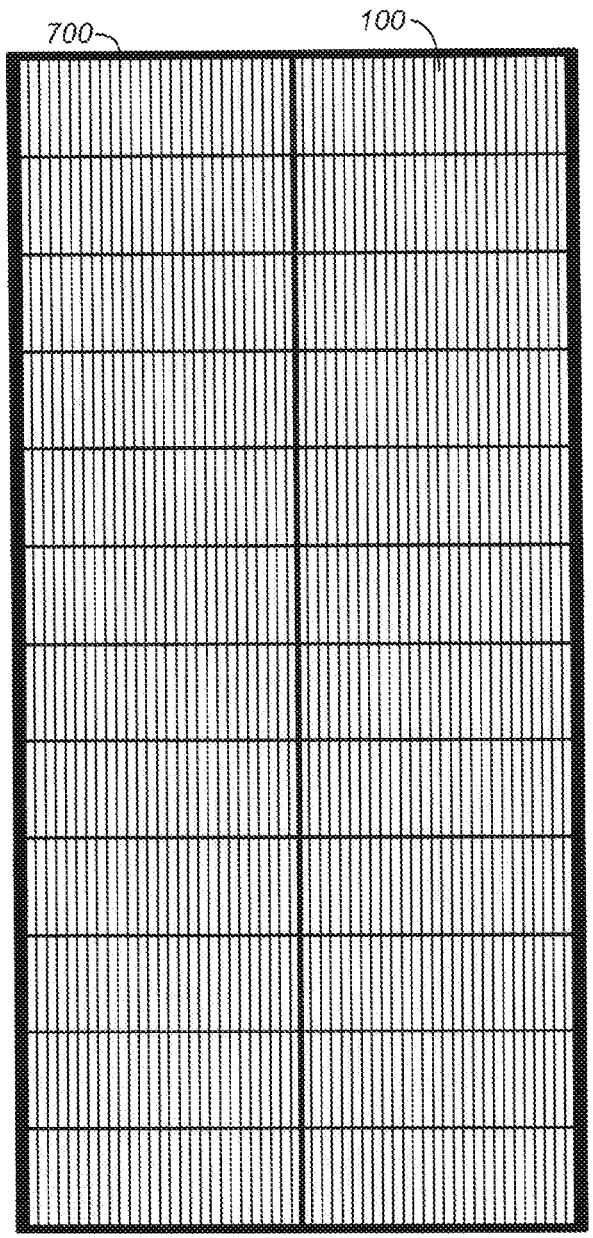
FIG. 14A
Amended

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

THE DRAWINGS FIGURE HAVE BEEN CHANGED AS FOLLOWS:

On Fig. 14A: Four solar cells were added to the solar cell panel to show a total of 24 solar cells rather than 20 solar cells.

AS A RESULT OF REEXAMINATION, IT HAS BEEN DETERMINED THAT:

Claims 2 and 3 are cancelled.

Claim 1 is determined to be patentable as amended.

Claims 4-35, dependent on an amended claim, are determined to be patentable.

1. An apparatus comprising:

a series connected string of N greater than or equal to [25] *70* rectangular silicon solar cells having on average a breakdown voltage greater than about 10 volts arranged in line with long sides of adjacent solar cells overlapping and conductively bonded to each other with an electrically and thermally conductive adhesive to form a super cell; and a first bypass diode electrically connected between opposite ends of the string of solar cells in parallel with the string of solar cells;

wherein no single solar cell or group of <N solar cells in the string of solar cells is individually electrically and directly connected in parallel with a bypass diode.

* * * * *